(12) United States Patent
Tanabe et al.

(10) Patent No.: US 7,539,339 B2
(45) Date of Patent: May 26, 2009

(54) PART RECOGNITION DATA CREATION METHOD AND APPARATUS, ELECTRONIC PART MOUNTING APPARATUS, AND RECORDED MEDIUM

(75) Inventors: Atsushi Tanabe, Yamanashi (JP); Kimiaki Sano, Yamanashi (JP); Junichi Hada, Yamanashi (JP); Eiichi Hachiya, Yamanashi (JP); Seishiro Yanachi, Yamanashi (JP)

(73) Assignee: Panasonic Corporation, Osaka (JP)

( * ) Notice: Subject to any disclaimer, the term of this patent is extended or adjusted under 35 U.S.C. 154(b) by 694 days.

(21) Appl. No.: 10/312,772

(22) PCT Filed: Jul. 6, 2001

(86) PCT No.: PCT/JP01/05913

§ 371 (c)(1),
(2), (4) Date: Feb. 10, 2003

(87) PCT Pub. No.: WO02/05211

PCT Pub. Date: Jan. 17, 2002

(65) Prior Publication Data

US 2003/0165264 A1    Sep. 4, 2003

(30) Foreign Application Priority Data

Jul. 7, 2000   (JP) ............................. 2000-207299

(51) Int. Cl.
   *G06K 9/00* (2006.01)
(52) U.S. Cl. ...................................... 382/146
(58) Field of Classification Search .................. 382/146
   See application file for complete search history.

(56) References Cited

U.S. PATENT DOCUMENTS 4,809,308 A * 2/1989 Adams et al. .............. 378/98.2

(Continued)

FOREIGN PATENT DOCUMENTS

JP        9-307292       11/1997

(Continued)

OTHER PUBLICATIONS

Baartman, J P et al, "Placing Surface Mount Components Using Coarse/Fine Positioning and Vision", IEEE Transactions on Components, Hybrids, and Manufacturing Technology, Sep. 1, 1990, pp. 559-564, vol. 13 No. 3, IEE Inc. New York, U.S.

(Continued)

*Primary Examiner*—Matthew C Bella
*Assistant Examiner*—Alex Liew
(74) *Attorney, Agent, or Firm*—Pearne & Gordon LLP

(57) ABSTRACT

It is an object of the present invention to provide a parts recognition data preparing method and a preparing device and an electronic parts mounting device and a recording medium, which are capable of preparing parts recognition data, which are set to respective electronic parts and are referred to when the electronic parts are to be recognized, precisely and quickly not to know particularly the characteristic of the recognition algorithm.

In the present invention, there are provided an inputting means for inputting information of a body and electrodes of the electronic parts, a recognition algorithm selecting means for identifying a type of the electronic parts based on input information of the body and the electrodes and then selecting a recognition algorithm that is adaptive to the identified type, and a parts shape data extracting means for extracting automatically parts shape data, which are required for a recognizing process executed by the selected recognition algorithm, from the input information of the body and the electrodes, whereby parts recognition data in which recognition conditions of the electronic parts are recorded are prepared.

12 Claims, 51 Drawing Sheets

U.S. PATENT DOCUMENTS

| | | | | |
|---|---|---|---|---|
| 4,817,024 | A | * | 3/1989 | Saigoh .......................... 703/1 |
| 4,845,764 | A | * | 7/1989 | Ueda et al. .................. 382/146 |
| 5,185,811 | A | * | 2/1993 | Beers et al. ................. 382/151 |
| 5,371,690 | A | * | 12/1994 | Engel et al. ................. 382/151 |
| 5,822,449 | A | | 10/1998 | Kobayashi et al. |
| 6,188,784 | B1 | * | 2/2001 | Linker, Jr. .................. 382/146 |
| 6,813,377 | B1 | * | 11/2004 | Gopalakrishnan et al. ... 382/146 |
| 6,895,661 | B1 | * | 5/2005 | Gamel et al. ................. 29/740 |
| 2003/0016859 | A1 | * | 1/2003 | Weisgerber et al. ......... 382/150 |

FOREIGN PATENT DOCUMENTS

| | | |
|---|---|---|
| WO | 9739613 | 10/1997 |

OTHER PUBLICATIONS

Lister P et al, "Next Generation Vision Algorithms for SMT Assembly", Electronic Packaging and Production, Feb. 1, 1992, pp. 48-50, vol. 32, No. 2, Cahners Publishing Co, Newton Massachusetts, U.S.

* cited by examiner

A1

A2

A3

A4

A5

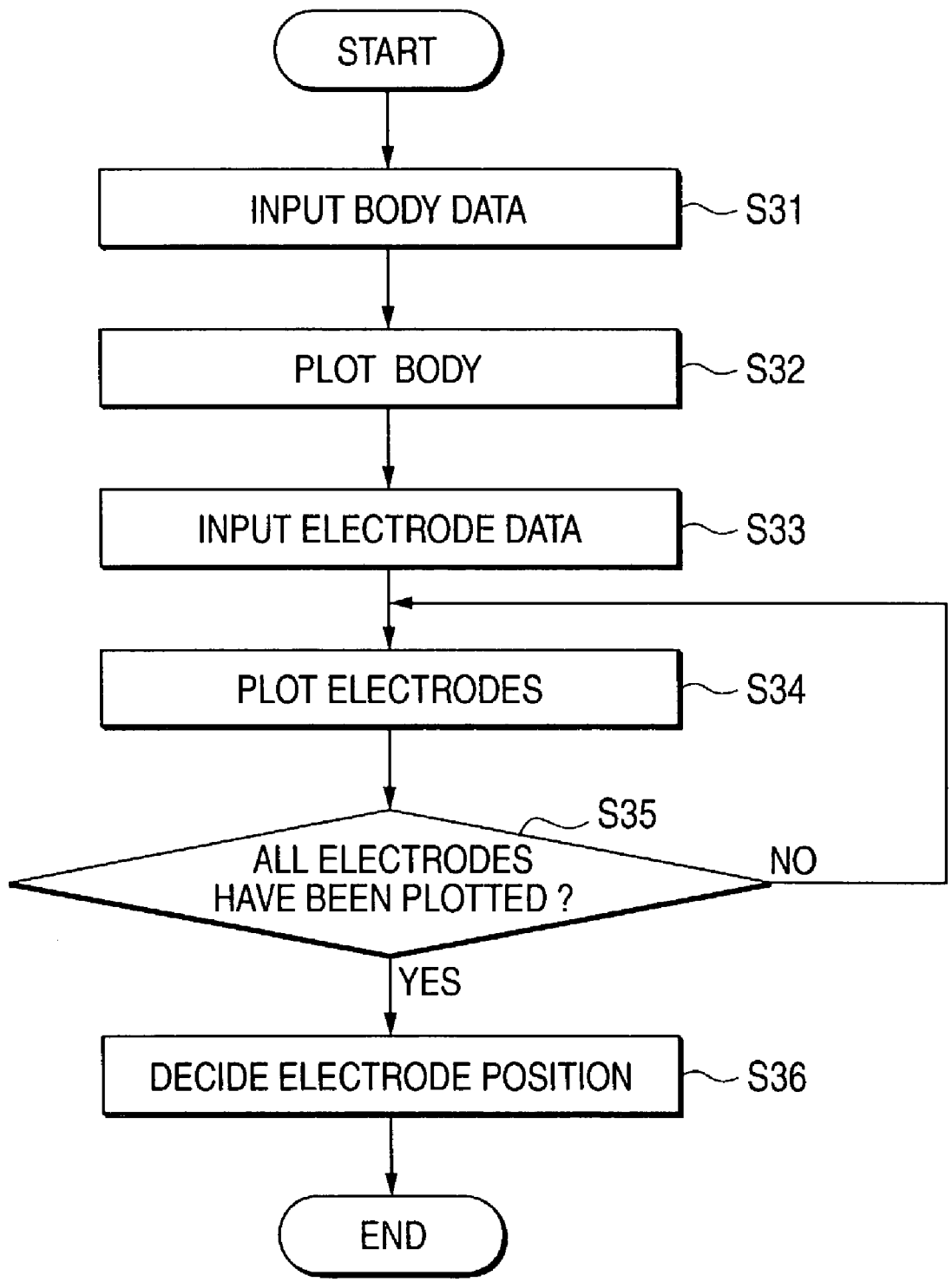

FIG. 15
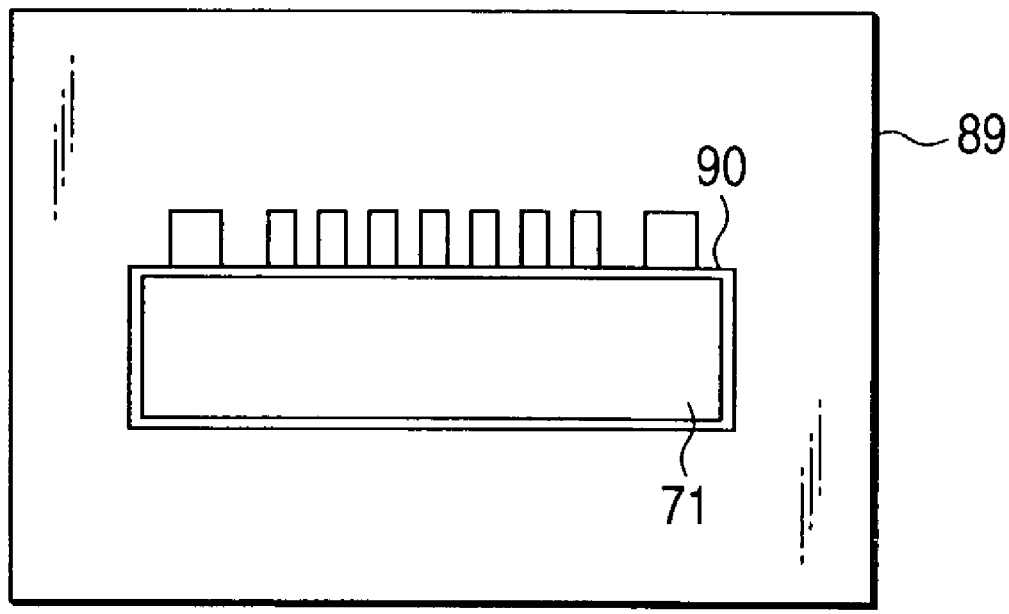
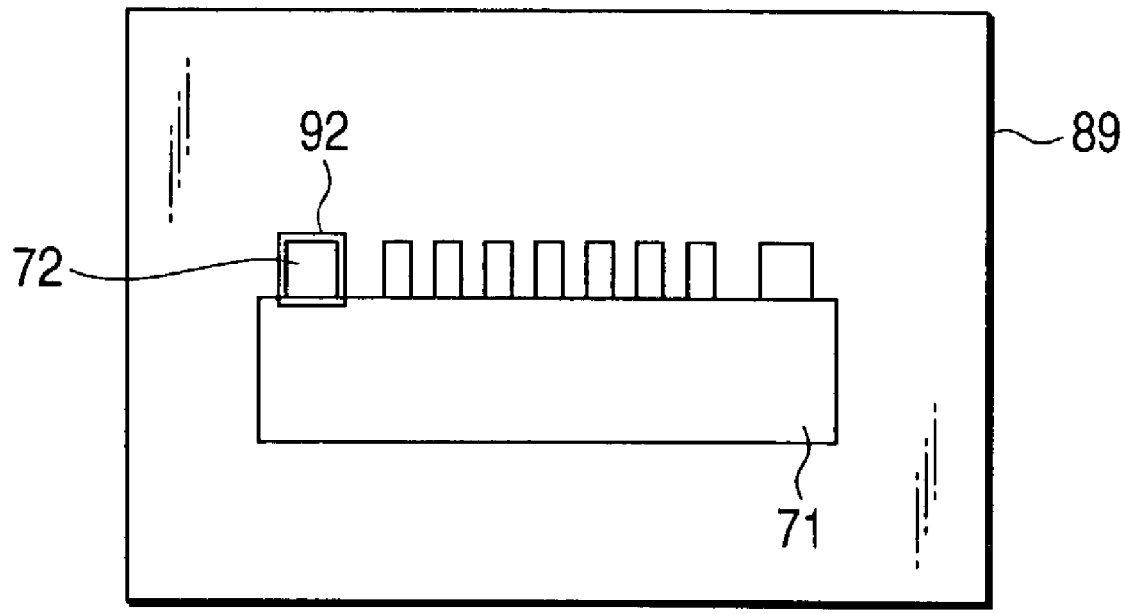

FIG. 18

PARTS SHAPE DESIGNATION

DESIGNATE BODY SHAPE/COLOR/DIMENSIONS
※ THE STATE WHERE THE MOUNTED SURFACE IS VIEWED
VIA THE SUCKED SURFACE
(THE MOUNTED SURFACE IS NOT VIEWED AS IT IS)

BODY SHAPE (S): RECTANGLE
BODY COLOR (C): WHITE
BODY DIMENSIONS (I) HORIZONTAL: 6.00 mm
VERTICAL: 6.00 mm

62

< RETURN (B)   NEXT (N) >   CANCEL

FIG. 22

| ADDITION OF ELECTRODE |
|---|
| INPUT ELECTRODE DIMENSIONS |

ELECTRODE DIMENSION HORIZONTAL (X): [ 1.00 ] mm
VERTICAL (Y): [ 1.20 ] mm

[ ONLY ONE ELECTRODE (SINGLE) ADDED (S) ]

[ PLURAL ELECTRODES (HORIZONTAL ALIGNMENT) ADDED (H) ]

[ PLURAL ELECTRODES (VERTICAL ALIGNMENT) ADDED (V) ]

[ PLURAL ELECTRODES (LATTICE ALIGNMENT) ADDED (A) ]

[ < RETURN (B) ]  [ NEXT (N) > ]     [ CANCEL ]

FIG. 25

ADDITION OF ELECTRODE

INPUT ELECTRODE DIMENSIONS

ELECTRODE DIMENSION HORIZONTAL (X): [ 1.20 ] mm
VERTICAL (Y): [ 3.00 ] mm

- ONLY ONE ELECTRODE (SINGLE) ADDED (S)
- PLURAL ELECTRODES (HORIZONTAL ALIGNMENT) ADDED (H)
- PLURAL ELECTRODES (VERTICAL ALIGNMENT) ADDED (V)
- PLURAL ELECTRODES (LATTICE ALIGNMENT) ADDED (A)

[ < RETURN (B) ] [ END ] [ CANCEL ]

FIG. 27

STANDARD/OP DATA SET

DATA ARE DECIDED AS FOLLOWS

| CLASS | TYPE |
|---|---|
| 101 | 0 |

PARTS DIMENSION [mm]

| L1 | L2 | W1 | W2 |
|---|---|---|---|
| 6.00 | 0.00 | 6.00 | 0.00 |

LEAD OUTER SHAPE [mm]

| Lt | Wt |
|---|---|
| 0.00 | 0.00 |

LEAD NUMBER [mm]

| Nu | Nd | Nl | Nr |
|---|---|---|---|
| 0 | 0 | 0 | 0 |

ELECTRODE DIMENSION [mm]

| d1 | d2 | h1 | h2 | Pt |
|---|---|---|---|---|
| 0.00 | 0.00 | 0.00 | 0.00 | 0.00 |

OPTIONAL DATA

PUSH A RIGHT BUTTON IF SETTING IS DONE AGAIN
FROM THE SHAPE INPUT

RETURN TO PARTS SHAPE DESIGNATION

< RETURN (B)    END    CANCEL

FIG. 30

PARTS SHAPE DESIGNATION

DESIGNATE THE ELECTRODE USED TO CALCULATE A PARTS CENTER.
USED ELECTRODE : DISPLAYED BY WHITE COLOR
NOT-USED ELECTRODE : DISPLAYED BY GRAY COLOR

GROUP (G)
ALL LEADS
LEFT-SIDE GROUP
RIGHT-SIDE GROUP
UPPER-SIDE GROUP
LOWER-SIDE GROUP
OTHER GROUP

ELECTRODE (I)
Lead 001

USE IN CALCULATION OF
A PARTS CENTER (S)

SELECTED ELECTRODE CENTER : X : 0.00, Y : 0.00 mm

66

< RETURN (B)   NEXT (N) >   CANCEL

PARTS SHAPE DESIGNATION

DESIGNATE THE ELECTRODE USED TO CALCULATE A PARTS CENTER.
USED ELECTRODE : DISPLAYED BY WHITE COLOR
NOT-USED ELECTRODE : DISPLAYED BY GRAY COLOR

GROUP (G)
- ALL LEADS
- LEFT-SIDE GROUP
- RIGHT-SIDE GROUP
- UPPER-SIDE GROUP
- LOWER-SIDE GROUP
- OTHER GROUP

ELECTRODE (I)

USE IN CALCULATION OF A PARTS CENTER (S)

SELECTED ELECTRODE CENTER : X : 0.00, Y : 0.00 mm

< RETURN (B) | NEXT (N) > | CANCEL

FIG. 34

OPTICAL CONDITION SET

SET OPTICAL CONDITIONS

TYPE OF CAMERA : 2D SENSOR, LARGE VISUAL FIELD

MAXIMUM VISUAL FIELD SIZE (X) : 220.00 mm
(Y) : 60.00 mm

EXPLANATION OF OPTICAL DEVICE

REFLECTION ILLUMINATION IS USED.
IN 2D SENSORS, THERE ARE ILLUMINATIONS THAT ILLUMINATE AT THREE-STAGE ANGLES OF UPPER, MIDDLE, LOWER STAGES.
USE THE UPPER STAGE WHEN THE ELECTRODE SECTIONAL SHAPE IS NOT FLAT.
THE MIDDLE STAGE IS TURNED ON EXCEPT THE SPECIAL CASE.
THE LOWER STAGE IS EFFECTIVE TO THE MIRROR-LIKE ELECTRODE.

< RETURN (B)    NEXT (N) >    CANCEL

FIG. 45

STANDARD/OP DATA SET

DATA ARE DECIDED AS FOLLOWS

| CLASS | TYPE |
|---|---|
| 104 | 0 |

PARTS DIMENSION [mm]

| L1 | L2 | W1 | W2 |
|---|---|---|---|
| 17.00 | 0.00 | 4.00 | 0.00 |

LEAD OUTER SHAPE [mm]

| Lt | Wt |
|---|---|
| 17.00 | 6.00 |

LEAD NUMBER [mm]

| Nu | Nd | Nl | Nr |
|---|---|---|---|
| 7 | 0 | 0 | 0 |

ELECTRODE DIMENSION [mm]

| d1 | d2 | h1 | h2 | Pt |
|---|---|---|---|---|
| 0.00 | 0.00 | 0.70 | 0.00 | 1.40 |

OPTIONAL DATA

PUSH A RIGHT BUTTON IF SETTING IS DONE AGAIN
FROM THE SHAPE INPUT

RETURN TO PARTS SHAPE DESIGNATION

< RETURN (B)    END    CANCEL

PART RECOGNITION DATA CREATION METHOD AND APPARATUS, ELECTRONIC PART MOUNTING APPARATUS, AND RECORDED MEDIUM

BACKGROUND OF THE INVENTION

1. Field of the Invention

The present invention relates to a parts recognition data preparing method and a preparing device and an electronic parts mounting device and a recording medium, which are applied to a device that recognizes an electronic parts based on image data being obtained by picking up an image of the electronic parts to prepare parts recognition data that record recognition conditions of the electronic parts, and relates to the data inputting technology that is useful for recognizing the electronic parts, which is sucked onto a suction nozzle of the electronic parts mounting device, to correct its mounting position based on its suction attitude, for example.

2. Description of the Related Art

In recent years, in the electronic parts mounting field, the technology for mounting the electronic parts on the circuit board at high speed with high precision is required. Normally the image recognizing technology for executing the correct of a mounting position and an amount of rotation of the electronic parts by processing image data, which are obtained by picking up the image of the electronic parts, at high speed to detect a position and an amount of rotation of the electronic parts precisely is employed. Also, with the progress of multi-electrodes and miniaturization of the electronic parts, the technology for detecting and correcting the electrode position tends to be employed such that individual electrodes of the electronic parts can be mounted on lands of the substrate precisely. In order to detect individual electrode positions, it must be made clear as the premise condition in which way individual electrode are arranged. Therefore, not only the algorithm of detecting the electrodes must be decided in response to the shape of the parts, but also data such as necessary dimensions, number of electrodes, etc. must be set in response to this algorithm.

First, a behavior of preparing the data when a square-shaped chip parts is recognized will be explained hereunder. FIG. 48 is a view showing an external appearance of a square-shaped chip parts 301. The square-shaped chip parts 301 has a shape in which electrodes 302 are arranged on its right and left sides. When the parts which has the electrodes 302 on its right and left sides is to be recognized, detection of the electrodes 302 is carried out by using the algorithm for the square-shaped chip parts. In this algorithm, as shown in FIG. 48, data of the square-shaped chip parts 301 of parts dimensions L1, W1 and electrode lengths d1, d2 are needed. As a result, parts recognition data to recognize the square-shaped chip parts 301 need parts dimensions horizontal: L1
vertical: W1
electrode lengths length 1: d1
length 2: d2.

Next, a behavior of preparing the data when a QFP parts is recognized will be explained hereunder. FIG. 49 is a view showing an external appearance of a QFP parts 311. The QFP parts 311 has a shape in which electrodes 312 that are aligned at an equal interval are arranged on upper/lower/left/right sides respectively. In case such parts on the upper/lower/left/right sides of which the electrodes 312 are arranged at an equal interval is to be recognized, detection of the electrodes 312 is executed by using the algorithm for the lead-type parts. In this algorithm, as shown in FIG. 49, data of the QFP parts 311 about parts dimensions L1, W1, lead outer shapes Lt, Wt, a width of the electrode h1, an interval between the electrodes Pt, and the number of the electrodes Nu, Nd, Nl, Nr are required. As a result, parts recognition data to recognize the square-shaped chip parts 301 need parts dimensions horizontal: L1
vertical: W1
lead outer shapes horizontal: Lt
vertical: Wt
electrode dimensions width 1: h1
interval: Pt
number of the electrodes upper: Nu
lower: Nd
left: Nl
right: Nr.

In this manner, the necessary parts recognition data are different according to the used algorithm. However, if data about parts dimensions: L1, L2, W1, W2
lead outer shapes: Lt, Wt
electrode dimensions: d1, d2, h1, h2, Pt
number of the electrodes: Nu, Nd, Nl, Nr and others are employed as input definitions of the dimensions, all parts shapes can be represented.

Also, the parts recognition data contain camera numbers Cn for switching the visual field size of the camera to pick up the image, illumination code numbers Lc for switching an illumination angle and an illumination strength when the electronic parts is illuminated, etc. in addition to the above data. These data must be set according to size, shape, etc. of the electronic parts as the recognition object.

In this manner, if fixed forms of dimensional definitions are employed, the parts recognition data of the same size can be prepared irrespective of the shape of the electronic parts.

In the related art, these parts recognition data are set entirely manually. In other words, the parts recognition data are input by comparing the electronic parts as the recognized object with the data sheet shown in FIG. 5, which is prepared every parts type, then selecting the optimum recognition algorithm, and then measuring dimensions at predetermined positions in accordance with the selected recognition algorithm.

In the above method in the related art, first it is important which one of plural prepared recognition algorithms should be selected. For example, in the case of is the connector parts 321 shown in FIG. 50, the recognition algorithm used to recognize the above QFP parts is suitable. However, if a view of the QFP parts is set forth in the data sheet that is used to select the recognition algorithm, a sufficient knowledge of the recognition algorithm is required to decide whether or not the same recognition algorithm can be applied to the connector parts in FIG. 50. Even if the optimum recognition algorithm can be selected, input data are different from the data of the QFP parts and thus the data corresponding to Lt, Nd, Nl, Nr are not present in the connector parts 321. Therefore, since there exist input items of data that are not actually present in the parts, the operator does not know how to input these data and is troubled with the inputting operation when such operator starts to input the data via the input screen shown in FIG. 51, for example.

In order to avoid such situation, it may be considered that the data sheets are prepared individually in response to the shape of the parts. In such case, not only a great deal of data sheets are needed but also it is not easy to select the appropriate data sheet from these data sheets.

Also, the connector parts 331 shown in FIG. 52 is present in the connector parts. In this connector parts 331, reinforcing electrodes 334 are arranged on both ends separately from the normal electrodes 332. In this manner, if the reinforcing electrodes 334 are provided to both ends, detection is carried out while ignoring the reinforcing electrodes 334. As a result, the parts recognition data has the completely same shape as the connector parts 321 shown in FIG. 51. However, if the operator does not know to ignore the reinforcing electrodes 334, two types of lead widths and lead intervals are present and thus the operator cannot decide how to input the data.

Such exceptional inputting method tends to increase more and more because the shapes of the parts become complicated. Therefore, a deep knowledge of the adaptive recognition algorithm is required to prepare the parts recognition data.

The present invention has been made in view of such problems in the related art, and it is an object of the present invention to provide a parts recognition data preparing method and a preparing device and an electronic parts mounting device and a recording medium, which are capable of preparing parts recognition data, which are set to respective electronic parts and are referred to when the electronic parts are to be recognized, precisely and quickly not to know particularly the characteristic of the recognition algorithm.

SUMMARY OF THE INVENTION

In order to achieve the above object, following items are disclosed.

(1) A parts recognition data preparing method according to the present invention that is applied to a device, which recognizes an electronic parts based on image data obtained by picking up an image of the electronic parts, to prepare parts recognition data in which recognition conditions of the electronic parts are recorded, wherein identification of a type of the electronic parts, selection of a recognition algorithm that is adaptive to the identified type, and automatic extraction of parts shape data, which are required for a recognizing process executed by the recognition algorithm, from information of a body and electrodes are executed by inputting the information of the body and the electrodes of the electronic parts.

According to the parts recognition data preparing method of the present invention, since the information of the body and the electrodes of the electronic parts are input, the recognition algorithm that is adaptive to this electronic parts can be set and also the parts shape data that are required for the recognizing process executed by the recognition algorithm can be extracted automatically from the input information of the body and electrodes. Therefore, since the information of the body and the electrodes of the electronic parts, which are required for the recognizing process executed by the recognition algorithm, can be automatically input without sequential inputting, the electronic parts data can be prepared precisely and quickly not to know particularly the characteristic of the recognition algorithm.

(2) In the parts recognition data preparing method, optical conditions that permit to pick up an image of the electronic parts under optimum conditions, which are adaptive to the selected type, are input.

According to the parts recognition data preparing method, since the optical conditions such as imaging visual—field size, illumination conditions, etc. are set to the optimum conditions in picking up the image of the electronic parts, the electronic parts can be recognized more precisely.

(3) The parts recognition data preparing method comprises a body/electrode inputting step of inputting body information of the electronic parts as an object and electrode information of the electronic parts; a grouping step of grouping the electrodes every side of an outer periphery of the body; an unnecessary electrode excepting step of excepting electrodes, which are overlapped among respective groups, and electrodes, which are not used to recognize the electronic parts, from the grouped electrodes; a recognition algorithm deciding step of deciding the recognition algorithm that is adaptive to the electronic parts; a parts shape data extracting step of extracting automatically parts shape data, which are required for a recognizing process executed by the decided recognition algorithm, from information of the body and the electrodes; and an optical-condition deciding step of deciding optimum optical conditions in picking up the image of the electronic parts.

According to the parts recognition data preparing method, the parts recognition data are prepared by grouping the electrodes every side of an outer periphery of the body in accordance with the input body and electrode information of the electronic parts, then excepting electrodes that are overlapped among respective groups and electrodes that are not used to recognize the electronic parts from the grouped electrodes, then deciding the recognition algorithm that is adaptive to the electronic parts, then extracting automatically parts shape data, which are required for a recognizing process executed by the decided recognition algorithm, from already-input information of the body and the electrodes, and then deciding the optimum optical conditions in picking up the image of the electronic parts. Therefore, since the input electrodes can be classified into groups every side and the type of the electronic parts can be decides without fail, the recognition algorithm can be selected appropriately. Also, since the information of the body and the electrodes of the electronic parts, which are required for the recognizing process executed by the recognition algorithm, can be automatically input without sequential inputting, the electronic parts data can be prepared precisely and quickly not to know particularly the characteristic of the recognition algorithm.

(4) The parts recognition data preparing method further comprises a step of plotting a body shape based on the input body information; a step of plotting electrode shapes based on the input electrode information; and a deciding step of deciding whether or not plotted positional relationships of the body and the electrodes are correct; wherein information of the body and the electrodes are checked visually.

According to the parts recognition data preparing method, since the body shape is plotted based on the input body information and electrode shapes are plotted based on the input electrode information, it can be decided by checking visually whether or not the plotted positional relationship between the body and the electrodes, etc. are correct. Therefore, the checking operation can be executed at an instant in contrast to the case where this relationship is decided only based on numerical data, and thus it can be checked simply and quickly whether or not input information are correct or false.

(5) The parts recognition data preparing method further comprises a step of picking up the image of the electronic parts; a body area designating step of designating an area, which corresponds to a body portion, to image data of the electronic parts; an electrode area designating step of designating areas, which correspond to electrode portions, to the image data; and an information extracting step of acquiring information of the body from the designated body area and acquiring information of the electrodes from the designated electrode area; wherein parts recognition data are prepared by using information acquired by the information extracting step.

According to the parts recognition data preparing method, since the information of the body and the electrodes are acquired from the image data in the body area and the electrode area by designating the area, which corresponds to the body portion of the electronic parts, and the area, which corresponds to the electrode parts, to the image data obtained by picking up the image of the electronic parts, the information of the parts shape data such as body dimensions, color, concentration, etc. and the parts shape data such as electrode dimensions, number of electrodes, alignment pitch, etc. can be extracted automatically. Thus, there is no need to input respective data one by one. Therefore, the preparation of the parts recognition data can be simplified much more.

(6) In the parts recognition data preparing method, the grouping step includes a step of excepting electrodes, which are present on an opposite side to a selected side, from the selected side group with respect to respective sides of left side/upper side/right side/lower side of the body of the electronic parts, a step of ordering the electrodes in the selected side group in order of the electrodes whose centers are closer to the selected side, and a step of extracting the electrode that is closest to the selected side.

According to the parts recognition data preparing method, the electrodes that are present on the opposite side to the selected side are excepted from the selected side group with respect to respective sides of left side/upper side/right side/ lower side of the body of the electronic parts. Then, the electrode that is closest to the selected side is set in the selected-side group by ordering the electrodes in the selected side group in order of the electrodes whose centers are closer to the selected side. According to such grouping step, the grouping of the electrodes into respective sides can be executed.

(7) In the parts recognition data preparing method, the unnecessary electrode excepting step includes a step of excepting same electrodes from both side groups if the same electrodes are present between opposite side groups, and a step of removing duplicate electrodes by excepting all electrodes from the selected side group when a number of electrodes in neighboring side groups is larger than 2 and by excepting all electrodes from a side group in which a center of electrode alignment is not positioned at a center of the body when the number of electrodes in neighboring side groups is less than 2 if the number of electrodes in the selected side group is smaller than 3 and the electrodes are contained in neighboring side groups. According to the parts recognition data preparing method, when the same electrodes are present between the opposite side groups, such same electrodes are excepted from these both side groups. Then, if the number of electrodes in the selected side group is smaller than 3 and also the electrodes are contained in neighboring side groups, all electrodes are excepted from the selected side group when the number of electrodes in neighboring side groups is larger than 2, while all electrodes are excepted from the side group in which the center of electrode alignment is not positioned at the center of the body when the number of electrodes in neighboring side groups is less than 2. Therefore, the duplicate electrodes are excepted and also the unnecessary electrodes are excepted.

(8) A parts recognition data preparing device according to the present invention, used to recognize an electronic parts based on image data obtained by picking up an image of the electronic parts, for preparing parts recognition data in which recognition conditions of the electronic parts are recorded, comprises an inputting means for inputting information of a body and electrodes of the electronic parts; a recognition algorithm selecting means for identifying a type of the electronic parts based on input information of the body and the electrodes and then selecting a recognition algorithm that is adaptive to the identified type; and a parts shape data extracting means for extracting automatically parts shape data, which are required for a recognizing process executed by the selected recognition algorithm, from the input information of the body and the electrodes.

According to the parts recognition data preparing device, the information of the body and electrodes of the electronic parts are input by the inputting means, and then the recognition algorithm, which is adaptive to the type of the electronic parts being identified by the recognition algorithm selecting means, is selected based on the input information of the body and the electrodes. Then, the parts recognition data are prepared by extracting automatically the parts shape data, which are required for the recognizing process executed by the selected recognition algorithm, from the input information of the body and the electrodes by the parts shape data extracting means. Therefore, since the information of the body and the electrodes of the electronic parts, which are required for the recognizing process executed by the recognition algorithm, can be automatically input without sequential inputting, the electronic parts data can be prepared precisely and quickly not to know particularly the characteristic of the recognition algorithm.

(9) The parts recognition data preparing device further comprises an optical-condition setting means for setting optical conditions that permit to pick up an image of the electronic parts under optimum conditions, which are adaptive to the selected type.

According to the parts recognition data preparing device, since the optical conditions such as imaging visual-field size, illumination conditions, etc. are set to the optimum conditions in picking up the image of the electronic parts, the electronic parts can be recognized more surely.

(10) The parts recognition data preparing device further comprises a displaying means for displaying the information of the body and the electrodes, which are input from the inputting means, on a screen.

According to the parts recognition data preparing device, since the information of the body shape and the electrode shape, etc., which are obtained from the information of the body and the electrode being input from the inputting means, are displayed on the screen by the displaying means, it can be decided by checking visually whether or not displayed information of the positional relationship between the body and the electrodes, etc. are correct. Therefore, input information can be checked in a moment in contrast to the case where the decision is made only based on numerical data, and also it can be checked simply and quickly whether or not the input information are correct or false.

(11) The parts recognition data preparing device, the inputting means extracts the information of the body and the electrodes of the electronic parts from the image data obtained by picking up the image of the electronic parts to input.

According to the parts recognition data preparing device, since the information of the body and the electrodes are extracted from the area, which corresponds to the body portion of the electronic parts, and the area, which corresponds to the electrode portion, of the image data obtained by picking up the image of the electronic parts, the information such as body dimensions, color, concentration, etc. and the information of the parts shape data such as electrode dimensions, number of electrodes, alignment pitch, etc. can be acquired automatically. Therefore, necessity to input respective data sequentially can be eliminated and thus the preparation of the parts recognition data can be simplified much more.

(12) An electronic parts mounting device according to the present invention, for mounting sequentially an electronic parts onto a predetermined position of a circuit board by a parts holding means having a suction nozzle, which holds the electronic parts detachably, based on input NC information, comprises an inputting means for inputting information of a body and electrodes of the electronic parts; a recognition algorithm selecting means for identifying a type of the electronic parts based on input information of the body and the electrodes and then selecting a recognition algorithm that is adaptive to the identified type; a parts shape data extracting means for extracting automatically parts shape data, which are required for a recognizing process executed by the selected recognition algorithm, from the input information of the body and the electrodes; an optical-condition setting means for setting optical conditions that permit to pick up an image of the electronic parts under conditions, which are adaptive to the selected type; a recognizing means for recognizing a suction attitude of the electronic parts held by the suction nozzle; and a correcting means for correcting a mounting position onto the circuit board in response to the suction attitude of the electronic parts recognized by the recognizing means.

According to the electronic parts mounting device of the present invention, the parts recognition data are prepared by inputting the information of the body and the electrodes of the electronic parts by the inputting means, then selecting the recognition algorithm, which is adaptive to the type of the electronic parts identified by the recognition algorithm selecting means, based on the input information of the body and the electrodes, and then extracting the parts shape data, which are required for the recognizing process executed by the selected recognition algorithm, automatically from the information of the body and the electrodes by the parts shape data extracting means. The suction attitude of the electronic parts held by the suction nozzle is recognized by the recognizing means based on the parts recognition data, and then the mounting position of the electronic parts onto the circuit board can be corrected by the correcting means in response to the recognized suction attitude of the electronic parts. Therefore, the information of the body and the electrodes of the electronic parts, which are required for the recognizing process executed by the recognition algorithm, can be input automatically without the sequential inputting operation. As a result, the parts recognition data can be prepared precisely and quickly unless the operator is aware of the characteristics of the recognition algorithm, and also the electronic parts can be mounted onto the predetermined position of the circuit board stably with good precision.

(13) A recording medium according to the present invention for recording a part recognition data preparing program that is applied a device, which recognizes an electronic parts based on image data obtained by picking up an image of the electronic parts, to prepare parts recognition data, in which recognition conditions of the electronic parts are recorded, by a programmed computer, wherein a parts recognition data preparing program for executing a step of inputting body information of the electronic parts as an object and electrode information of the electronic parts, a step of grouping the electrodes every side of an outer periphery of the body, a step of excepting electrodes, which are overlapped among respective groups, and electrodes, which are not used to recognize the electronic parts, from the grouped electrodes, a step of deciding the recognition algorithm that is adaptive to the electronic parts, a step of extracting parts shape data, which are required for a recognizing process executed by the decided recognition algorithm, from information of the body and the electrodes, and a step of deciding optimum optical conditions in picking up the image of the electronic parts is recorded.

According to the recording medium of the present invention, since the program for causing to execute a step of inputting the body and electrode information of the electronic parts, a step of grouping the electrodes, a step of excepting electrodes, which are overlapped among respective groups, and electrodes, which are not used to recognize the electronic parts, a step of deciding the recognition algorithm, a step of extracting parts shape data, which are required for the recognizing process executed by the decided recognition algorithm, and a step of deciding the optimum optical conditions in picking up the image of the electronic parts is recorded, the information of the body and the electrodes of the electronic parts, which are required for the recognizing process executed by the recognition algorithm, can be input automatically by executing the program without the sequential inputting operation. Therefore, the parts recognition data can be prepared precisely and quickly not to know particularly the characteristic of the recognition algorithm.

BRIEF DESCRIPTION OF THE DRAWINGS

FIG. 11 is a flowchart showing procedures of preparing the parts recognition data;

FIG. 15 is a view showing behaviors of extracting the parts recognition data from the picked-up image data;

FIG. 18 is a view showing a display screen when body shape, body color, and body dimensions (horizontal, vertical) are input in inputting steps of a body;

FIG. 22 is a view showing a display screen when electrode dimensions are input;

FIG. 25 is a view showing a display screen when an electrode is additionally input;

FIG. 27 is a view showing a behavior in which respective parts dimensions of the electronic parts are automatically set/displayed;

FIG. 30 is a view showing a behavior in which the electrode in a right-side group is displayed;

FIG. 31 is a view showing a behavior in which no electrode in an upper-side group is displayed;

FIG. 32 is a view showing a behavior in which no electrode in a lower-side group is displayed;

FIG. 34 is a view showing a display screen when setting of optical conditions is carried out;

FIG. 45 is a view showing a behavior in which respective data such as parts dimensions, outer diameter of lead, number of leads, and electrode dimensions are set automatically are displayed;

In this case, in above figures, a reference 1 is parts data, 2 is an inputting means, 3 is a recognition algorithm selecting means, 4 is recognition algorithm, 5 is parts shape data extracting means, 6 is parts recognition data, 7 is a control device, 8 is a correcting means, 12 is a circuit board, 28 is a transfer head, 34 is a suction nozzle, 36 is a recognizing device, 38a to 38d are a fitting head, 40 is an actuator, 42 is a motor, 44 is a timing belt, 52 is an operation panel, 60, 70 are an electronic parts, 62, 71 are a body, 62a, 71a are a left side, 62b, 71b are an upper side, 62c, 71c are a right side, 62d, 71d are a lower side, 64, 65, 66, 72, 73, 74, 75, 76, 77, 78, 79, 80 are an electrode, 85 is a plotted area, 88 is an imaging device, 89 is image data, 90, 92 are a window, 100, 200 are an electronic parts mounting device, 213 is a mounting head, A1, A2, A3, A4, A5 are a recognition algorithm, CAM1 is a small visual-field camera, CAM2 is a large visual-field camera, Cn is a camera number, LED1 to 3 are an illumination, L1 W1, Lt, Wt, h1, Pt, Nr, Nl, Nu, Nd are a parts dimension, Nu, Nd, Nl, Nr are number of electrodes, Wt is a lead external shape, Ob is a body center, Op ($OP_n$) is an electrode center, Pt is an interval between electrodes, and h1 is an electrode width.

DETAILED DESCRIPTION OF THE PREFERRED EMBODIMENTS

Embodiments of a parts recognition data preparing method according to the present invention will be explained in detail with reference to the drawings hereinafter.

Figure 1:
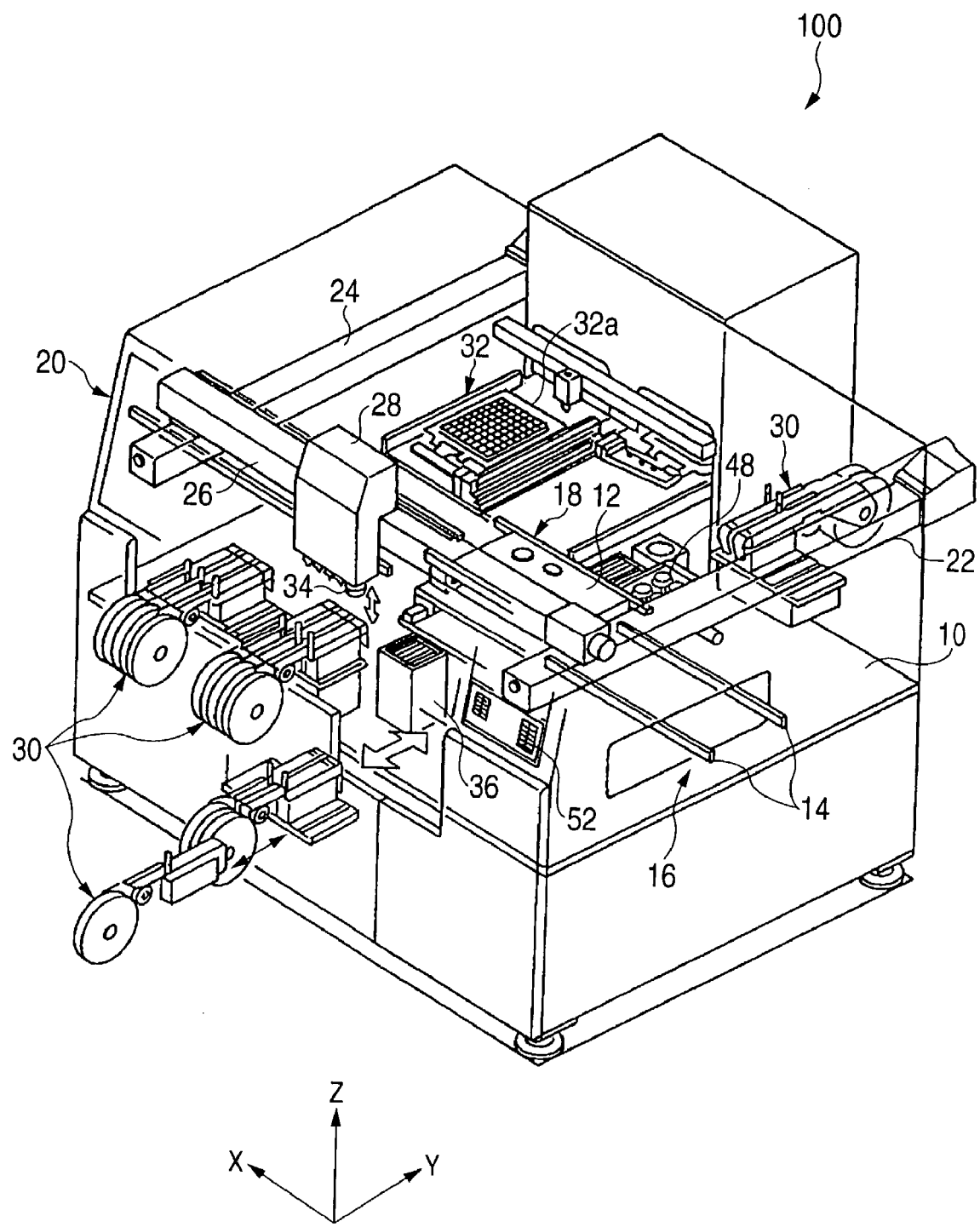
FIG. 1 is a perspective view showing an electronic parts mounting device to which a parts recognition data preparing method according to the present invention is applied.

The present invention is a preferred parts recognition data preparing method when it is applied to an electronic parts mounting device shown in FIG. 1, for example, and others, and is characterized in that the parts recognition data inputting device is improved such that, when the supplied electronic parts is picked up by a suction nozzle and then mounted onto a circuit board by using the electronic parts mounting device, the operator can easily input and set the parts recognition data that define shapes of the electronic parts, which are referred to recognize an attitude of the electronic parts held by the suction nozzle.

Figure 2:
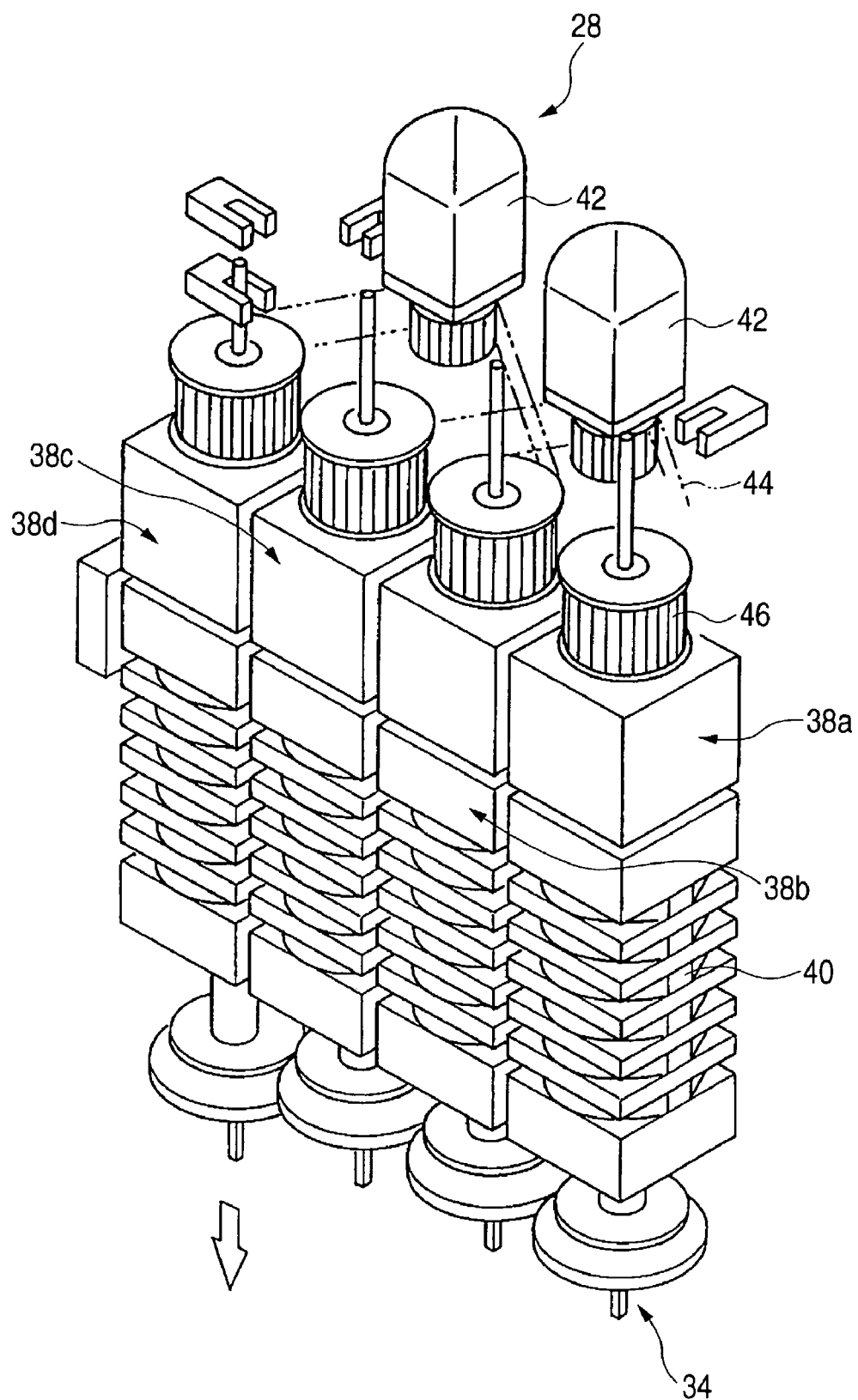
FIG. 2 is an enlarged perspective view showing a transfer head of the electronic parts mounting device.
Figure 3:
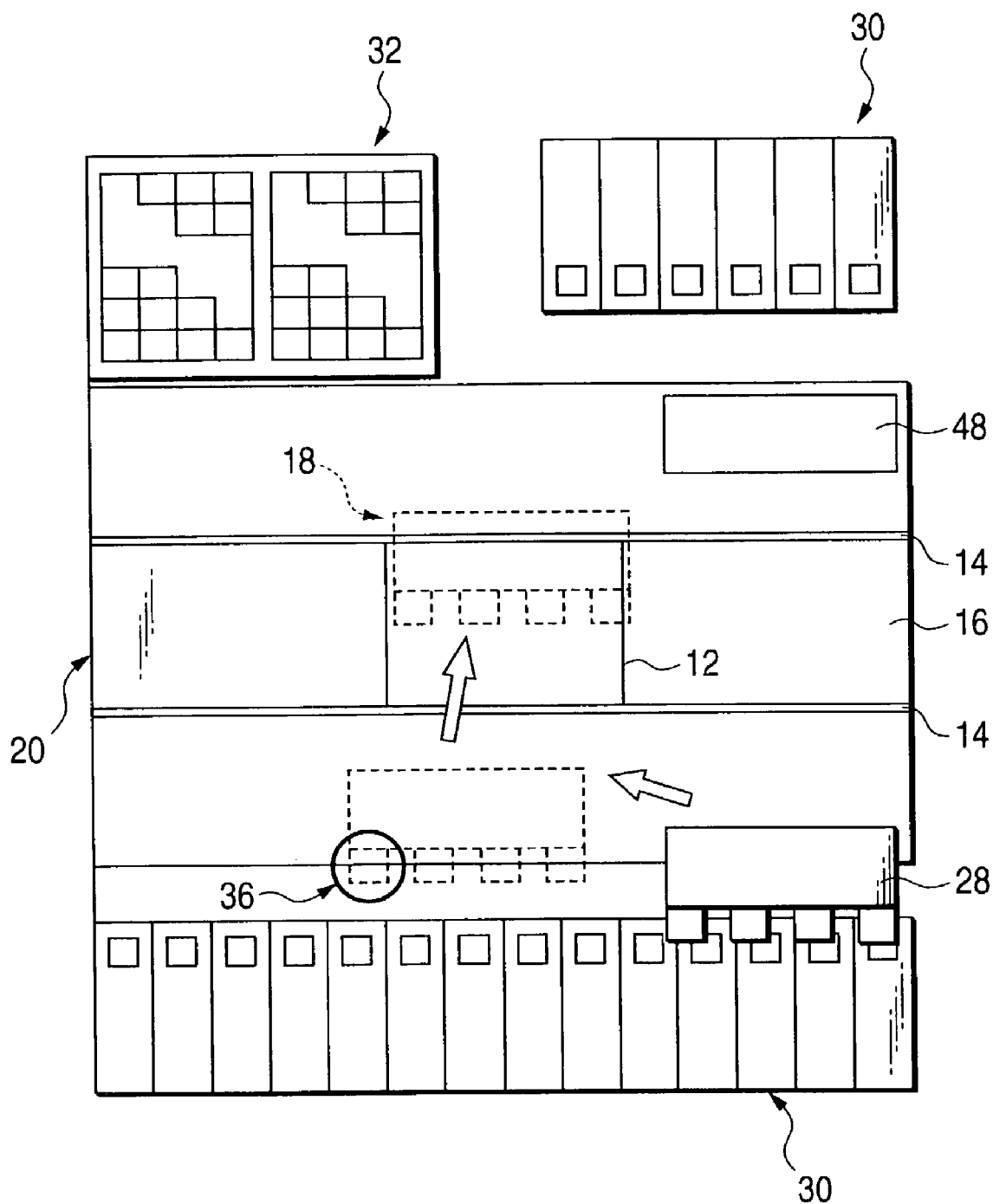
FIG. 3 is a schematic plan view explaining an operation of the electronic parts mounting device.

Here, FIG. 1 is a perspective view showing an electronic parts mounting device to which a parts recognition data preparing method according to the present invention is applied. FIG. 2 is an enlarged perspective view showing a transfer head of the electronic parts mounting device. FIG. 3 is a schematic plan view explaining an operation of the electronic parts mounting device.

First, a configuration of an electronic parts mounting device 100 will be explained hereunder.

As shown in FIG. 1, guide rails 14 for a circuit board 12 are provided in the middle of an upper surface of a base 10 of the electronic parts mounting device 100. The circuit board 12 is carried from a loader portion 16 on one end side to a mounting position 18 of the electronic parts and from the mounting position 18 to an unloader portion 20 on other end side by carrying belts of the guide rails 14. Y-tables 22, 24 are provided to both side portions of the upper surface of the base 10 over the circuit board 12 respectively. An X-table 26 is suspended between these two Y-tables 22, 24. Also, a transfer head 28 is fitted to the X-table 26, so that the transfer head 28 can be moved in an X-Y plane.

The transfer head 28, which is mounted onto an X-Y robot consisting of the X-table 26 and the Y-tables 22, 24 and moved freely on the X-Y plane (horizontal plane), is constructed such that the desired electronic parts can be sucked from a parts feeder 30, to which the electronic parts such as a resistor chip, a chip capacitor, etc. are supplied, or a parts tray 32, relatively large-sized electronic parts such as ICs of SOP, QFP, etc., connectors, etc. are supplied, for example, by a suction nozzle 34, then a suction attitude of the electronic parts can be detected by a recognizing device (recognizing means) 36, and then such desired electronic parts can be mounted onto a predetermined position of the circuit board 12. Such electronic parts mounting operations are controlled by a control unit (main controller) (not shown) according to a mounting program that is previously set. In this case, the data can be input into the control unit via an operation panel 52.

Here, the mounting program is such a program that converts recombination data, which are prepared by recombining mounting orders in response to NC information that are input into the electronic parts mounting device 100 and contain the information of the electronic parts to be mounted, into instruction modes, which are used to drive the X-Y robot, nozzles of the transfer head, etc. The preparation of this mounting program is executed by using the NC information, in which information of mounting positions of respective electronic parts, etc. are recorded, and parts data, in which information of electrode shapes, etc. of respective electronic parts are registered, according to inputs from the operator. The mounting of the electronic parts onto the circuit board is executed by executing the mounting program, which is prepared in this manner, by means of the control unit.

A plurality of parts feeders 30 are aligned on both end portions of the guide rails 14. A tape-like parts roller into which the electronic parts such as the resistor chip, the chip capacitor, etc., for example, are installed is fitted to each parts feeder respectively.

Also, the parts tray 32 can load two trays 32a, the longitudinal direction of which coincides with the direction perpendicular to the guide rails 14, in total thereon. Each tray 32a is constructed to slide to the guide rail 14 side in response to the supplied number of the parts and to keep the parts taking-out position in the Y-direction at a constant position. The electronic parts such as QFP, etc. are loaded on this tray 32a.

A recognizing device 36 having an attitude recognition camera, which detects positional displacement of the electronic parts sucked by the suction nozzle 34 in two dimensions (suction attitude) and then causes the transfer head 28 side to correct the suction attitude so as to cancel this positional displacement, is provided to the side portion of the circuit board 12 that is positioned by the guide rails 14. The attitude recognition camera is provided on the inner bottom portion of the recognizing device 36. A plurality of light emitting elements such as light emitting diodes LED, etc., which illuminate the electronic parts sucked by the suction nozzle 34, are provided like multiple-steps on the inner surface of the housing around this attitude recognition camera. Accordingly, the light can be irradiated onto a mounted surface of the electronic parts at a desired angle (e.g., 10°, 45°, 80°) and thus the image of the electronic parts can be picked up at an appropriate illumination angle in response to the type of the electronic parts. This illumination angle is set by the parts recognition data every electronic parts. Also, the resultant image data picked up by the recognizing device 36 are subjected to the recognizing process by the control unit to recognize a center position, electrode positions, etc. of the electronic parts, and these data are supplied as correction data of the mounting position and the angle.

As shown in FIG. 2, the transfer head 28 is constructed as a multiple head in which a plurality (four in the present embodiment) of fitting heads (first fitting head 38a, second fitting head 38b, third fitting head 38c, fourth fitting head 38d: parts holding means) are horizontally aligned and coupled. Four fitting heads 38a, 38b, 38c, 38d have the same structure, and each fitting head has the suction nozzle 34, an actuator 40 for causing the suction nozzle 34 to execute the vertical operation, a motor 42 for causing the suction nozzle 34 to rotate by θ, a timing belt 44, and a pulley 46.

The suction nozzle 34 of each fitting head can be exchanged. Other suction nozzles are prepared previously in a nozzle stocker 48 on the base 10 of the electronic parts mounting device 100. As the suction nozzle 34, for example, there are S-size nozzle for sucking the micro-chip parts of about 1.0×0.5 mm, M-size nozzle for sucking the QFP of about 18 mm square, etc. The suction nozzle 34 is selected and used in accordance with the type of the mounted electronic parts.

Next, an operation of the electronic parts mounting device 100 having the above configuration will be explained hereunder.

As shown in FIG. 3, when the circuit board 12 that is carried from the loader 16 of the guide rails 14 is transferred to a predetermined mounting position 18, the transfer head 28 is moved in the XY-plane by the XY-robot to suck the desired electronic parts from the parts feeder 30 or the parts tray 32 based on the mounting program and then is moved over the attitude recognition camera of the recognizing device 36. The recognizing device 36 recognizes the suction attitude of the electronic parts based on the parts recognition data to execute a correcting operation of the suction attitude. This correcting operation is executed by providing displacement amounts in the X-direction and the Y-direction to the XY-robot as an offset or rotating the suction nozzle 34 by the motor 42 by the displacement amounts in rotational components. Then, the electronic parts is mounted in the predetermined position of the circuit board 12.

Respective fitting heads 38a, 38b, 38c, and 38d cause the suction nozzle 34 to go down from the XY-plane in the perpendicular direction (Z-direction) when the electronic parts is sucked from the parts feeder 30 or the parts tray 32 by the suction nozzle 34, and when the electronic parts is mounted onto the predetermined position of the circuit board 12. Also, the mounting operation is carried out while exchanging the suction nozzle appropriately in response to the type of the electronic parts.

The mounting of the electronic parts onto the circuit board 12 is completed by repeating the operation of sucking the electronic parts and the operation of mounting the electronic parts onto the circuit board 12. The circuit board 12 whose mounting is completed is carried from the mounting position 18 to the unloader portion 20, while the new circuit board is carried into the loader portion 16. Then, the above operations are repeated.

Next, flows of data processing of the parts recognition data in the above electronic parts mounting device 100 will be explained simply by using a block diagram shown in FIG. 4 hereunder.

Figure 4:
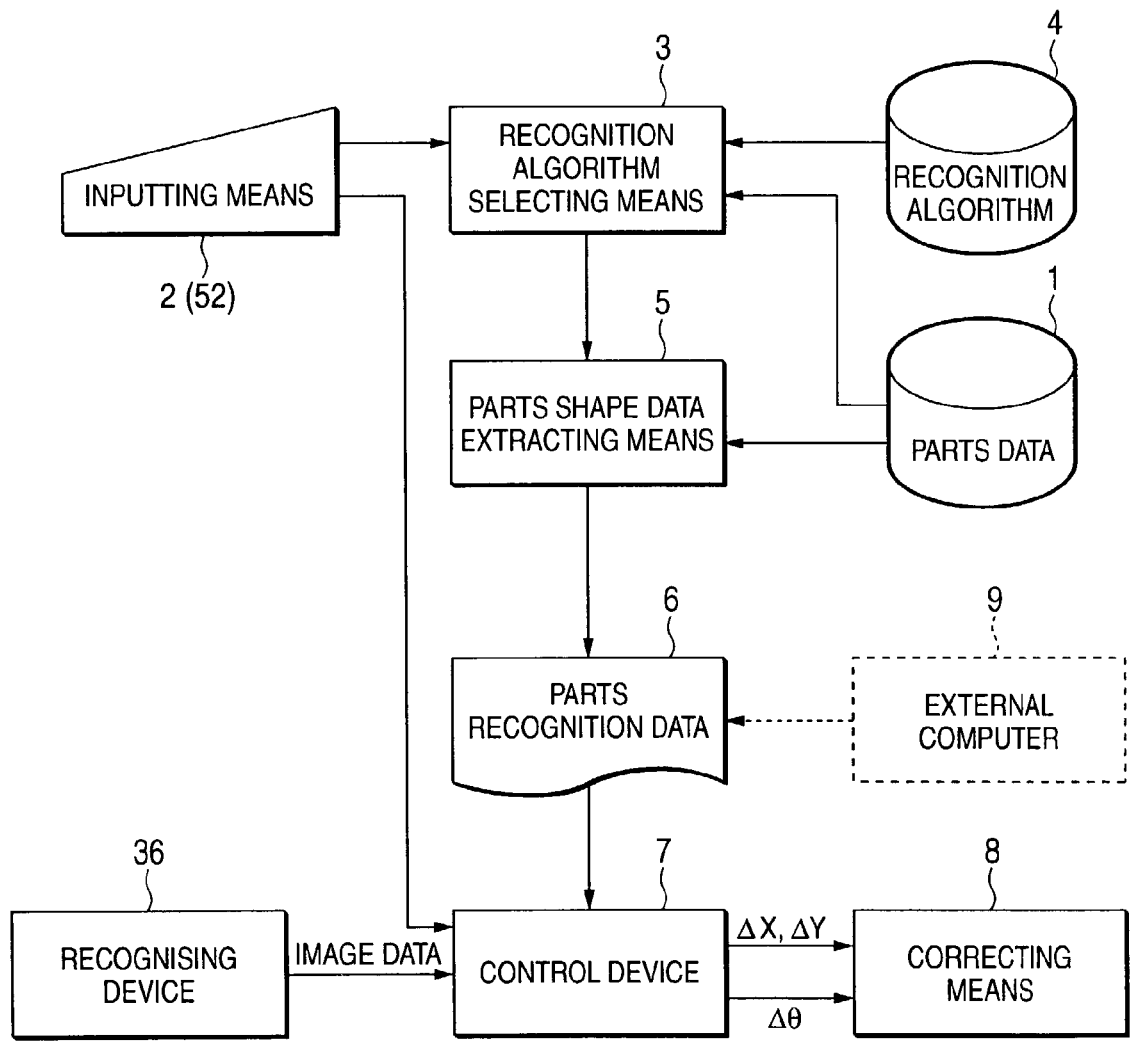
FIG. 4 is a block diagram showing flows of data processing of parts recognition data in the electronic parts mounting device.

As shown in FIG. 4, a shape data of the electronic parts is input by an inputting means 2 (operation panel 52) while referring to parts data 1 in which various types of electronic parts are registered, then the recognition algorithm that is optimum for this input electronic parts is selected from a recognition algorithm 4 by a recognition algorithm selecting means 3, and then parts shape data that are necessary for this selected recognition algorithm are extracted automatically from the shape data, which are input from the inputting means 2, by a parts shape data extracting means 5, whereby parts recognition data 6 are prepared. The prepared parts recognition data 6 are input into a control device 7. Also, image data of the electronic parts, which is sucked by the suction nozzle 34, are input from the recognizing device 36 to the control device 7. The control device 7 recognizes the suction attitude of the electronic parts from the input image data based on the recognition algorithm that is designated by the parts recognition data 6. In response to the recognized result, displacement components ($\Delta X$, $\Delta Y$) in the X, Y directions are corrected by the XY-robot (X-table 26, Y-tables 22, 24) as a correcting means 8 and also a rotational displacement component ($\Delta \theta$) is corrected by the suction nozzle 34 as the correcting means 8.

In this case, in addition to the parts recognition data 6 that is prepared on the electronic parts mounting device 100, there may be employed a device that prepares the parts recognition data on an external computer 9, which is connected to the electronic parts mounting device 100 via a communicating means such as the network, etc. or a recording medium such as the floppy disk, etc., and then inputs such prepared parts recognition data into the electronic parts mounting device 100. According to this, the operation of preparing the parts recognition data 6 can also be carried out in the middle of operation of the electronic parts mounting device 100, and thus the working operation can be improved.

Next, procedures of preparing the parts recognition data by picking up the image of the electronic parts, which is sucked by the suction nozzle 34, by means of the recognizing device 36 to recognize the suction attitude of the electronic parts whose image is picked up will be explained in detail hereunder.

First, assume that recognition algorithms of the electronic parts given in Table 1 as follows are prepared previously as the premise condition.

TABLE 1

| Algorithm name | Object parts |
|---|---|
| Algorithm A1 | Box type parts |
| Algorithm A2 | Internal electrode type parts |
| Algorithm A3 | External electrode type parts |
| Algorithm A4 | Lead type parts |
| Algorithm A5 | Ball-aligned type parts |

The recognition algorithms are defined in response to types of the electronic parts shown in FIG. 5 respectively. More particularly, the algorithm A1 is applied preferably to the box type parts such as the chip parts shown in FIG. 5A, the algorithm A2 is applied preferably to the parts of the type in which the electrodes are present on the inside of the body shown in FIG. 5B, the algorithm A3 is applied preferably to the parts of the type in which the electrodes are present on the outside of the body shown in FIG. 5C, the algorithm A4 is applied preferably to the parts of the type in which four or more electrodes are aligned on one side at an equal interval shown in FIG. 5D, and the algorithm A5 is applied preferably to the parts of the type in which solder-ball electrodes are aligned like a lattice shown in FIG. 5E.

Also, as the optical device, a small visual-field camera CAM1, which can pick up the visual field size of less than 10×10 mm, and a large visual-field camera CAM2, which can pick up the visual field size of less than 60×60 mm, are provided as the above attitude recognize camera, and also an illumination LED 1, which illuminates the mounted surface of the parts along the 10° direction, an illumination LED 2, which illuminates the mounted surface of the parts along the 45° direction, and an illumination LED 3, which illuminates the mounted surface of the parts along the 80° direction, are provided. In this case, the above imaging ranges and illumination angles are shown as an example strictly, and they can be set arbitrarily in response to the imaging object (setting by the optical-condition setting means).

Figure 6:
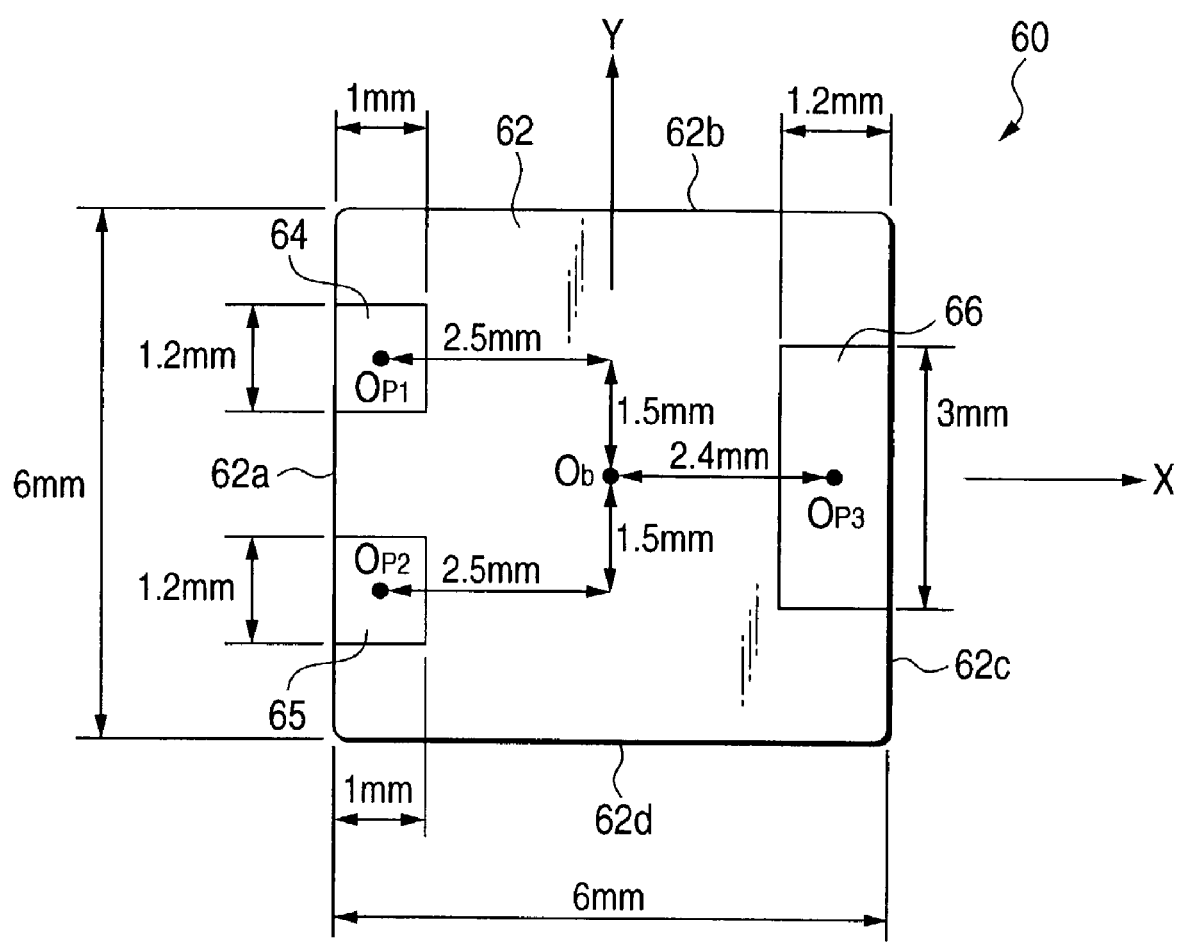
FIG. 6 is a view showing an external appearance of the electronic parts.
Figure 7:
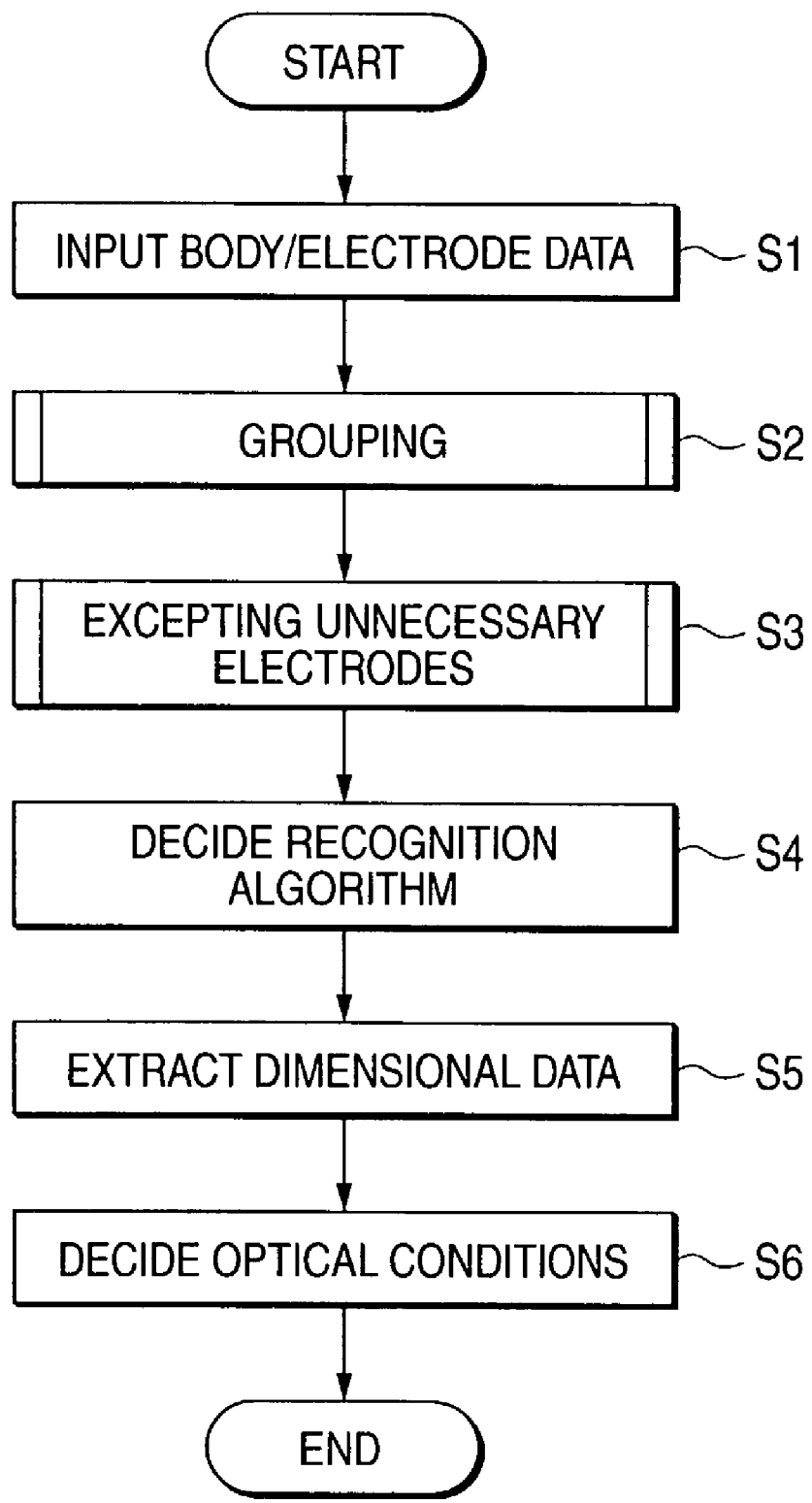
FIG. 7 is a flowchart showing procedures of preparing parts recognition data of the electronic parts.
Figure 8:
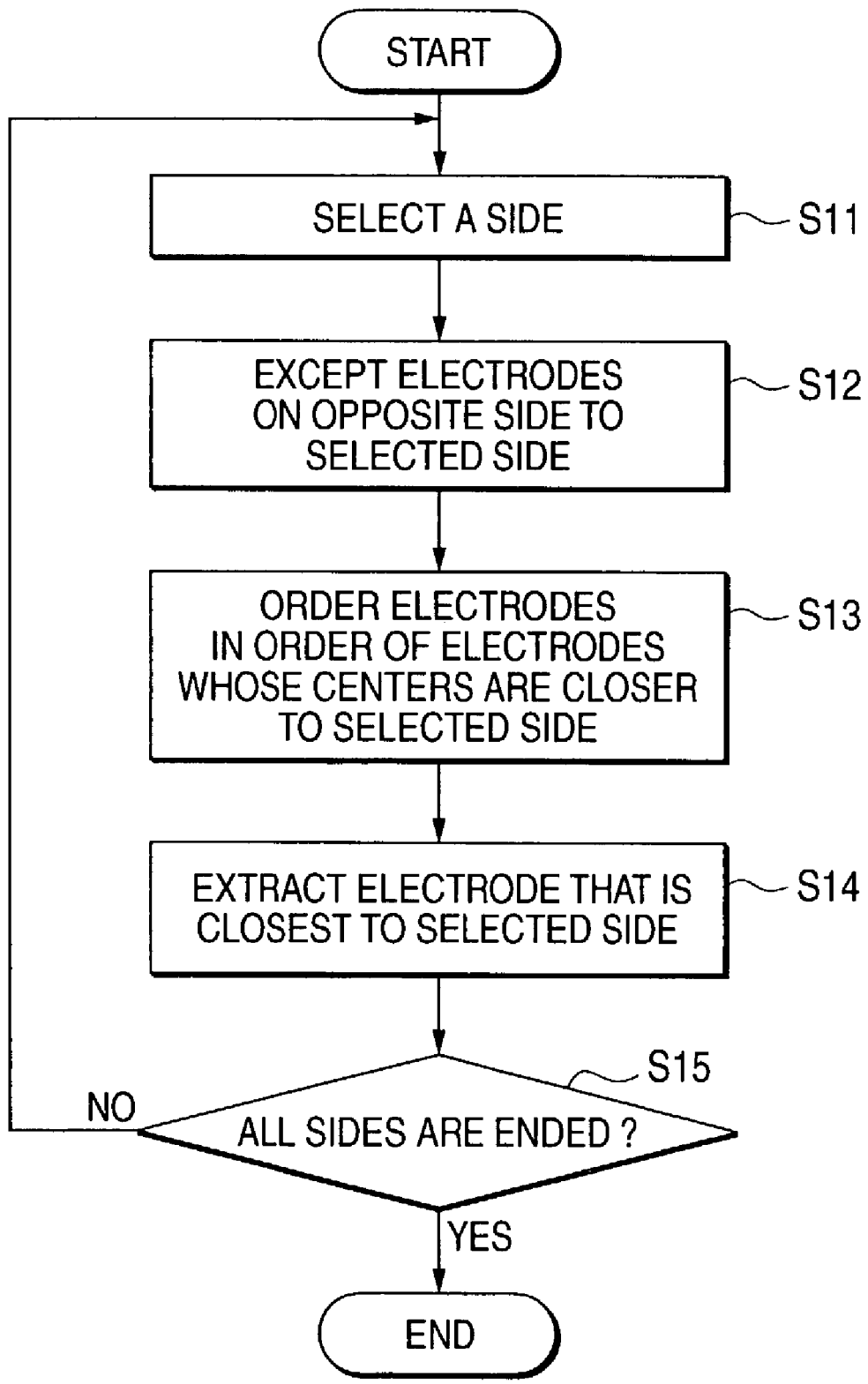
FIG. 8 is a flowchart showing procedures of grouping electrodes.
Figure 9:
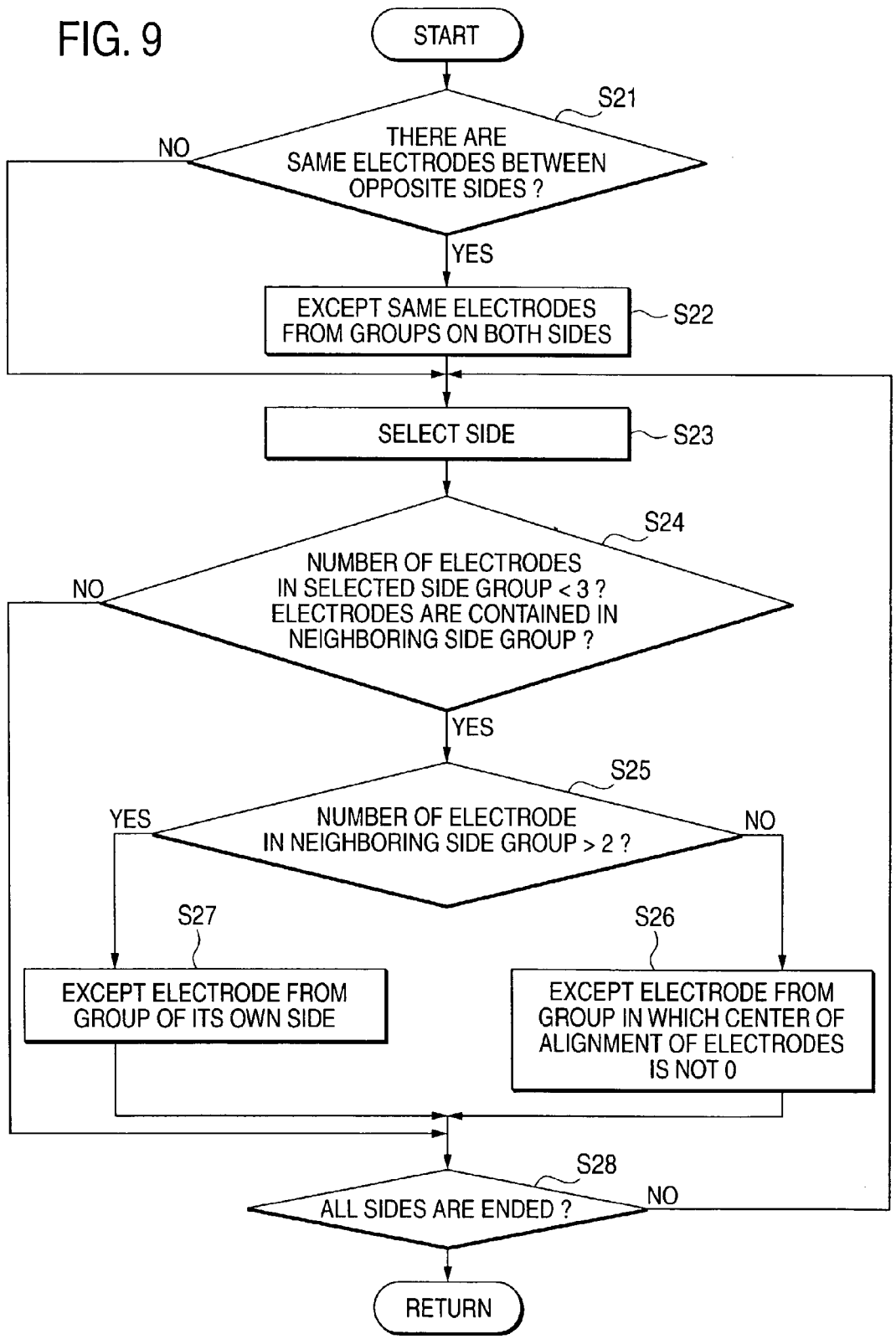
FIG. 9 is a flowchart showing procedures of a unnecessary electrode removing process.

Next, the case where the parts recognition data of an electronic parts 60, an external appearance of which is shown in FIG. 6, are prepared will be explained under these premise conditions with reference to flowcharts shown in FIG. 7 to FIG. 9 hereunder.

As shown in FIG. 6, the electronic parts 60 consists of a body 62 and electrodes 64, 65, 66. Upon preparing the parts recognition data of this electronic parts 60, as shown in FIG. 7, first parts data of the electronic parts 60 such as dimensions of the body 62 and the electrodes 64, 65, 66, shapes, colors, etc. are input (step 1, abbreviated as "S1" hereinafter). In the case of this electronic parts 60, parts data of respective portions are given in Table 2 as follows.

TABLE 2

| Parts name | Center X [mm] | Center Y [mm] | Dimension X [mm] | Dimension Y [mm] | Shape | Color | Type |
|---|---|---|---|---|---|---|---|
| Body 61 | — | — | 6.0 | 6.0 | Square | White | — |
| Electrode 64 | −2.5 | −1.5 | 1.0 | 1.2 | Square (flat) | — | Internal Electrode |
| Electrode 65 | −2.5 | 1.5 | 1.0 | 1.2 | Square (flat) | — | Internal Electrode |
| Electrode 66 | 2.4 | 0 | 1.2 | 3 | Square (flat) | — | Internal Electrode |

Then, respective input electrodes 64, 65, 66 are classified into groups of a left side 62a, an upper side 62b, a right side 62c, and a lower side 62d of the electronic parts respectively (S2). The procedures of grouping these electrodes will be explained with reference to a flowchart shown in FIG. 8 hereunder.

First, one side is selected from the left side 62a, the upper side 62b, the right side 62c, and the lower side 62d of the body 62 of the electronic parts 60 (S11). At first, if the grouping process is applied to the left side 62a, the electrodes whose centers are positioned on the plus side in the X-direction rather than a center Ob (0, 0) of the body 62 (the opposite side to the selected side) are excepted (S12). At this time, the electrode 66 is excepted since such electrode 66 is positioned on the plus side in the X-direction rather than the center Ob of the body 62.

Then, the electrodes (electrodes 64, 65) other than the excepted electrode (electrode 66) are ordered in order of the electrodes whose centers $Op_n$ (n is an integer indicating the number of electrodes) are closer to the left side 62a, i.e., in order of the smaller X coordinate (S13). At this time, the electrodes 64, 65 have the same order since positions of the electrode centers Op in the X-direction are the same. Then, if the electrode whose electrode center Op is smallest in the X-direction among these ordered electrodes (electrodes 64, 65) is extracted, both the electrodes 64, 65 are extracted (S14). As a result, the electrodes 64, 65 are set as group elements of the left side 62a.

The above steps S11 to S14 are applied to respective sides (S15). First, when the upper side 62b is grouped like the case of the left side 62a, only the electrode 64 is extracted. Similarly, the electrode 66 is extracted with respect to the right side 62c, and the electrode 65 is extracted with respect to the lower side 62d.

After the electrodes are extracted and classified into groups with respect to above respective sides, unnecessary electrodes in respective groups are excepted (S3). The procedures of this unnecessary electrode excepting process are shown in a flowchart of FIG. 9.

First, it is checked whether or not the same electrodes are contained between opposite sides as the group element (S21). If the same electrodes are contained, the same electrodes are excepted from respective groups on both sides (S22). In this case, since the electrodes in the group of the left side 62a and the right side 62c and the group of the upper side 62b and the lower side 62d are not doubly grouped, they are kept as they are.

Then, one side of respective sides is selected (S23). It is checked whether or not the group of the selected side is composed of three electrodes or less and the electrodes of the group element are contained in the neighboring other side group (S24).

If the left side 62a is checked, the number of electrodes contained in the group of the left side 62a is 2 and is smaller than 3. Also, the electrode 64 is also contained in the group of the neighboring upper side 62b. As a result, the left side satisfies the conditions in S24. In this case, if the conditions in S24 are not satisfied, the process of the selected side is ended.

Then, it is checked whether or not the number of electrodes contained in the neighboring group of the upper side 62b is larger than 2 (S25). Since the group of the upper side 62b is composed of the electrode 64 only, the number of the electrodes is 1.

In this case, it is checked whether or not a center of the alignment of electrodes in the groups of the left side 62a, the upper side 62b is positioned in the middle (Y=0 mm or X=0 mm) of the body 62 (S26). At this time, since the left side 62a is composed of the electrodes 64, 65, the center in the Y-direction is 0 mm. In contrast, since the upper side 62b is composed of only the electrode 64, the center in the X-direction is −2.5 mm and is not positioned in the middle of the body 62. Therefore, the electrode is excepted from the group of the upper side 62b.

In this case, if the number of electrodes contained in the group of the neighboring upper side 62b is larger than 2, the electrode is excepted from the group of its own left side 62a (S27).

Also, if the check in S24 is applied to the lower side 62d that is in the opposite neighborhood to the left side 62a, the electrode 65 is contained in both the left side 62a and the lower side 62d. Therefore, if the decision is made in the similar way to the case of the upper side 62b, the electrode 65 is excepted from the group of the lower side 62d (S26).

Then, above steps S18 to S22 are applied to all sides (S28). Here, if the right side 62c in the group element of which the electrode still remains solely is checked, the electrode 66 of the right side 62c is not contained in the neighboring upper side 62b and the neighboring lower side 62d. Therefore, the conditions in S24 are not satisfied, the electrodes are kept as they are.

In this manner, when the electrodes 64, 65, 66 are classified into groups, results are shown in Table 3.

TABLE 3

| Left side | Upper side | Right side | Lower side |
| --- | --- | --- | --- |
| Electrodes 64, 65 | Nothing | Electrode 66 | Nothing |

Two electrodes are present on the left side 62a, but size, shape, type of these electrodes are identical. Here, all electrodes can be regarded as the detected object and thus no electrode except the detected object is present in the electronic parts 60.

Then, the parts recognition algorithm that is fitted to the above electronic parts 60 is decided (S4) Since all the electrodes 64, 65, 66 have a square (flat) shape and are not the solder-ball electrode, the algorithm A5 is not applied to them. Also, since the number of electrodes constituting the groups of four sides is below 4 on all sides respectively, the algorithm A4 cannot be applied to them. In addition, since all types of the electrodes 64, 65, 66 are the internal electrode, the algorithm A3 cannot be applied to them. Further, since the electrodes 64, 65, 66 cannot be discriminated as the internal electrodes unless the electrodes 64, 65, 66 have contrast to the body 62, the contrast between the body 62 and the electrodes 64, 65, 66 is considered. At this time, since the color of the body 62 of the electronic parts 60 is white, the contrast to the electrodes as the metal surface cannot be sufficiently obtained and thus it may be considered that it is difficult to detect the electrodes 64, 65, 66. Therefore, the algorithm A2 cannot be applied to them. Conversely, since the body 62 is a quadrangle and all surfaces of the body 62 reflect the illumination light in picking up the image, it can be expected that the image of the body 62 is picked up brightly. Therefore, it is decided that the algorithm A1 that can recognize the box-like parts can be applied to them.

Figure 5A:
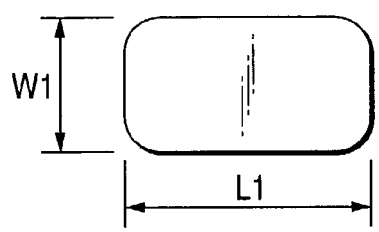
FIGS. 5A, 5B, 5C, 5D, and 5E are views showing types of the electronic parts to which respective recognition algorithms are fitted.
Figure 5B:
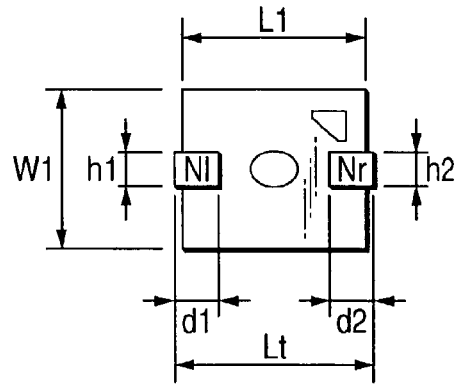
Figure 5C:
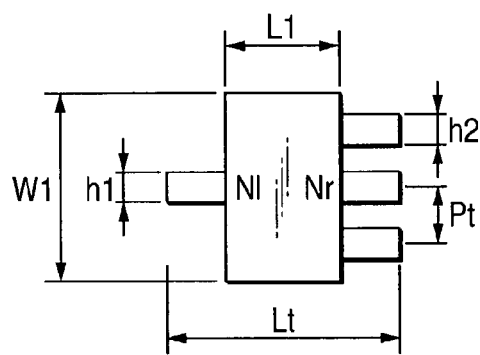

Then, since the algorithm A1 is set as above, parts shape data necessary for the algorithm A1 are extracted (S5). As shown in FIG. 5A, the algorithm A1 needs only the parts dimensions L1, W1. Therefore, L1=6 mm and W1=6 mm are set from the dimensions of the body 62 as the parts shape data. In this case, the parts shape data are set automatically based on the already-input parts data shown in Table 2.

Then, optical conditions are decided (S6). Because a maximum dimension of the electronic parts 60 is 6 mm ×6 mm, the small visual-field camera CAM1 can be used in this case. Also, since the algorithm A1 that does not detect the electrode as above is selected, it is desired that the illumination should be set as bright as possible to make it easy to detect the shape of the body 62. Therefore, the illumination light is set to irradiate the parts by using all the illuminations LED1, LED2, LED3.

According to above steps, the parts recognition data of the electronic parts 60 are prepared. In this manner, if the parts recognition data of all types of the electronic parts, which are to be mounted onto the circuit board, are prepared respectively, suction attitude of the electronic parts held by the suction nozzle can be recognized without is fail based on the parts recognition data. Then, the mounting position of the electronic parts onto the circuit board can be corrected precisely in response to the recognized suction attitude of the electronic parts.

According to the parts recognition data preparing method of the present embodiment, if information of the body and the electrodes of the electronic parts are input, the recognition algorithm suitable for this electronic parts is set, and then the parts shape data required for the recognizing process executed by this recognition algorithm are automatically extracted from the input information of the body and the electrodes. Accordingly, since the information of the body and the electrodes of the electronic parts, which are required for the recognizing process executed by this recognition algorithm, are automatically input without sequential inputting, the electronic parts data can be prepared precisely and quickly unless the operator is conscious of the characteristic of the recognition algorithm.

Figure 10:
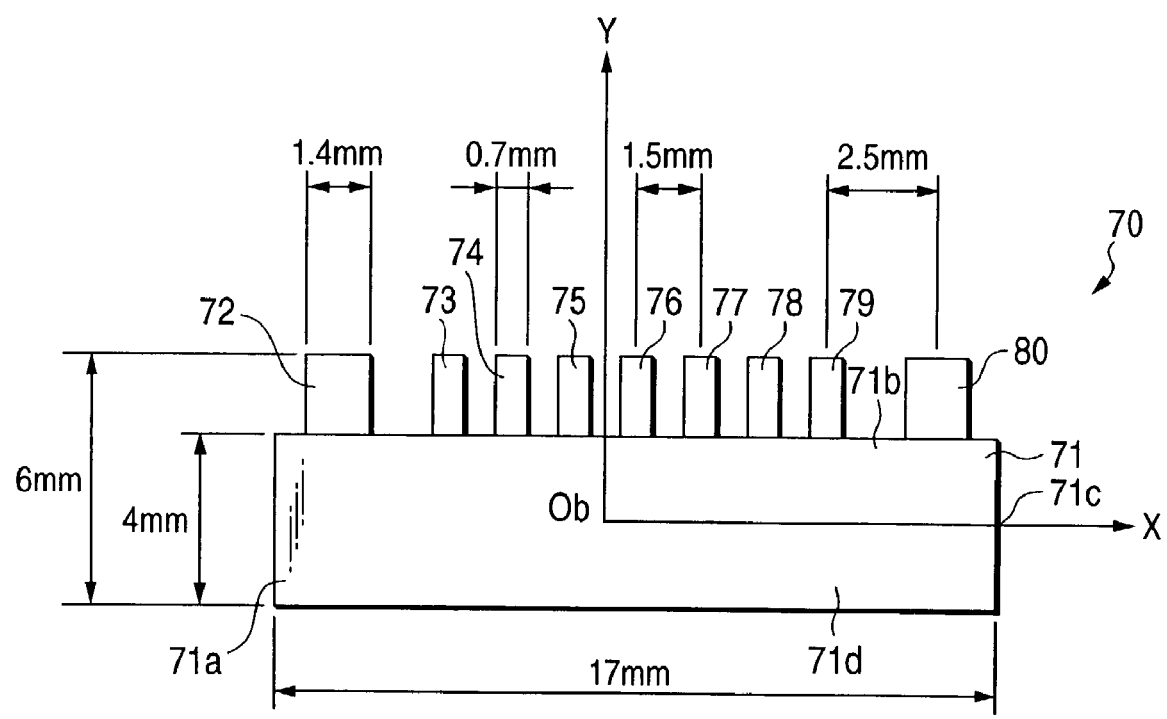
FIG. 10 is a view showing an external appearance of the electronic parts.

Next, a second embodiment of the parts recognition data preparing method according to the present embodiment will be explained hereunder. The present embodiment formulates the electronic parts data of an electronic parts 70 whose external appearance is shown in FIG. 10.

This electronic parts 70 consists of a body 71, and electrodes 72, 73 to 79, 80 that are aligned on one side of the body 71. The parts recognition data of the electronic parts 70 can be formulated based on the procedures that are similar to the first embodiment shown in above FIG. 7 to FIG. 9.

First, parts data of the electronic parts 70 such as dimensions of the body 71 and the electrodes 72, 73 to 79, 80, shapes, colors, etc. are input (S1). In the case of this electronic parts 70, parts data of respective portions are given in Table 4 as follows.

TABLE 4

| Parts name | Center X [mm] | Center Y [mm] | Dimension X [mm] | Dimension Y [mm] | Shape | Color | Type |
|---|---|---|---|---|---|---|---|
| Body 71 | — | — | 6.0 | 6.0 | Square | Black | — |
| Electrode 72 | −7.0 | −3.0 | 1.4 | 2.0 | Square (flat) | — | External Electrode |
| Electrode 73 | −4.5 | −3.0 | 0.7 | 2.0 | Square (flat) | — | External Electrode |
| Electrode 74 | −3.0 | −3.0 | 0.7 | 2.0 | Square (flat) | — | External Electrode |
| Electrode 75 | −1.5 | −3.0 | 0.7 | 2.0 | Square (flat) | — | External Electrode |
| Electrode 76 | 0.0 | −3.0 | 0.7 | 2.0 | Square (flat) | — | External Electrode |
| Electrode 77 | 1.5 | −3.0 | 0.7 | 2.0 | Square (flat) | — | External Electrode |
| Electrode 78 | 3.0 | −3.0 | 0.7 | 2.0 | Square (flat) | — | External Electrode |
| Electrode 79 | 4.5 | −3.0 | 0.7 | 2.0 | Square (flat) | — | External Electrode |
| Electrode 80 | 7.0 | −3.0 | 0.7 | 2.0 | Square (flat) | — | External Electrode |

TABLE 4-continued

Then, respective input electrodes 72, 73 to 79, 80 are classified into groups of a left side 71a, an upper side 71b, a right side 71c, and a lower side 71d of the electronic parts respectively (S2). Like the case of the first embodiment, this grouping method will be explained with reference to FIG. 8 hereunder.

First, one side is selected from respective sides of the body 71 of the electronic parts 70 (S11). At first, if the grouping process is applied to the left side 71a, the electrodes whose centers are positioned on the plus side in the X-direction in contrast to a center Ob (0, 0) of the body 71 (the opposite side to the selected side) are excepted (S12). At this time, the electrodes 76 to 79, 80 are excepted since such electrodes are positioned on the plus side in the X-direction in contrast to the center Ob of the body 71.

Then, the electrodes (electrodes 72, 73 to 75) other than the excepted electrodes (electrodes 76 to 79, 80) are ordered in order of the electrodes whose centers $Op_n$ are closer to the left side 71a, i.e., in order of the smaller X coordinate (S13). At this time, these electrodes are ordered in order of the electrodes 72, 73, 74, and 75. Then, if the electrode whose electrode center Op is smallest in the X-direction among these ordered electrodes is extracted, only the electrode 72 is extracted (S14). As a result, the electrode 72 is set as group element of the left side 71a.

The above steps S11 to S14 are applied to respective sides (S15). First, if the upper side 71b is grouped like the case of the left side 71a, the electrodes 72, 73 to 79, 80 are extracted. Similarly, the electrode 80 is extracted with respect to the right side 71c, and no electrode is extracted with respect to the lower side 71d. Then, unnecessary electrodes in respective groups are excepted (S3). As shown in FIG. 9, first it is checked whether or not the same electrodes are contained between opposite sides as the group element (S21). In this case, since all electrodes do not correspond, they are kept as they are.

Then, one side of respective sides is selected (S23). It is checked whether or not the group of the selected side is composed of three electrodes or less and also the electrodes of the group element are contained in the neighboring other side group (S24). First, if the left side 71a is checked, the electrode 72 is also contained in the group of the neighboring upper side 71b. Since the neighboring upper side 71b consists of 9 electrodes, the electrode 72 is excepted from the group of the left side 71a. Then, the side having the number of electrodes which is smaller than 3 is the right side 71c. If the decision is made like the case of the left side 71a, the electrode 80 is excepted from the group of the right side 71c. After the electrodes are grouped in this manner, the results of excepted electrodes are given in Table 5.

TABLE 5

| Parts name | Center X [mm] | Center Y [mm] | Dimension X [mm] | Dimension Y [mm] | Interval X [mm] | Number of parts | Shape | Type |
|---|---|---|---|---|---|---|---|---|
| Electrodes 73-79 | 0.0 | −3.0 | 0.7 | 2.0 | 1.5 | 7 | Square | External electrode |

In this case, nine electrodes are present in the group of the upper side 71b, but the electrodes 72, 80 and the electrodes 73 to 79 have different size and alignment interval. Therefore, the electrodes 72, 80 that are positioned on both sides are excepted from the recognized object. Then, if the electrodes on other sides are also grouped like the above method, results are given in Table 6.

TABLE 6

| Parts name | Center X [mm] | Center Y [mm] | Dimension X [mm] | Dimension Y [mm] | Interval X [mm] | Number of parts | Shape | Type |
|---|---|---|---|---|---|---|---|---|
| Electrodes 72, 80-79 | 0 | −3.0 | 1.4 | 2.0 | 14.0 | 2 | Square (flat) | External electrode |

Then, the adaptive parts recognition algorithm is set (S4). Since the group of the upper side 71b of this electronic parts 70 consist of seven electrodes 73 to 79 and all shapes are a square (flat) shape, the algorithm A4 can be applied.

Figure 5D:
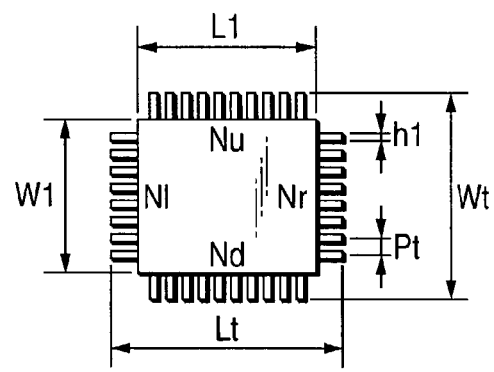
Figure 5E:
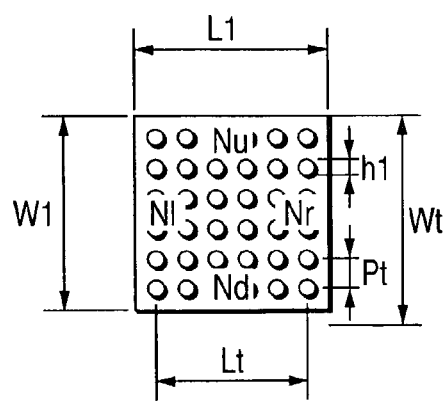

Here, since the algorithm A4 is set, parts shape data necessary for the algorithm A4 are extracted (S5). As shown in FIG. 5D, the algorithm A4 needs the parts dimensions L1, W1, Lt, Wt, h1, Pt, Nr, Nl, Nu, Nd. Therefore, the above parts dimensions are set to values shown in Table 7 by extracting them from the parts data of the body 62 and the electrodes 73 to 79.

TABLE 7

| Left side | Upper side | Right side | Lower side |
|---|---|---|---|
| Nothing | Electrodes 72-80 | Nothing | Nothing |

Then, the optical conditions are set (S6). Because a maximum dimension of the electronic parts 70 is 17.0 mm×6 mm, the large visual-field camera CAM2 can be used in this case. Also, since the algorithm A4 that does not detect the electrode as above is selected and the shape of the electrodes is flat, the illumination LED2 that irradiates the mounted surface of the electronic parts 70 at an angle of 45° is used as the illumination light.

According to above steps, the parts recognition data of the electronic parts 70 are prepared. In this manner, according to the parts recognition data preparing method of the present embodiment, the same advantages as the first embodiment can be achieved.

Next, a third embodiment of the parts recognition data preparing method according to the present invention will be explained hereunder. The present embodiment prepares the parts recognition data while plotting the shape of the electronic parts shown in FIG. 10, for example, based on the input data.

Figure 12A:
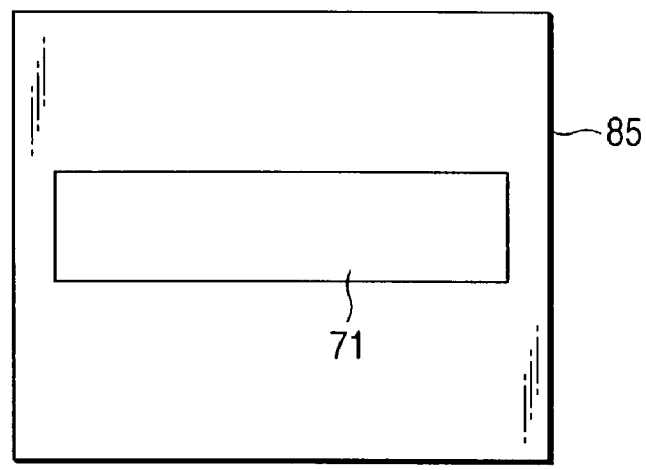
FIGS. 12A, 12B, 12C are views showing behaviors of preparing the parts recognition data of the electronic parts while plotting them.

Here, FIG. 11 is a flowchart showing procedures of preparing the parts recognition data. FIG. 12 is a view showing behaviors of preparing the parts recognition data of the electronic parts 70 while plotting them.

There are various modes as the plotting method. For example, there are the case where the shape of the electronic parts is displayed by combining line drawings, the case where the shape of the electronic parts is displayed by selecting the shape of the sample and then changing parameters such as size, position, etc., and others. These modes can be set arbitrarily. In the present embodiment, in order to input the data more simply and precisely, the mode for displaying the shape of the electronic parts automatically by inputting the lowest-minimum data such as size, position, shape, color, etc. is employed.

The parts recognition data preparing method of the present embodiment will be explained with reference to FIG. 11 hereunder.

First, in order to plot the body 71, the data of dimension, shape, and color are input as shown in Table 8 (S31).

TABLE 8

| Left side | Upper side | Right side | Lower side |
|---|---|---|---|
| Nothing | Electrodes 73-79 | Nothing | Nothing |

In this case, the inputting operation can be simplified by employing the device of selecting the shape and the color from the previously-selected candidates. According to these inputs, the body 71 is plotted and displayed in a plotting area 85 on the display screen by a displaying means such as a monitor, or the like shown in FIG. 12A (S32).

Then, the plotting of the electrodes 72 to 79 is executed. Two types of electrodes, e.g., the electrodes 72, 80 and the electrodes 73 to 79 are contained in the electronic parts 70. At first, data of the electrodes 73 to 79 are input (S33). As this inputting method, it is possible to input data of individual electrodes one by one, otherwise it is possible to input data of the electrodes, which are aligned at the same interval, collectively. In the case of the present embodiment, data of the electrodes are input collectively by inputting the parts data shown in Table 9.

TABLE 9

| Parts dimension [mm] | L1 | 17.0 |
|---|---|---|
| | W1 | 4.0 |
| Lead dimension [mm] | Lt | 17.0 |
| | Wt | 6.0 |
| Electrode dimension [mm] | h1 | 0.7 |
| | Pt | 1.5 |
| Number of Electrodes | Nl | 0 |
| | Nr | 0 |
| | Nu | 7 |
| | Nd | 0 |

Figure 12B:
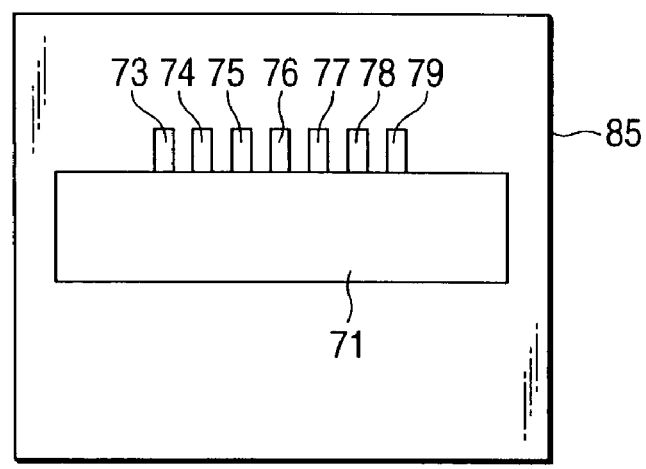

That is, center positions of individual electrodes are calculated from the parts data in which intervals between the electrodes and the number of electrodes shown in Table 9 are contained, and then figures of the electrodes 73 to 79 are displayed in the plotting area 85 as shown in FIG. 12B (S34). In this case, if a distance between electrode centers of 9 mm on both ends of the electrode is input in place of the number of electrodes, the data input of the electrodes may be executed by the intervals between the electrodes and the number of electrodes.

Similarly, the inputting of the electrodes 72, 80 can be done as shown in Table 10.

TABLE 10

| Parts name | Center X [mm] | Center Y [mm] | Dimension X [mm] | Dimension Y [mm] | Shape | Color | Type |
|---|---|---|---|---|---|---|---|
| Body 71 | — | — | 17.0 | 4.0 | Square | Black | — |

Figure 12C:
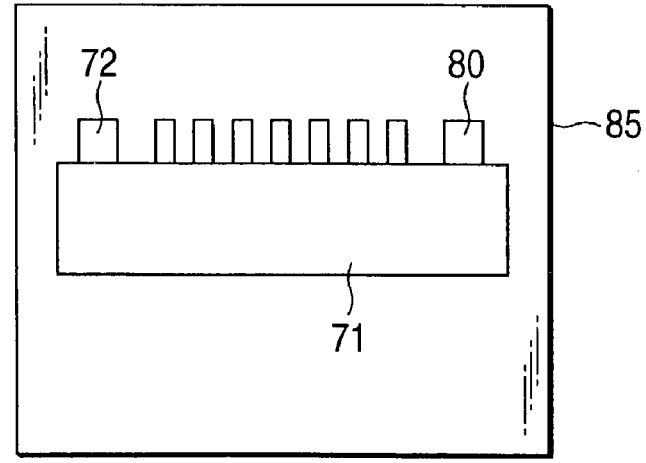

That is, as shown in FIG. 12C, figures of the electrodes 72, 80 are plotted in the plotting area 85 by inputting the parts data in which the intervals between the electrodes and the number of electrodes given in Table 10 are contained.

Accordingly, the data inputting and the plotting of all electrodes have been completed (S35). Then, it is decided whether or not positions of the electrodes are input rightly (S36). More particularly, since all figures of the electrodes 72 to 80 are the external electrodes, centers of these electrodes must be positioned on the outside of the figure of the body 71. All Y-coordinates of the electrode centers are −3.0 mm, and the end of the body 71 is located at −2.0 mm since the body center is located at 0 mm and the dimension of the body 71 in the Y-direction is 4 mm. Therefore, it can be decided that respective electrodes 72 to 80 are positioned on the outside of the figure of the body 71. As a result, it is decided that the input parts data are right, and thus the data inputting is completed.

According to the parts recognition data preparing method of the present embodiment, if the body shape is plotted from the input information of the body and also the electrode shape is plotted from the input information of the electrode, it can be decided by checking visually whether or not plotted positional relationships between the body and the electrode are correct. Accordingly, such plotted positional relationships can be checked at an instant in contrast to the case where the plotted positional relationships are decided only by the numerical data, so that it can be checked simply and quickly whether or not the input information are correct.

Next, a fourth embodiment of the parts recognition data preparing method according to the present invention will be explained hereunder. In the present embodiment, the parts recognition data are prepared by extracting such data from the image data obtained by picking up the image of the electronic parts.

Figure 13:
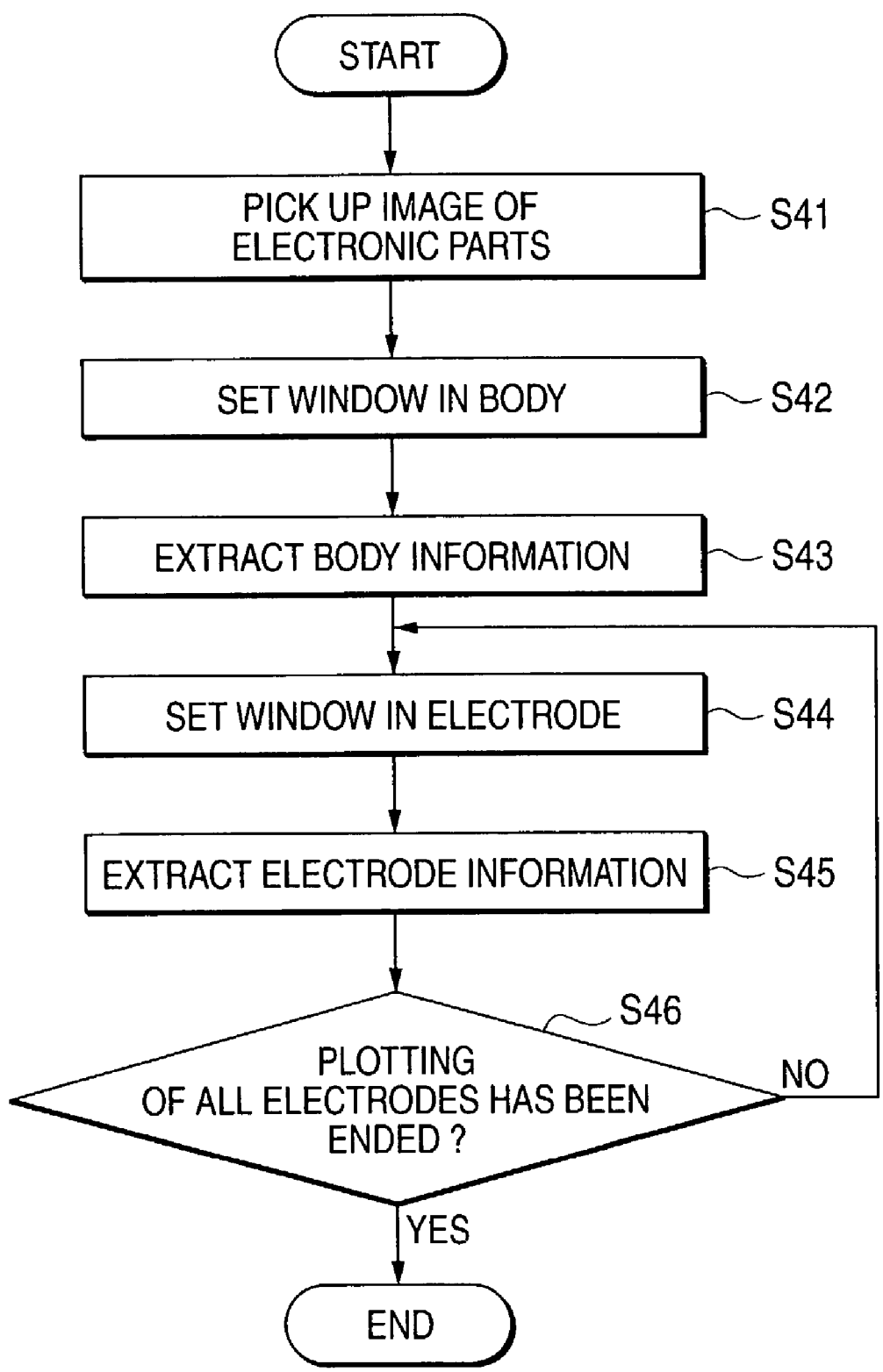
FIG. 13 is a flowchart showing procedures of preparing the parts recognition data.
Figure 14:
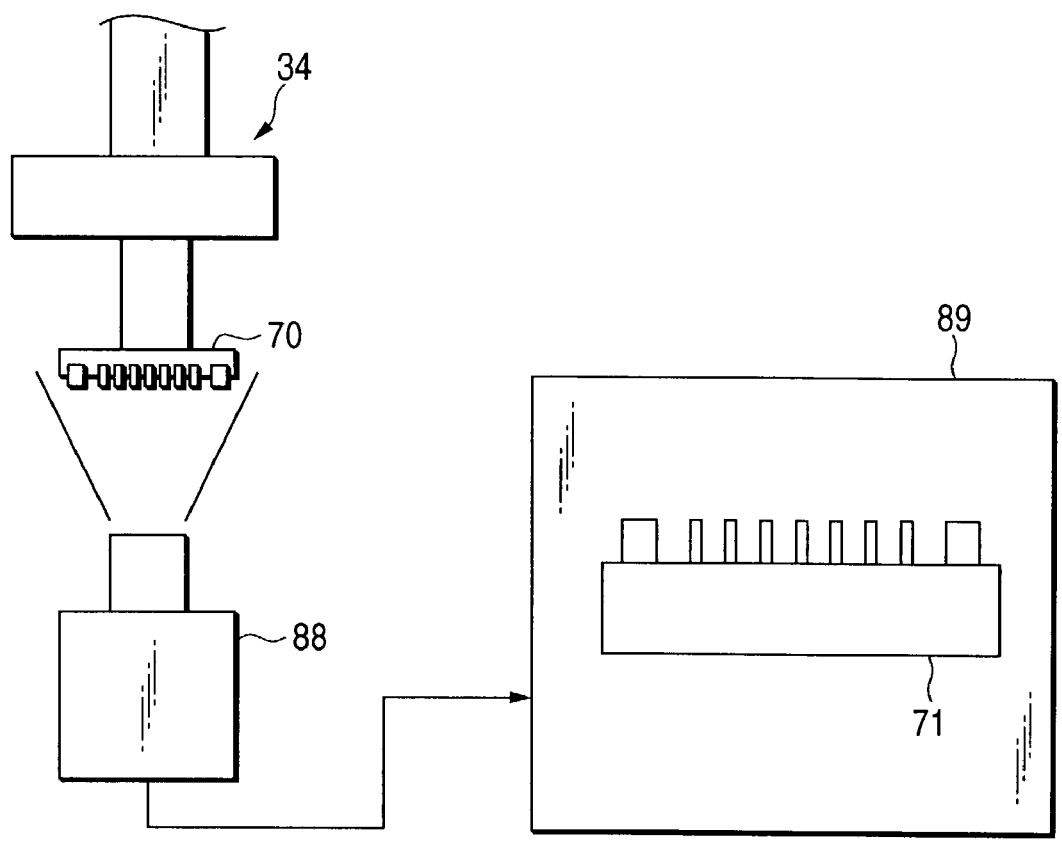
FIG. 14 is a view showing conceptually a behavior of picking up images of the parts recognition data of the electronic parts.

Here, FIG. 13 is a flowchart showing procedures of preparing the parts recognition data. FIG. 14 is a view showing conceptually a behavior of picking up images of the parts recognition data of the electronic parts 70. FIG. 15 is a view showing behaviors of extracting the parts recognition data from the picked-up image data. In this case, explanation will be made by using the electronic parts shown in FIG. 10 as an example.

The parts recognition data preparing method of the present embodiment will be explained with reference to FIG. 13 hereunder.

First, as shown in FIG. 14, image data 89 is obtained by picking up an image of the electronic parts 70 by virtue of an imaging device 88 (S41). It is desired that the imaging device 88 should be employed commonly with the attitude recognition camera that recognizes actually the electronic parts by the recognizing device 36 in the electronic parts mounting device 100. However, if the imaging magnification of the imaging device 88 can be grasped correctly, the imaging device is not limited to such imaging device, and the common digital camera, scanner, or the like may be employed.

Then, as shown in FIG. 15A, an area that corresponds to the body 71 of the electronic parts 70 in the image data 89 is set by providing a window 90 based on the inputting operation from the inputting means 2 (S42). Then, the precise edge of the body 71 is detected from the position near the set window 90, brightness (pixel concentration) of which is changed, and then body information such as the shape of the body 71, the center position of the body 71, etc. are extracted from the detected edge information (S43). Since the center position of the body 71 is set to (0, 0) for convenience of data, the resultant center position gives an offset value employed in the calculation of the center positions of the electrodes described in the following. Also, if the imaging device 88 can pick up the color image, color data of the body 71 can be extracted from the internal area of the edge. In this case, if the imaging device can input the black-and-white image only, the brightness (concentration) information can be extracted in place of the color information.

Then, as shown in FIG. 15B, an area corresponding to the electrode 72 is indicated by a window 92 (S44). Then, a precise edge of the electrode 72 is detected from the position near the instructed window 92, a brightness of which is changed, and then the electrode information such as a shape of the electrode 72, an electrode center position, etc. are extracted from the detected edge information (S45). The electrode center position is calculated by using an offset value that is obtained from the above center of the body 71. In addition, since it can be decided based on the positional relationship to the body 71 whether or not the electrode 72 is the internal electrode type or the external electrode type, the type of the electrode 72 can also be extracted. In the case of the illustrated example, since the electrode 72 is positioned on the outside of the body, it can be decided that the electrode is the external electrode. Also, data of the color or the concentration can be extracted from the internal area of the window 92. Similarly, the extraction of the parts recognition data of the electrodes 73 to 80 is carried out subsequently, and thus the data inputting is completed (S46).

In this case, in the parts recognition data preparing method of the present embodiment for preparing the data of the electronic parts from the image data, data of the body 71 and the electrode 72 to 80 are input manually from the inputting means 2. If the images of the body 71 and the electrode 72 to 80 can have the sufficient contrast to the background, it can be facilitated to extract automatically a body area and electrode areas as candidates from the image data. According to this, a burden on the operator can be reduced and also the parts recognition data can be formulated more simply.

In mounting the electronic parts that has not been registered in the parts data, first the parts data of the electronic parts must be prepared. In the related art, such parts data are input one by one. Therefore, unless the operator has known well input items in details, such operator consumes much time in the inputting operation to input the parts data. However, according to the parts recognition data preparing method of the present embodiment, the parts recognition data can be prepared automatically by picking up simply the image of the electronic parts to be input. Therefore, the parts recognition data can be obtained simply and quickly not to require the skill on the data inputting.

In this manner, according to the parts recognition data preparing method of the present embodiment, the information of the body and the electrodes can be acquired from the image data of the body area and the electrode area by pointing the area, which corresponds to the body portion, and the area, which corresponds to the electrode portion of the electronic parts, to the image data that are obtained by picking up the image of the electronic parts. Hence, information of the parts shape data such as dimension, color or concentration, etc. of the body and the parts shape data such as dimension, number, alignment pitch of the electrodes, etc. can be extracted automatically, and thus there is no need to input respective data one by one. Therefore, the preparation of the parts recognition data can be simplified much more.

Here, the data required to prepare the above parts recognition data can be input directly from the operation panel 52 of the electronic parts mounting device 100 to the control unit. Otherwise, the parts recognition data can be prepared by the external computer on the outside of the electronic parts mounting device 100 and then be input into the electronic parts mounting device 100 via the recording medium or the electric connection.

The parts recognition data preparing method according to the present invention explained as above may be applied to not only the configuration having a multiple head in which a plurality of fitting heads are coupled, like the electronic parts mounting device 100 shown in FIG. 1 to FIG. 3, but also the configuration having a rotary head that can execute the high-speed mounting.

Figure 16:
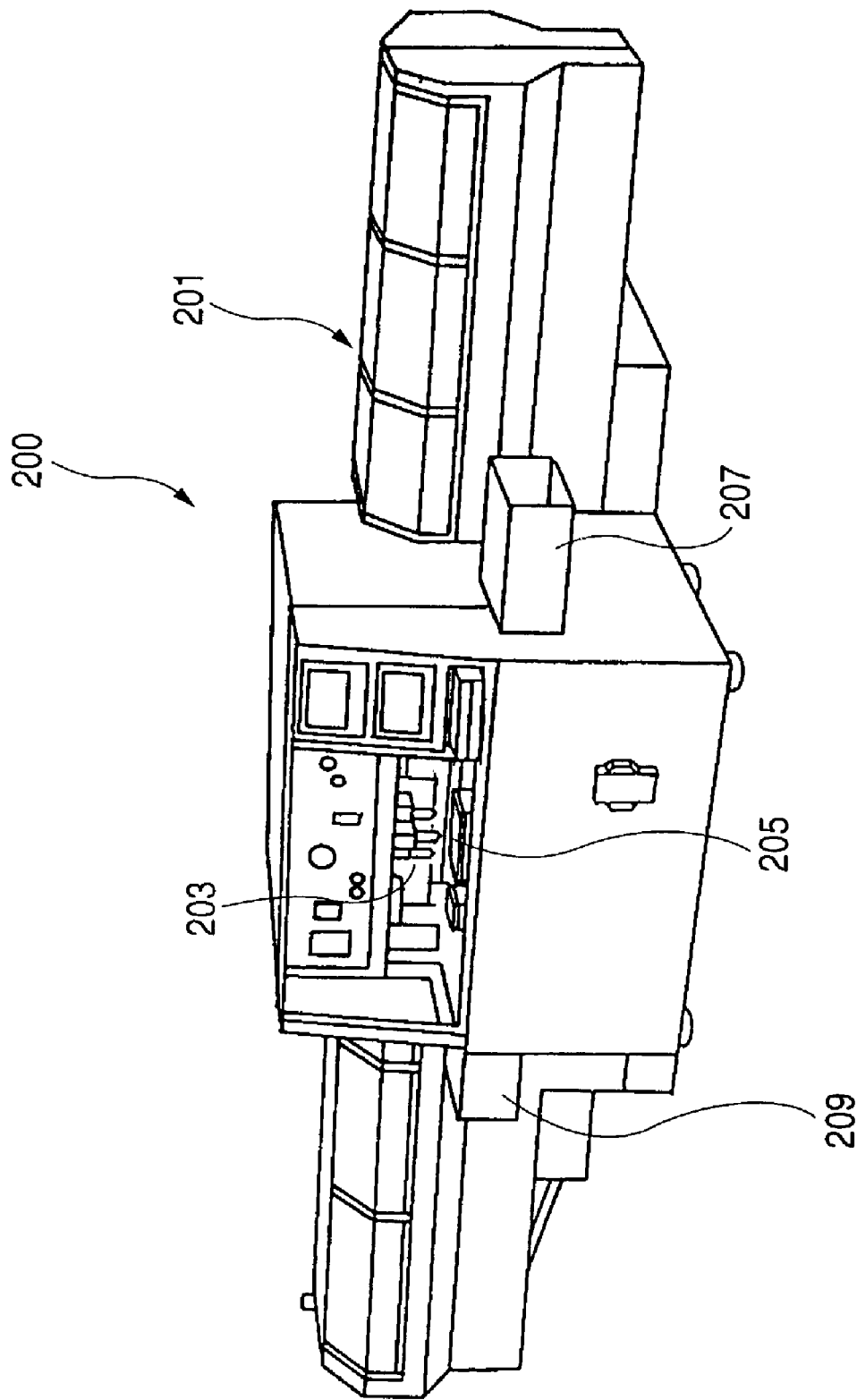
FIG. 16 is a view showing an external appearance of the overall electronic parts mounting device having a rotary head.

Here, an external appearance of the overall electronic parts mounting device having the rotary head is shown in FIG. 16. A schematic configuration of a parts fitting mechanism of this electronic parts mounting device is shown in FIG. 17.

As shown in FIG. 16, an electronic parts mounting device 200 comprises mainly a parts supplying portion 201 for supplying the electronic parts, a rotary head 203 for sucking the electronic parts at a predetermined parts supplying position on the parts supplying portion 201 to fit it to the circuit board, an X-Y table 205 for positioning the circuit board, and a recognizing device 206 for recognizing the suction attitude of the sucked electronic parts. The electronic parts mounting device 200 puts the circuit board supplied from a loader portion 207 on the X-Y table 205, then fits the electronic parts by the rotary head 203, then recognizes the suction attitude by the recognizing device 206, then fits the electronic parts while correcting the mounting position in response to the recognized suction attitude, and then carries out the circuit board, the fitting of the parts onto which is completed, to an unloader portion 209 from the X-Y table 205.

Figure 17:
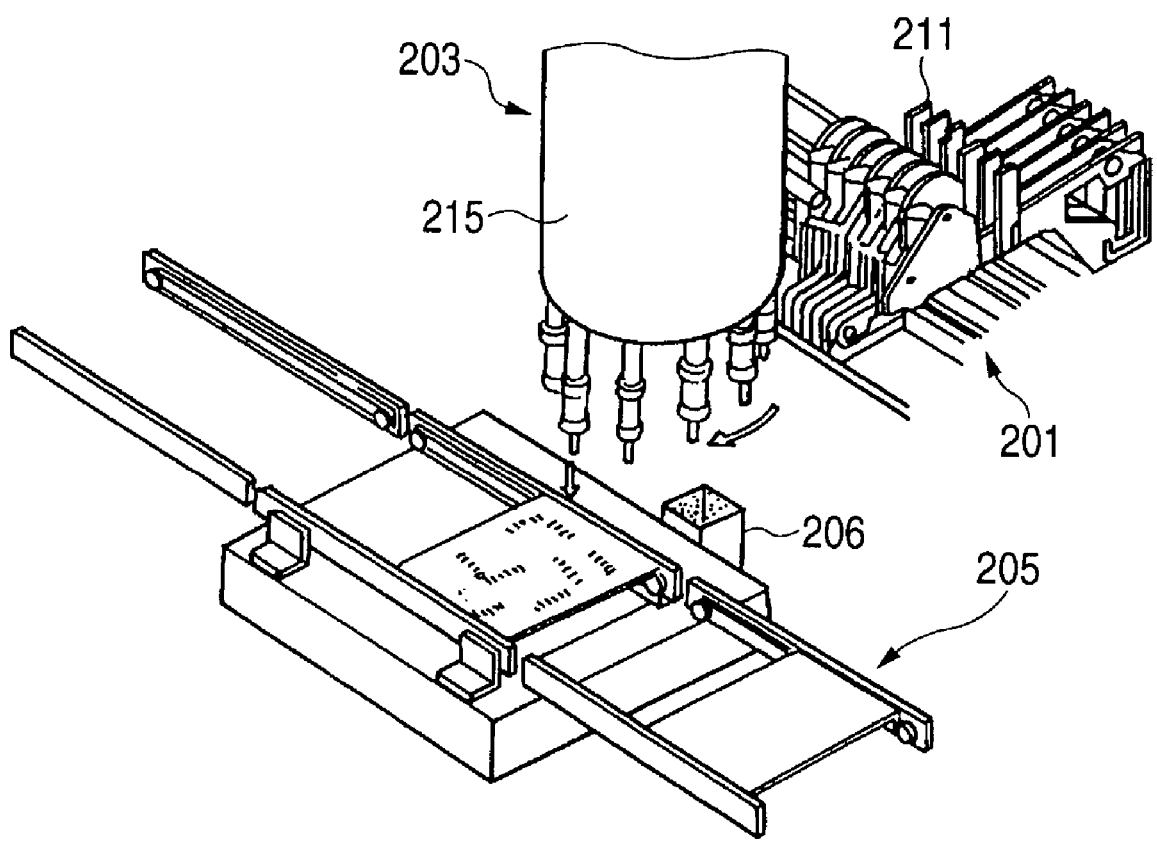
FIG. 17 is a view showing a schematic configuration of a parts fitting mechanism of the electronic parts mounting device shown in FIG. 16.

As shown in FIG. 17, in the parts supplying portion 201, a plurality of parts supplying units 211 in which a number of electronic parts are contained are aligned in the vertical direction to a surface of the sheet, and move in the direction perpendicular to the alignment to supply a desired electronic parts to a predetermined parts supplying position.

The X-Y table 205 is provided movably between the loader portion 207 and the unloader portion 209. The X-Y table 205 moves to a position, which is connected to a board carrying path of the loader portion 207, to receive the circuit board to which the parts is to be fitted, then fixes the circuit board, and then moves to a parts fitting position of the rotary head 203. At this time, the X-Y table 205 repeats the transfer of the circuit board in response to the fitting position of each electronic parts, then moves to a position, which is connected to the unloader portion 209, when the parts fitting is completed, and then sends out the circuit board to the unloader portion 209.

The rotary head 203 comprises a plurality of fitting heads 213 for sucking the electronic parts, a rotating frame body 215 rotated and driven to support the fitting heads 213 movably in the vertical direction by its peripheral surface, and an intermittently-rotated driving unit (not shown) for index-rotating/driving the rotating frame body 215.

The fitting heads 213 turn/move continuously from the parts supplying position of the parts supplying portion 201 to the parts fitting position on the opposite side according to the turn of the rotating frame body 215, then execute a downward operation at the parts supplying position of the parts supplying portion 201 to suck the electronic parts, then recognizes the suction attitude of the electronic parts at a certain parts recognizing position of the recognizing device 206, and then execute a downward operation at the parts fitting position of the rotary head 203 to fit the electronic parts onto the circuit board.

The parts recognition data preparing method of the above embodiments can also be applied to the electronic parts mounting device 200 having such rotary head, and the similar advantages can be achieved.

Also, the parts recognition data preparing method of the present invention is not limited to the parts recognition data preparation of the sucked parts in the electronic parts mounting device. For example, the parts recognition data preparing method of the present invention can be applied preferably to not only the parts data preparation for the inspection program preparation of the electronic parts soldering inspecting device but also various equipments that need the recognition of the electronic parts.

EXAMPLES

Next, steps of preparing the parts recognition data of the electronic parts 60 shown in FIG. 6 and the electronic parts 70 shown in FIG. 10 by using the programmed computer will be explained with reference to display screens of a monitor shown in FIG. 18 to FIG. 47 hereinafter.

First, steps of preparing the parts recognition data of the electronic parts 60 shown in FIG. 6 will be explained hereunder.

As shown in FIG. 18, in inputting steps of the body, body shape, body color, and body dimensions (horizontal, vertical) are input. Then, an external appearance of the body 62 is displayed on the right side of a screen based on input data.

Figure 19:
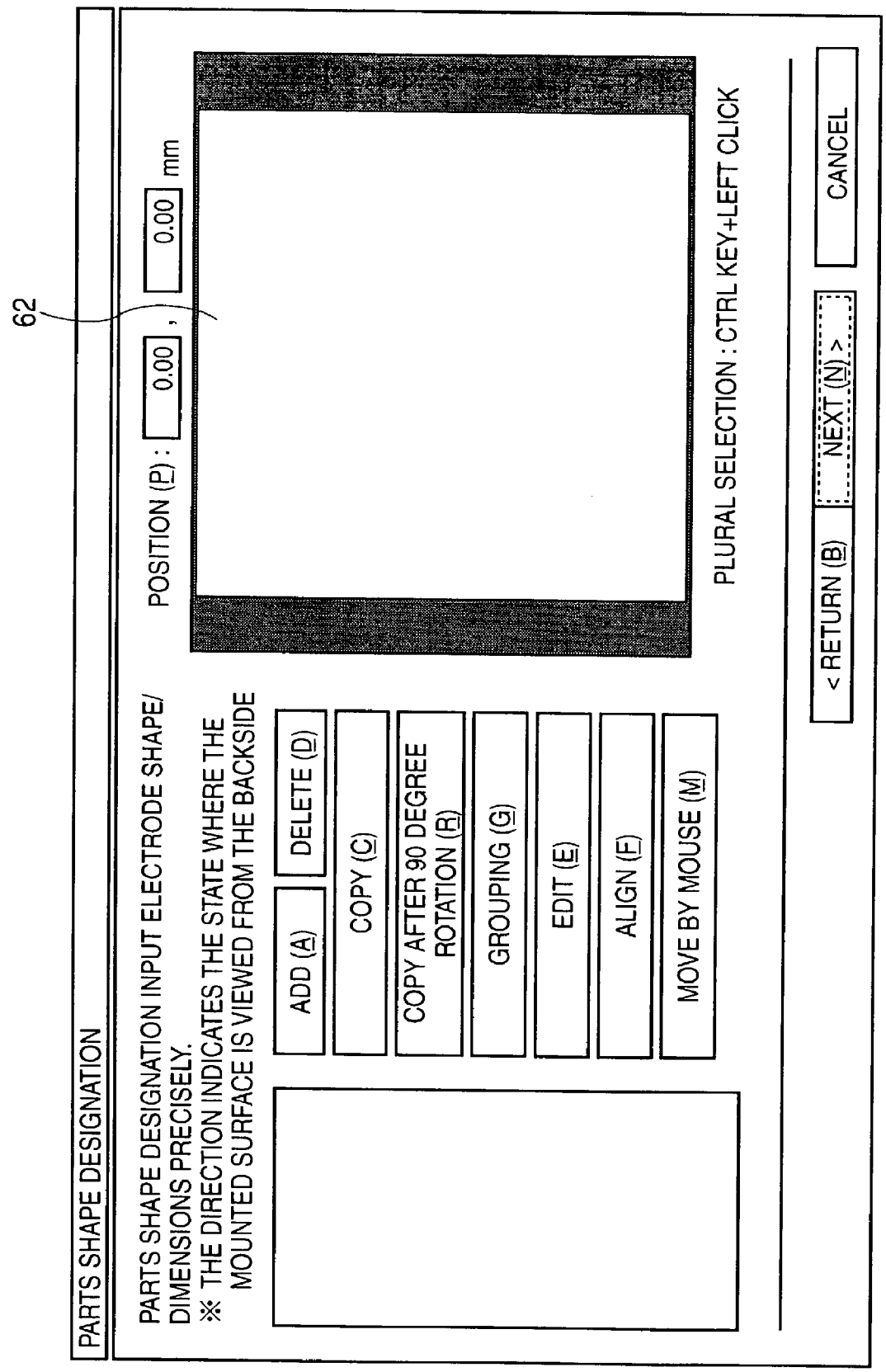
FIG. 19 is a view showing a display screen when an electrode is added in inputting steps of the electrode.
Figure 20:
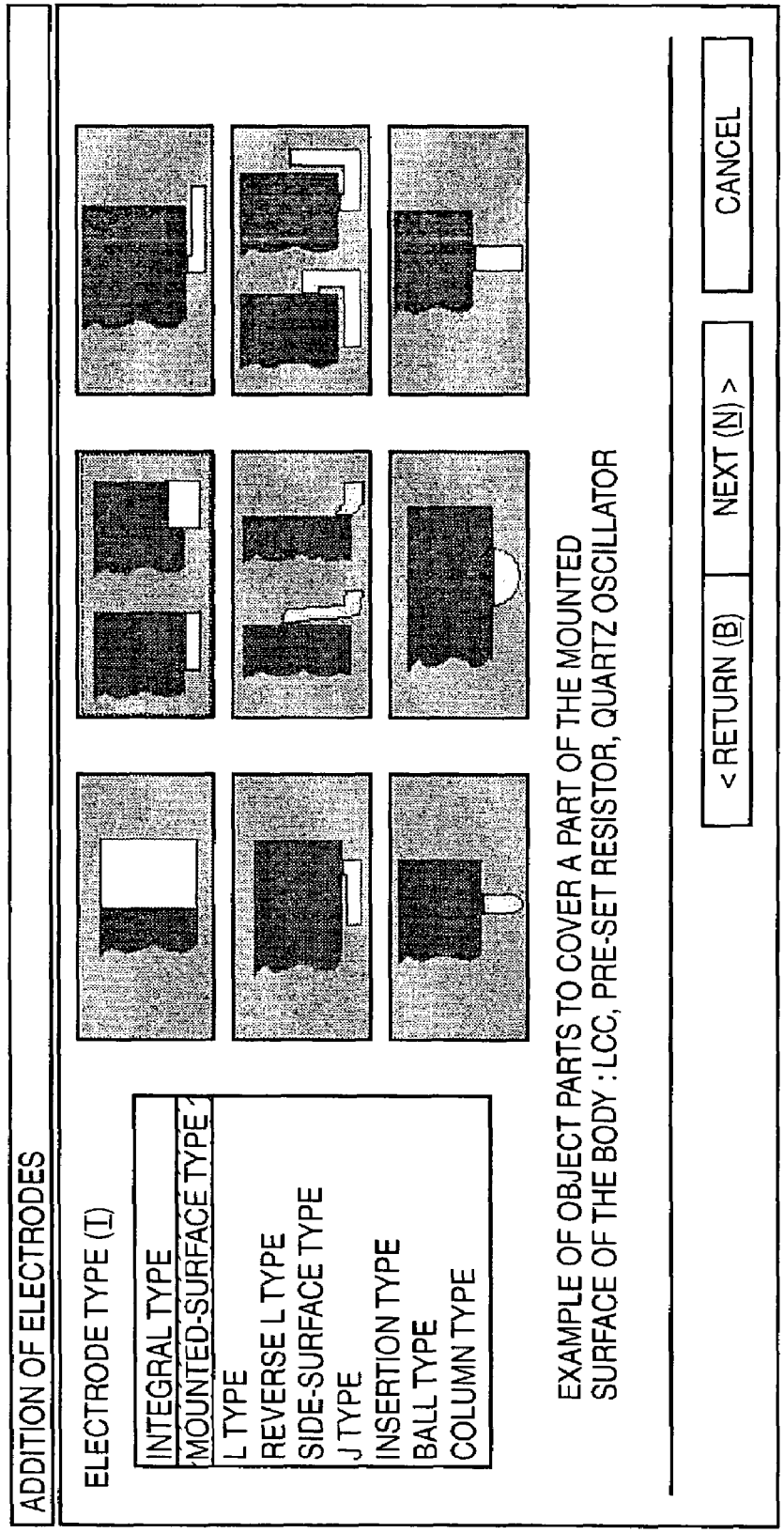
FIG. 20 is a view showing a display screen when nine electrode patterns are displayed in total.

Then, as shown in FIG. 19, the process goes to inputting steps of the electrode. First, an "add" button is clicked to add newly the electrode 64. Then, nine electrode patterns shown in FIG. 20 are displayed in total, where it is selected to which type the input electrode belongs. In the case of the electronic parts 60, "Mounted-surface type" is selected since the electrode is present on the mounted surface.

Figure 21:
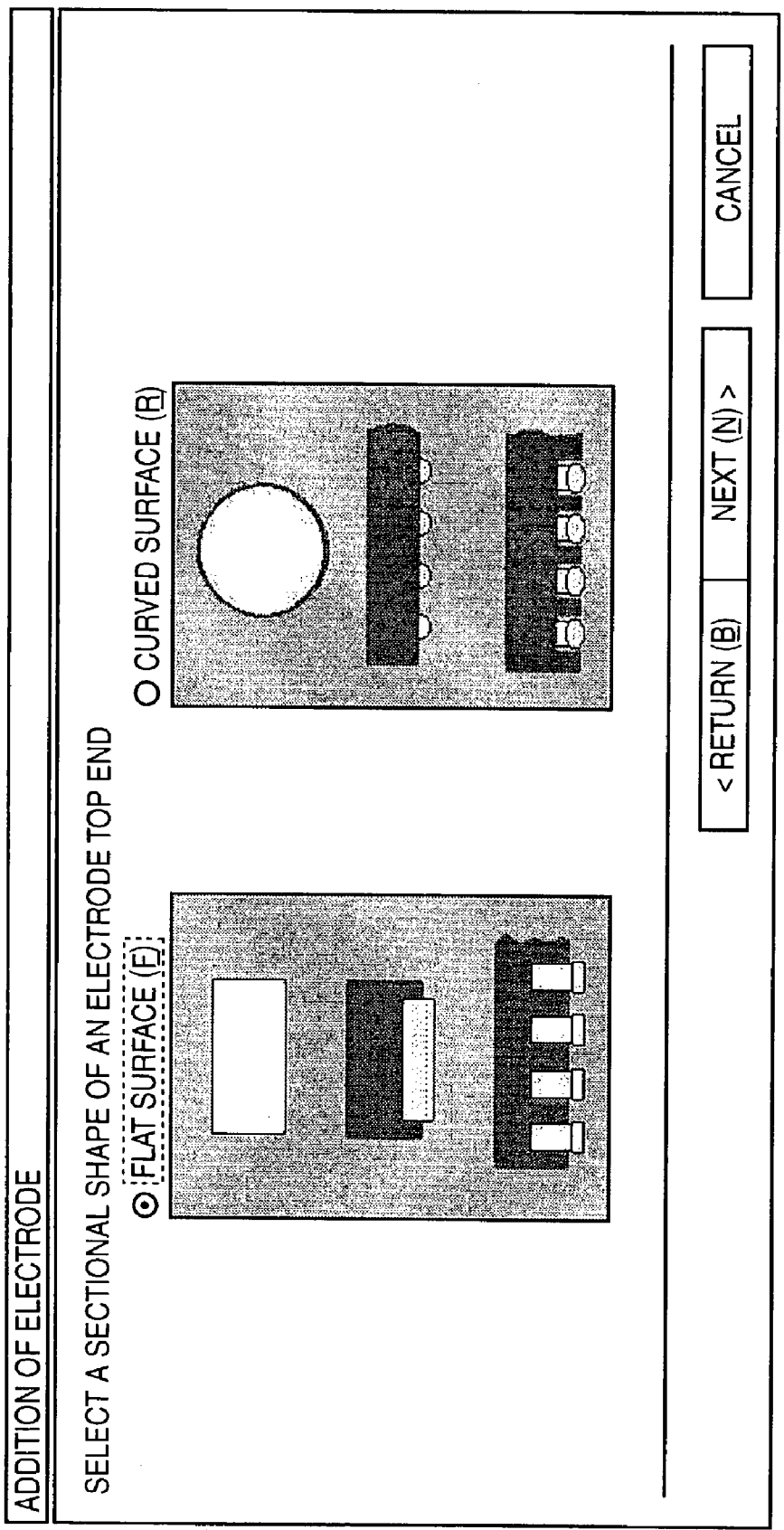
FIG. 21 is a view showing a display screen when a sectional shape of a top end of the electrode is input.

Then, as shown in FIG. 21, a sectional shape of the top end of the electrode is input. As the electrode shape, there are "Flat surface type" whose sectional shape is a rectangle and "Curved surface type" whose sectional shape is a circle. Here "Flat surface type" is selected.

Then, as shown in FIG. 22, electrode dimensions are input. Since the electrode has dimensions of horizontal 1.00 mm and vertical 1.20 mm, these numerical values are input. Here, only one addition and plural (horizontal alignment, vertical alignment, lattice alignment) addition can be selected as the addition of electrode. Therefore, because the electrode 64 and the electrode 65 have the same shape, "Plural electrodes (vertical alignment) added" is selected and then the electrode dimensions are input simultaneously.

Figure 23:
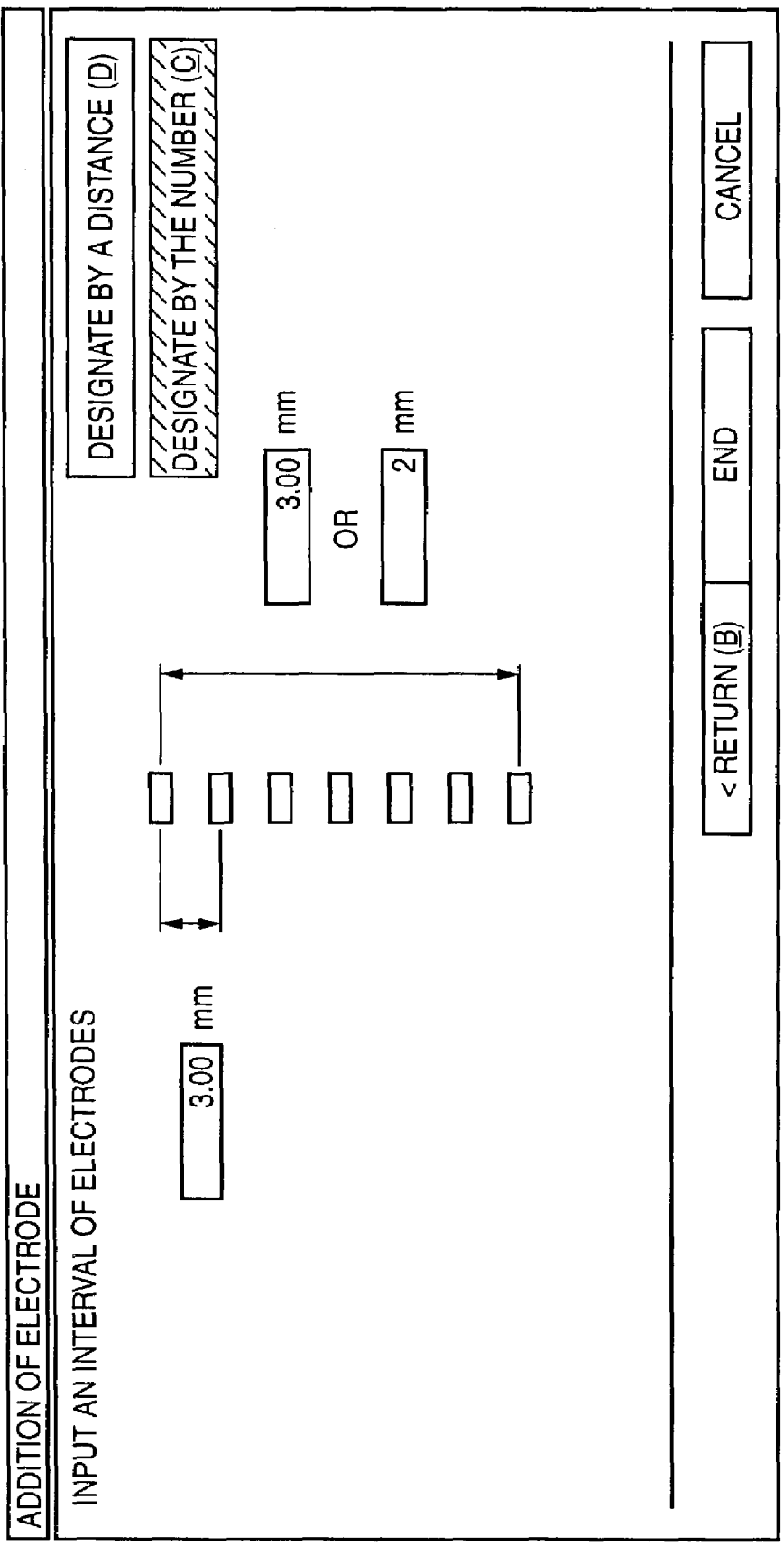
FIG. 23 is a view showing a display screen when an interval between the electrodes is input.
Figure 24:
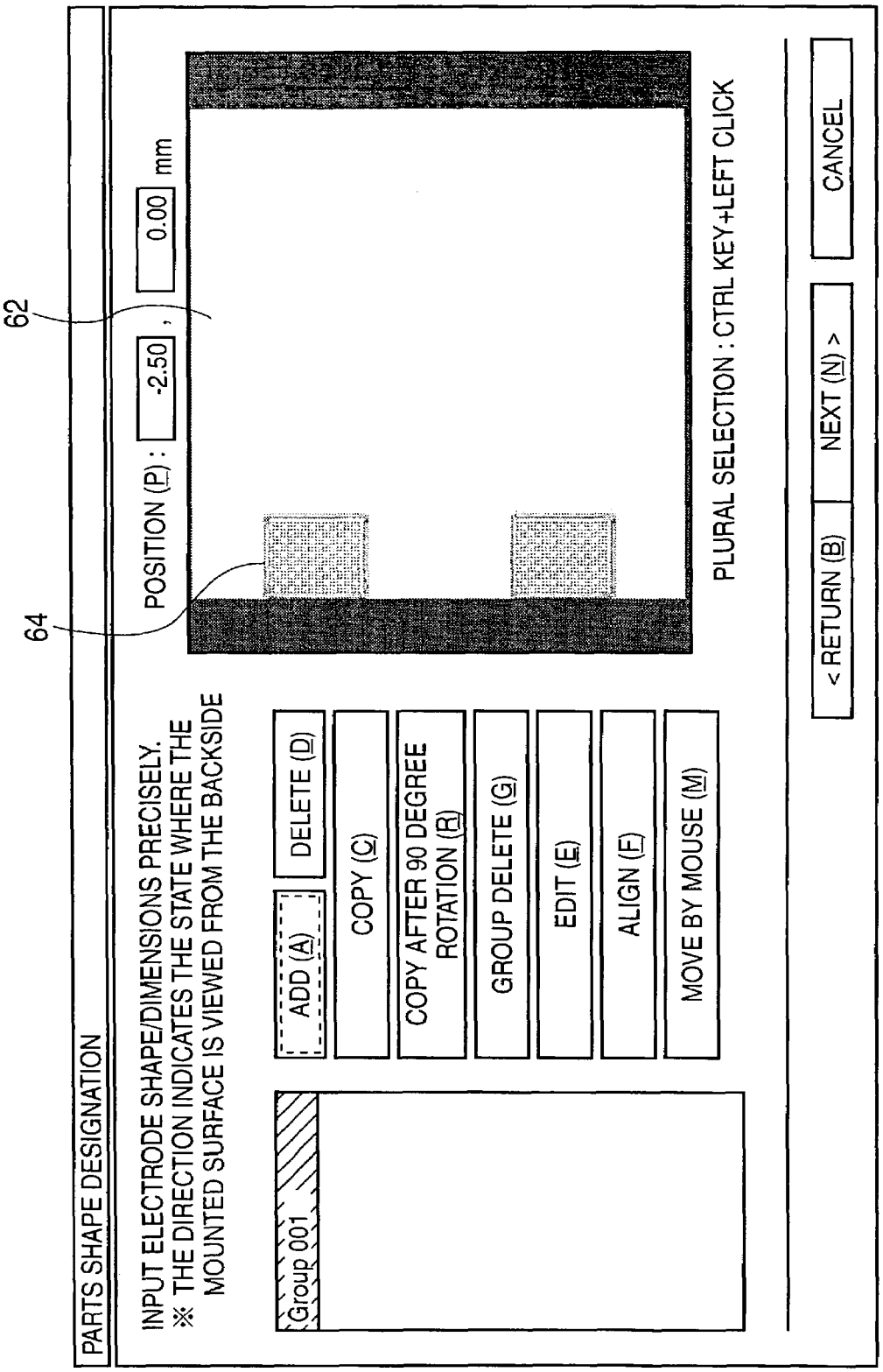
FIG. 24 is a view showing a behavior in which the input electrode is displayed.

Then, as shown in FIG. 23, a screen into which an interval between the electrodes is input is displayed. Here, any one of an alignment distance of electrodes and the number of electrodes, and a distance between the electrodes are input. In this case, 2 and 3.0 mm are input as the number of electrodes and the distance between the electrodes respectively. According to these input data, as shown in FIG. 24, two electrodes 64, 65 are displayed on the right side of the screen. Then, center positions of these two electrodes are set to X=−2.5 mm and Y=0 mm respectively, and the electrodes 64, 65 are registered as Group 001.

Figure 26:
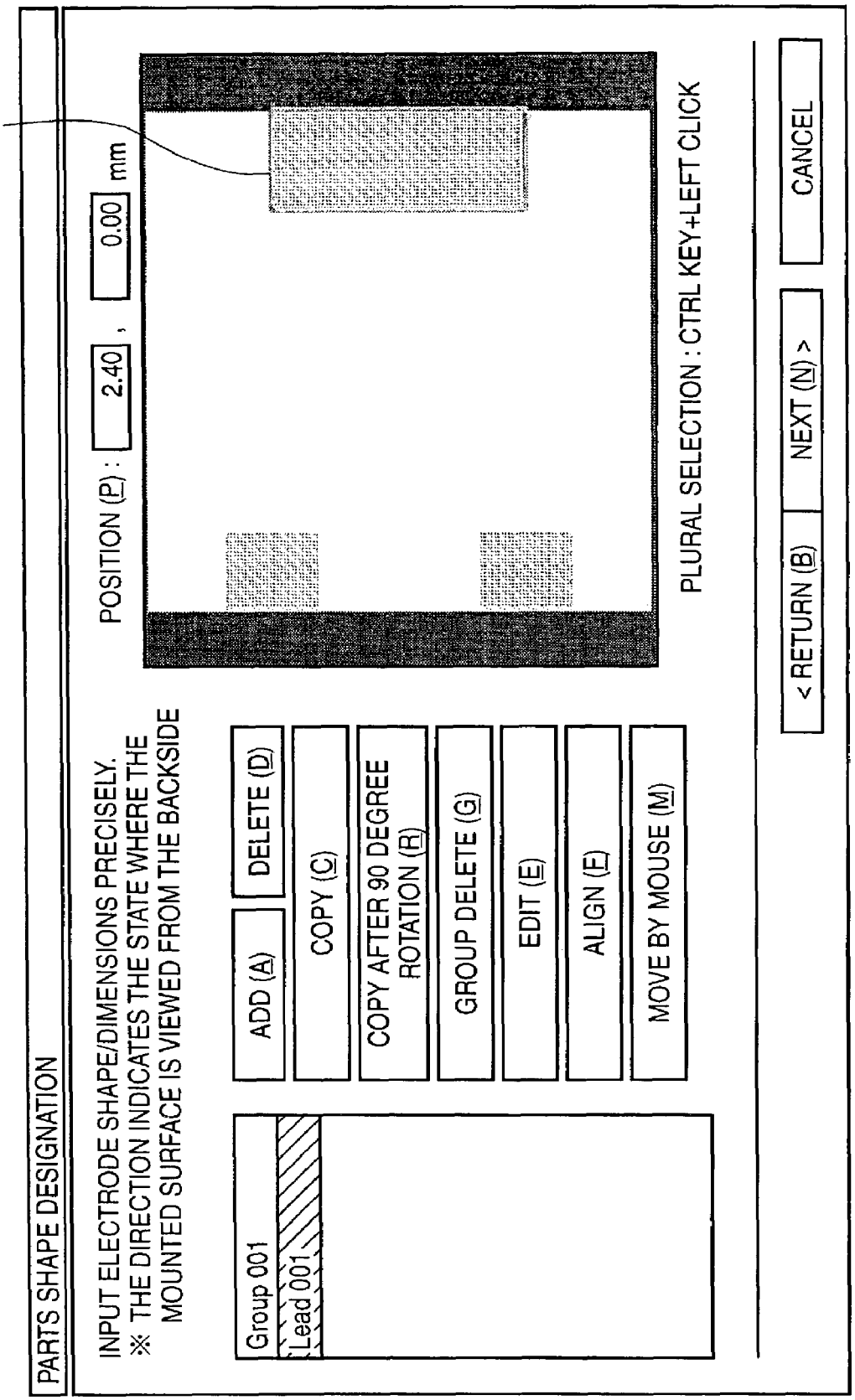
FIG. 26 is a view showing a behavior in which the added electrode is displayed.

Then, data inputting of the electrode 66 is executed by selecting "Add" shown in FIG. 24. As shown in FIG. 25, the electrode dimensions (horizontal, vertical) are input, and then "Only one electrode (single) added" is selected. Then, as shown in FIG. 26, the electrode 66 is newly displayed together with registered electrodes in Group 001. The positions of the displayed electrode 66 are set to X=2.4 mm, Y=0 mm, and the electrode 66 is registered as Lead 001.

As a result, as shown in FIG. 27, respective parts dimensions of the electronic parts 60 are automatically set and displayed. At this time, the processes in the grouping S2 and the unnecessary electrode exception S3 shown in FIG. 7 are carried out automatically.

Figure 28:
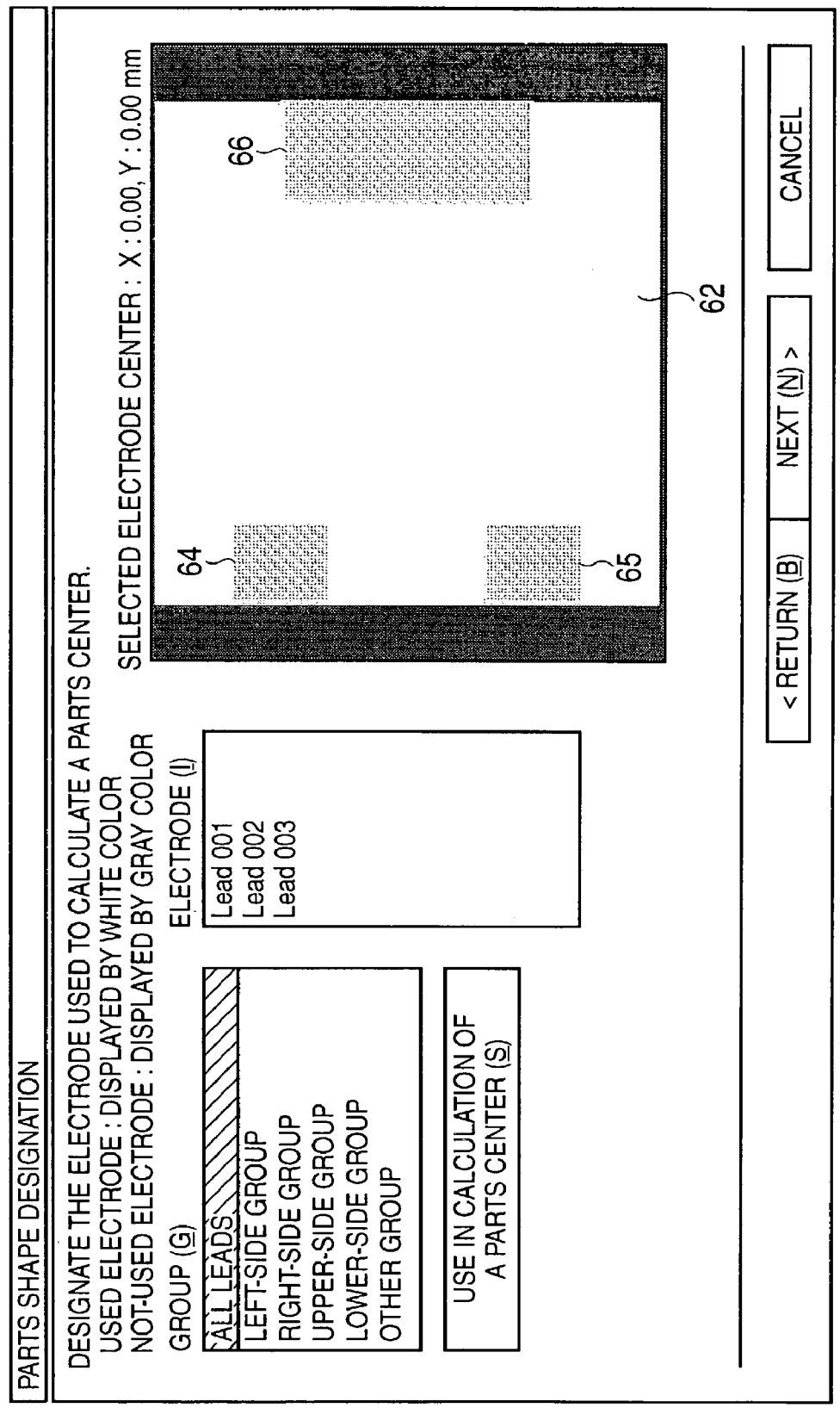
FIG. 28 is a view showing a behavior in which all leads are displayed.

Now, as shown in FIG. 28, if all leads of the electronic parts 60 are to be displayed, the electrodes 64, 65, 66 are displayed in the internal position of the body 62 as shown on the right side of the figure. On this screen, the electrodes used to calculate the part center, i.e., the electrodes used in the parts recognition can be designated. In the case of this parts, since all electrodes 64, 65, 66 are used to recognize, all electrodes 64, 65, 66 are encircled by a white frame and displayed.

Figure 29:
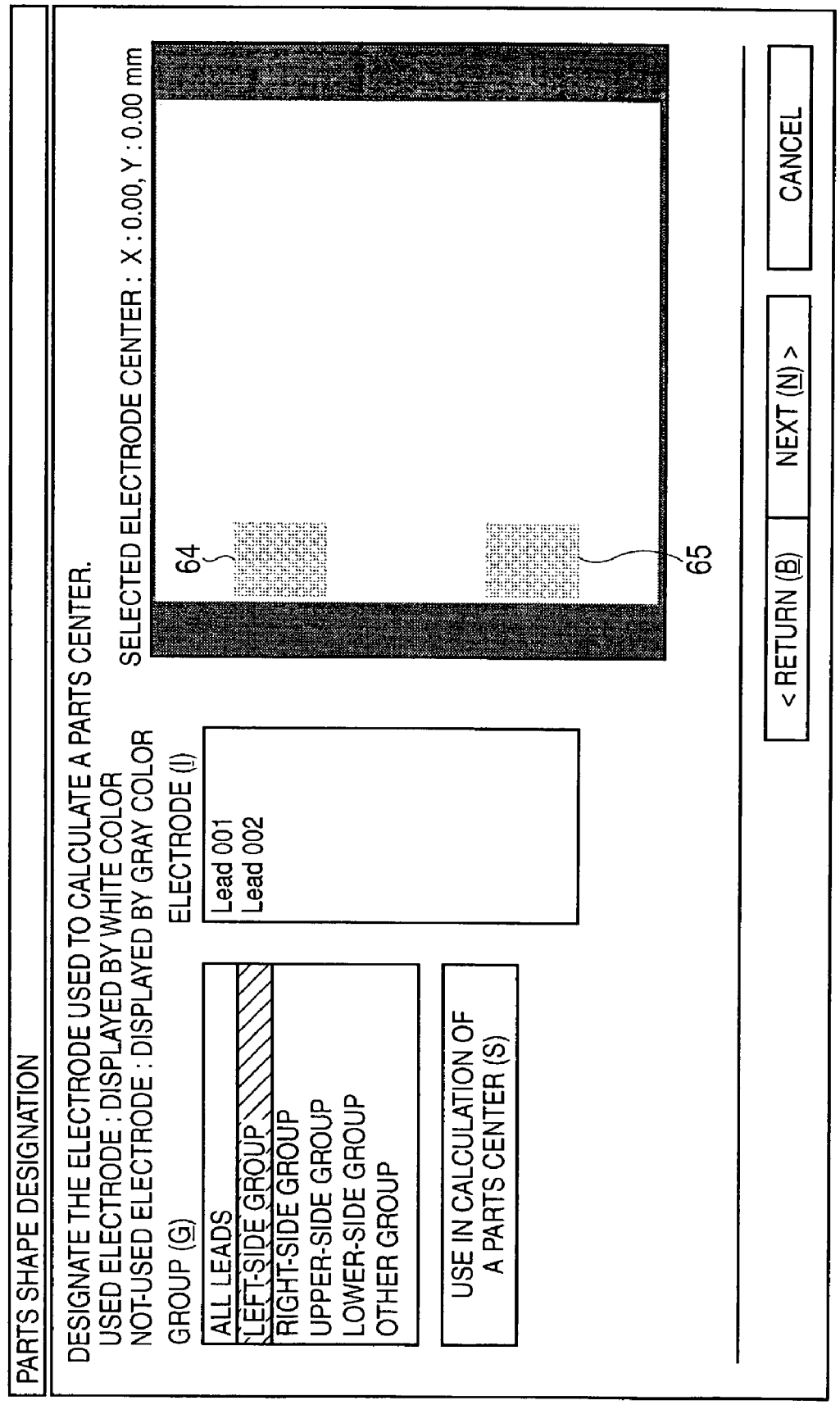
FIG. 29 is a view showing a behavior in which the electrodes in a left-side group are displayed.

Also, as shown in FIG. 29, if a left-side group is to be displayed, the electrodes 64, 65 are displayed, which indicates that the electrodes 64, 65 are contained in the left-side group.

Figure 31:
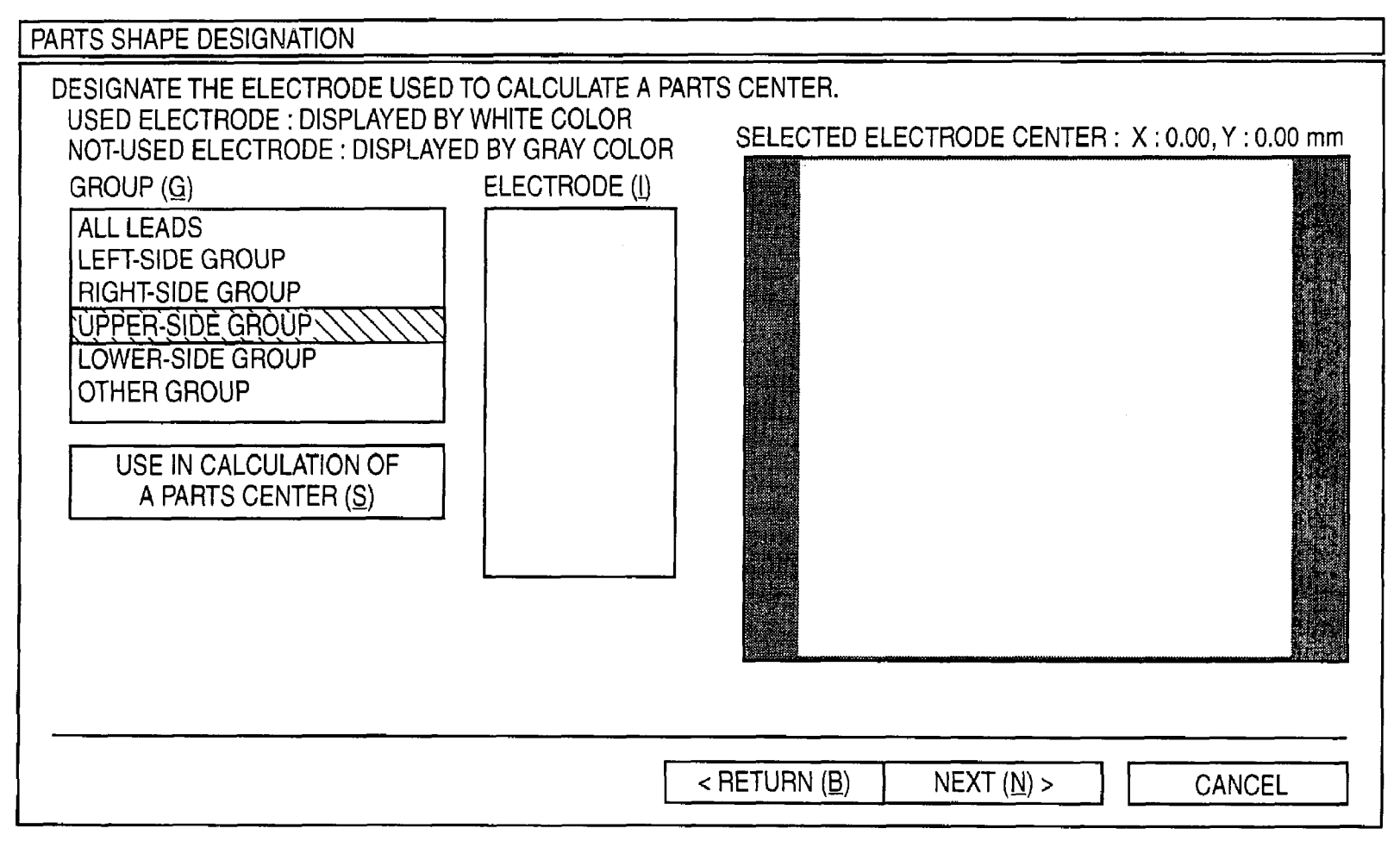

Similarly, as shown in FIG. 30, if a right-side group is to be displayed, the electrode 66 is displayed. As shown in FIG. 31 and FIG. 32, if upper-side and lower-side groups are to be displayed, no electrode is contained in these groups. Thus, no electrode is displayed on the screen.

Figure 33:
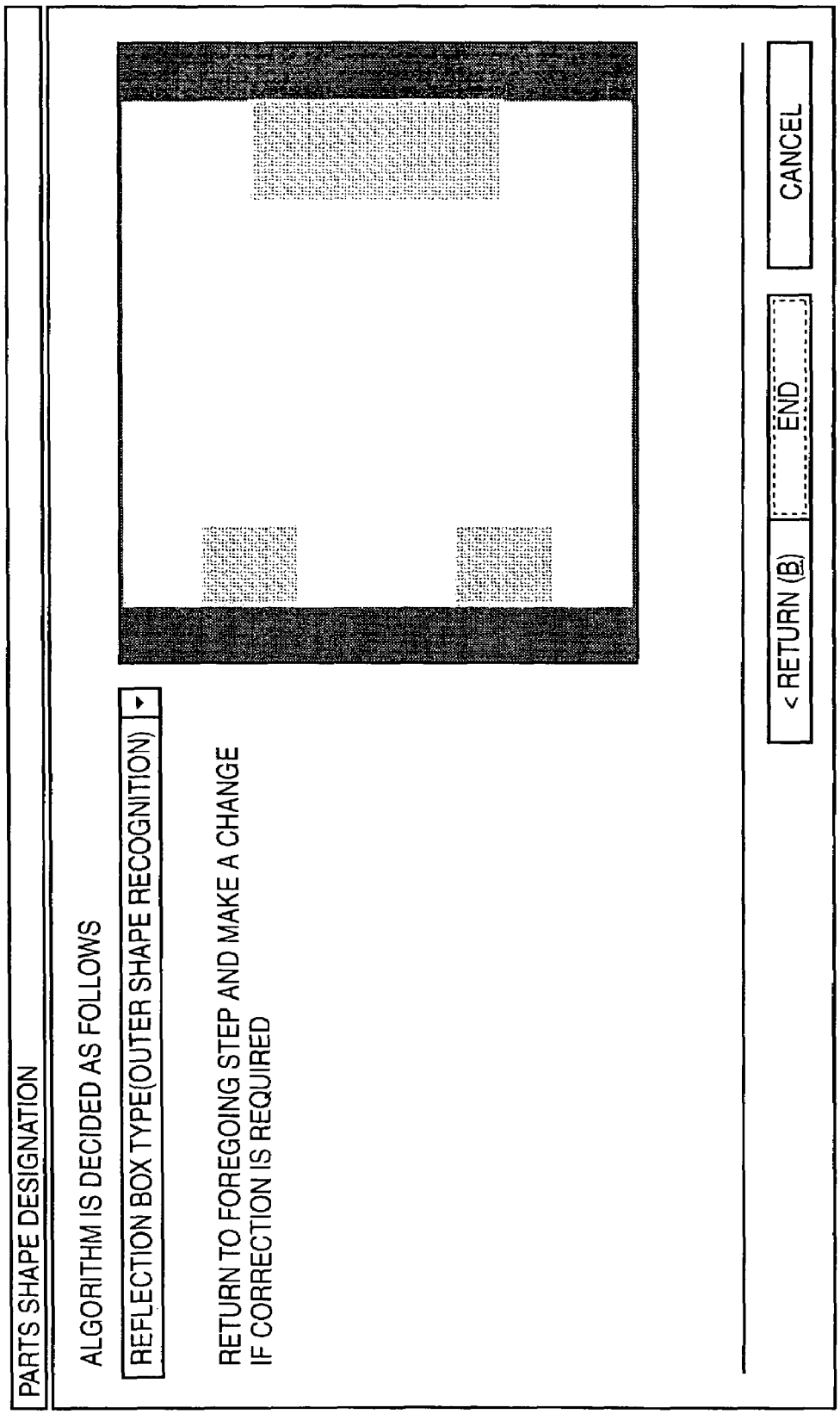
FIG. 33 is a view showing a behavior in which a name of a recognition algorithm is displayed when the recognition algorithm is automatically decided.

Then, as shown in FIG. 33, decision of the recognition algorithm (S4) is automatically executed, and the decided recognition algorithm is displayed. In this case, the box-type (above algorithm A1) recognition algorithm is set.

Then, the extraction of the parts shape data (S5) is executed, and then the setting of the optical conditions (S6) is executed. As shown in FIG. 34, the large visual-field camera out of the large visual-field camera and the small visual-field camera is set as the two-dimensional sensor provided to the electronic parts mounting device 100. The type of the camera is selected automatically according to the size of the electronic parts 60.

Then, illumination conditions are set. As the illumination, three types of illuminations, i.e., upper-stage illumination, middle-stage illumination, lower-stage illumination can be set individually.

Figure 35:
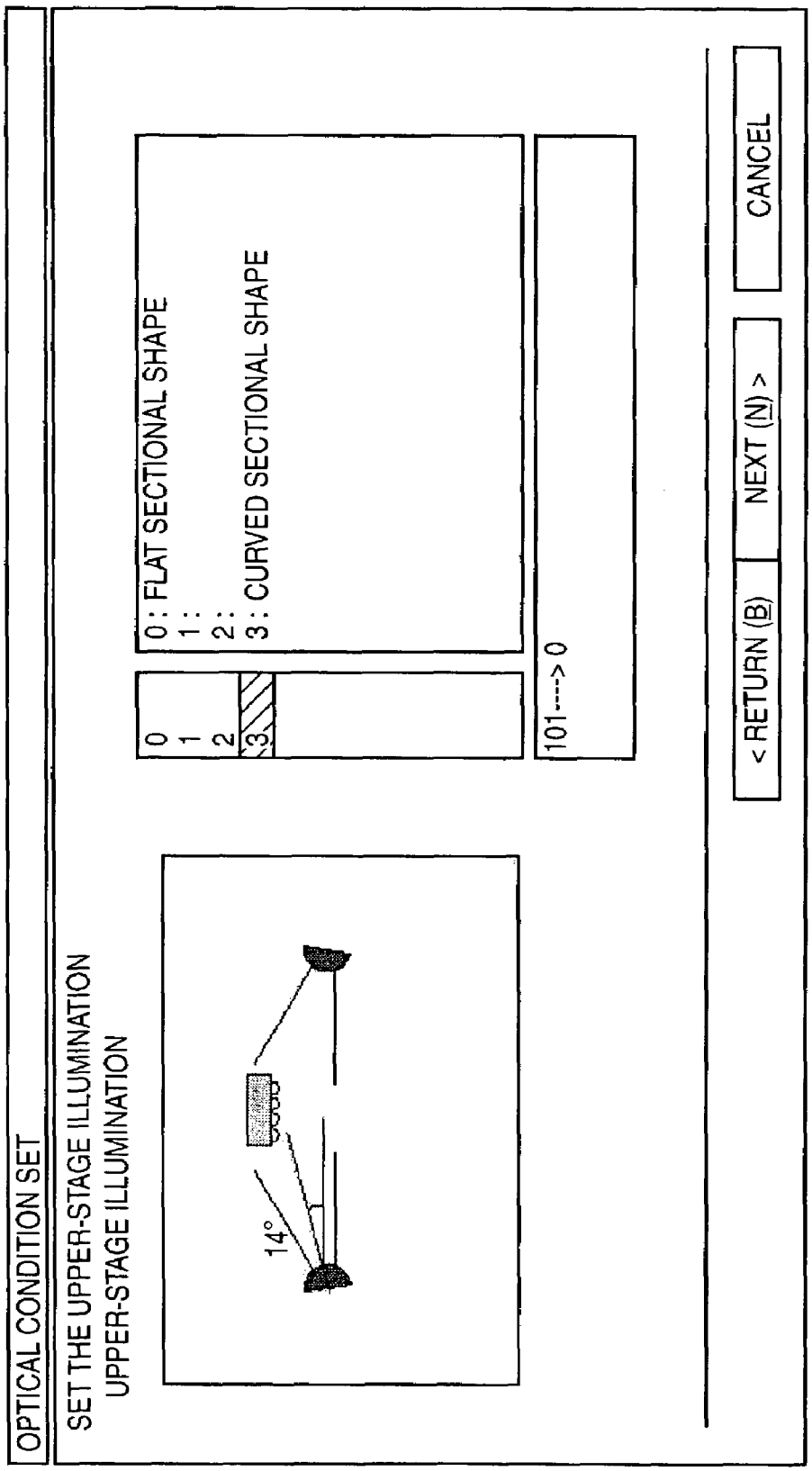
FIG. 35 is a view showing a set screen of an upper-stage illumination.

First, a set screen of the upper-stage illumination is shown in FIG. 35. The upper-stage illumination signifies that the illumination light is irradiated to the mounted surface of the electronic parts at a shallow illumination angle in the substantially lateral direction. Here, the illumination light is irradiated from the position that has the illumination angle of about 14°. Also, a quantity of light can be changed up to four stages from 0 to 3. In this case, if the illuminated object such as "the case where its sectional shape is flat", "the case where its sectional shape is curved", etc., to which the upper-stage illumination should be applied preferably, is displayed together every stage and also the illumination angle is illustrated to explain, not only the operator can understood clearly the meaning of the input contents but also setting of a quantity of light can be carried out simply without the heuristics. Thus, generation of the input error and the false data input can be prevented as much as possible.

Figure 36:
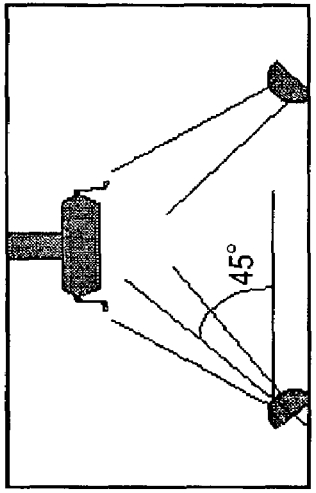
FIG. 36 is a view showing a set screen of a middle-stage illumination.

Also, FIG. 36 shows a set screen of the middle-stage illumination. The middle-stage illumination irradiates the illumination light to the mounted surface of the electronic parts at the irradiation angle that has an intermediate angle between the upper-stage illumination and the lower-stage illumination. Here, the illumination light is irradiated from the position that has the illumination angle of about 45°. A quantity of light can be changed up to eight stages from 0 to 7. For example, when a quantity of light to be set is not clear, it can be pointed out clearly by displaying "Designate 4 normally", or the like to which level the quantity of light should be set, or the like. In the particular case, it can be indicated by displaying "Set to 0 if the type is 105", or the like that the quantity of light should be set to the particular stage. As a result, the operator is never worried about the input contents, and the smooth inputting can be achieved.

Figure 37:
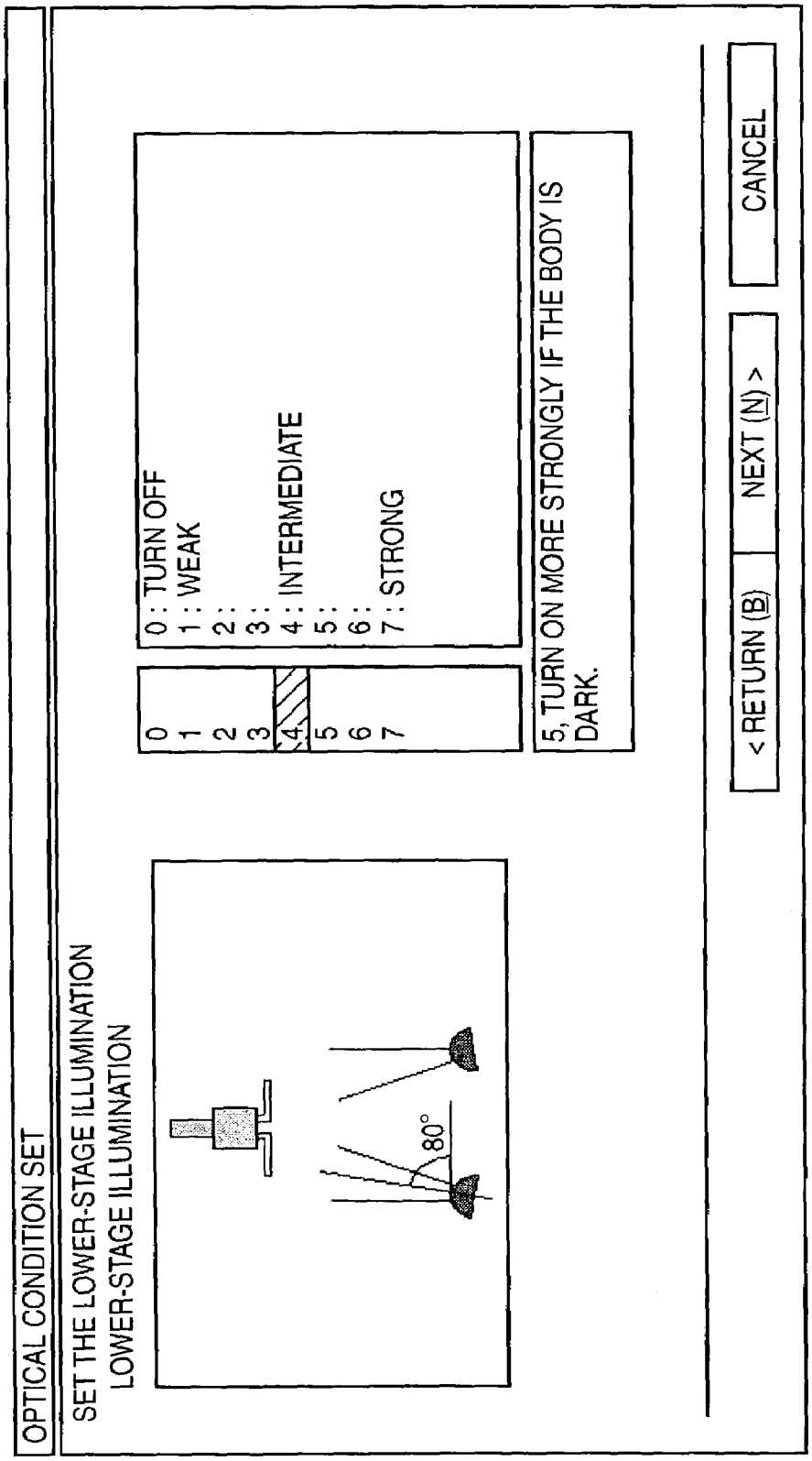
FIG. 37 is a view showing a set screen of a lower-stage illumination.

In addition, FIG. 37 shows a set screen of the lower-stage illumination. The lower-stage illumination irradiates the illumination light to the mounted surface of the electronic parts in the substantially vertical direction. Here, the illumination light is irradiated from the position that has the illumination angle of about 80°. When the set quantity of light is not appropriate, it can be pointed out clearly by displaying "Turn ON more strongly if the body is dark", or the like how such trouble should be dealt with. As a result, the guide to the correction can be indicated to the operator, and thus the good condition can be set quickly.

Figure 38:
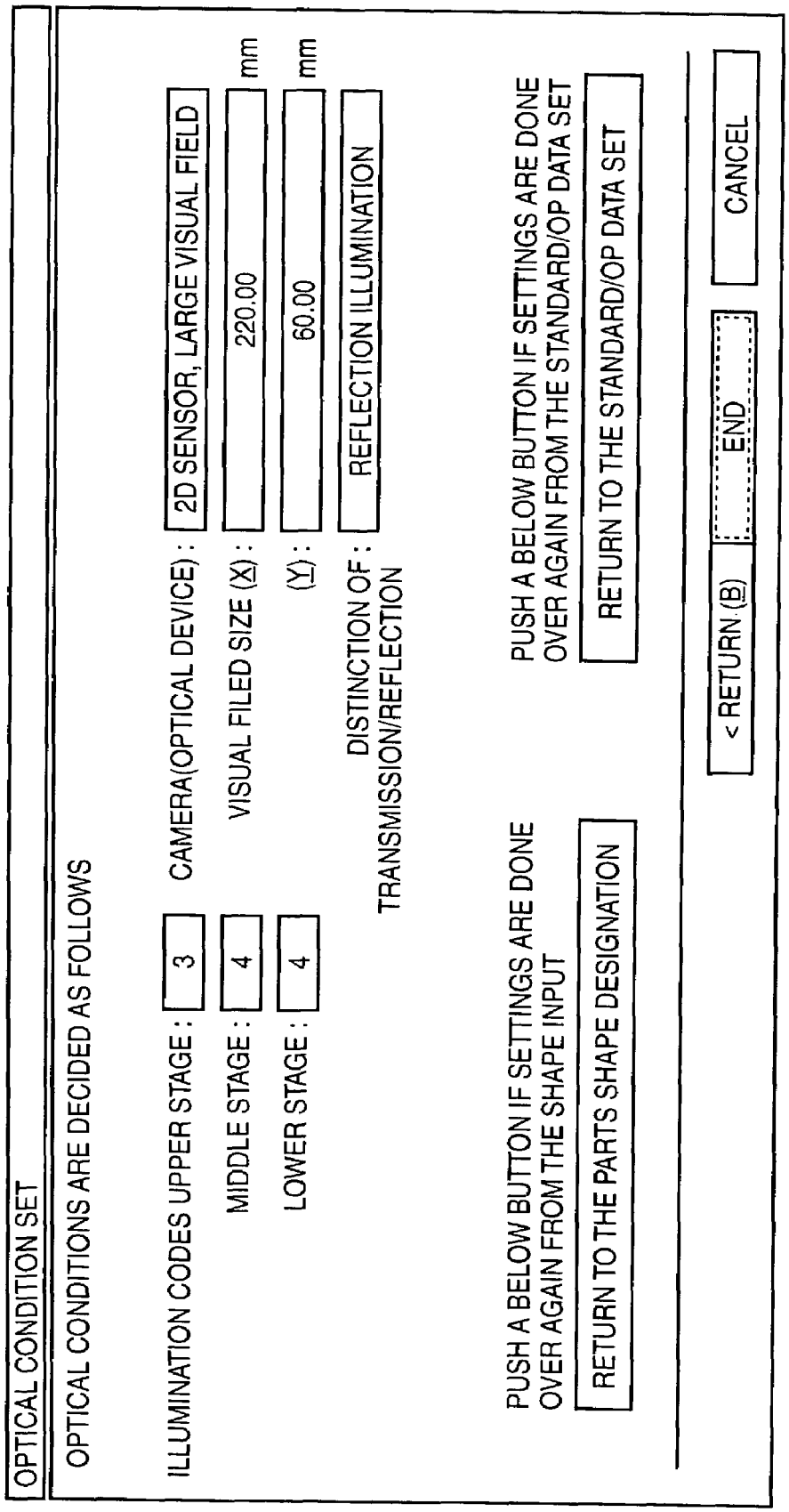
FIG. 38 is a view showing a display screen via which optical conditions are to be checked.

If the above optical conditions are set, a display screen shown in FIG. 38, via which the optical conditions are to be checked, is displayed. If the set contents are to be changed, the inputting operation can be done over again by retuning to the above-mentioned set screen appropriately. If the set contents that have been input are acceptable, the inputting operation is ended by clicking "End".

According to above setting operations, the preparation of the parts recognition data is completed. If the parts recognition data are prepared by the inputting method, a time required for the preparation can be reduced considerably and also a burden of the operator can be reduced, and in addition the data inputting can be executed smoothly not to hesitate the inputting.

Next, steps of preparing the parts recognition data of the electronic parts 70 shown in FIG. 10 will be explained hereunder. Here, explanation will be made while omitting the same set screens as those in preparing steps of the parts recognition data about the above electronic parts 60.

Figure 39:
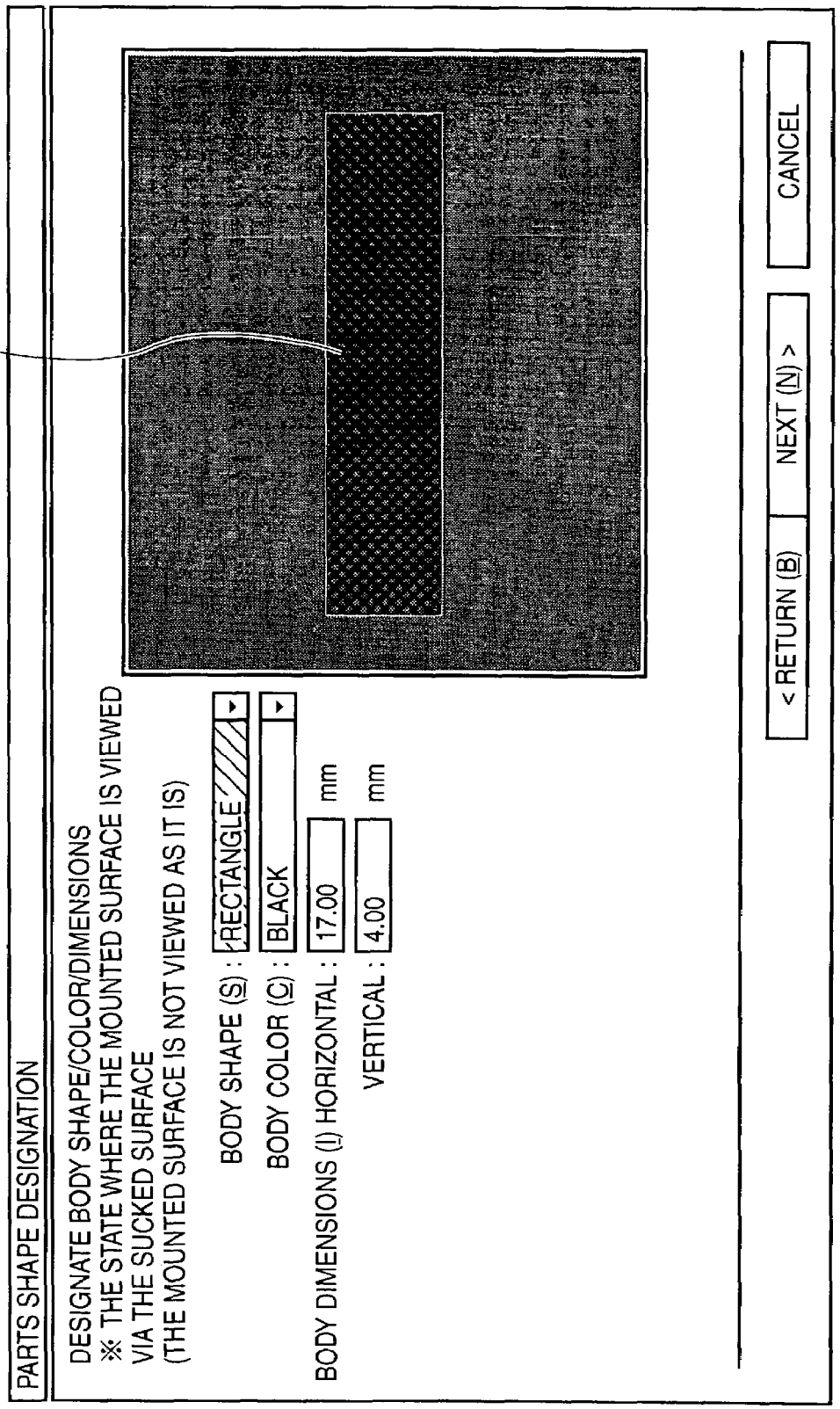
FIG. 39 is a view showing a display screen when the body shape, the body color, and body dimensions (horizontal, vertical) are input in inputting steps of the body.

First, as shown in FIG. 39, in inputting steps of the body, when the body shape, the body color, and body dimensions (horizontal, vertical) are input, an external appearance of the body 71 is displayed on the right side of the screen based on the input data.

Figure 40:
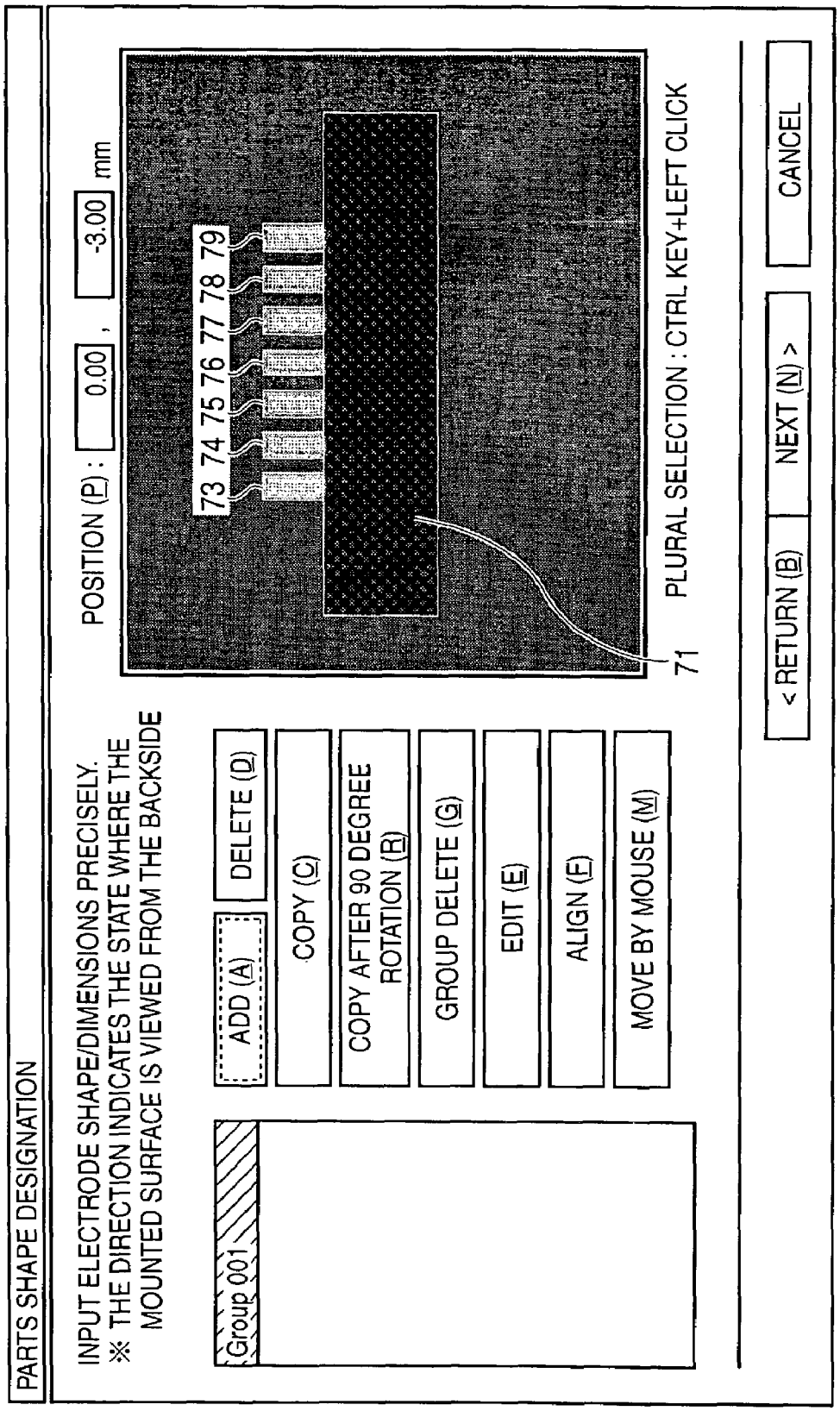
FIG. 40 is a view showing a display screen when electrodes are input in inputting steps of the electrode.
Figure 41:
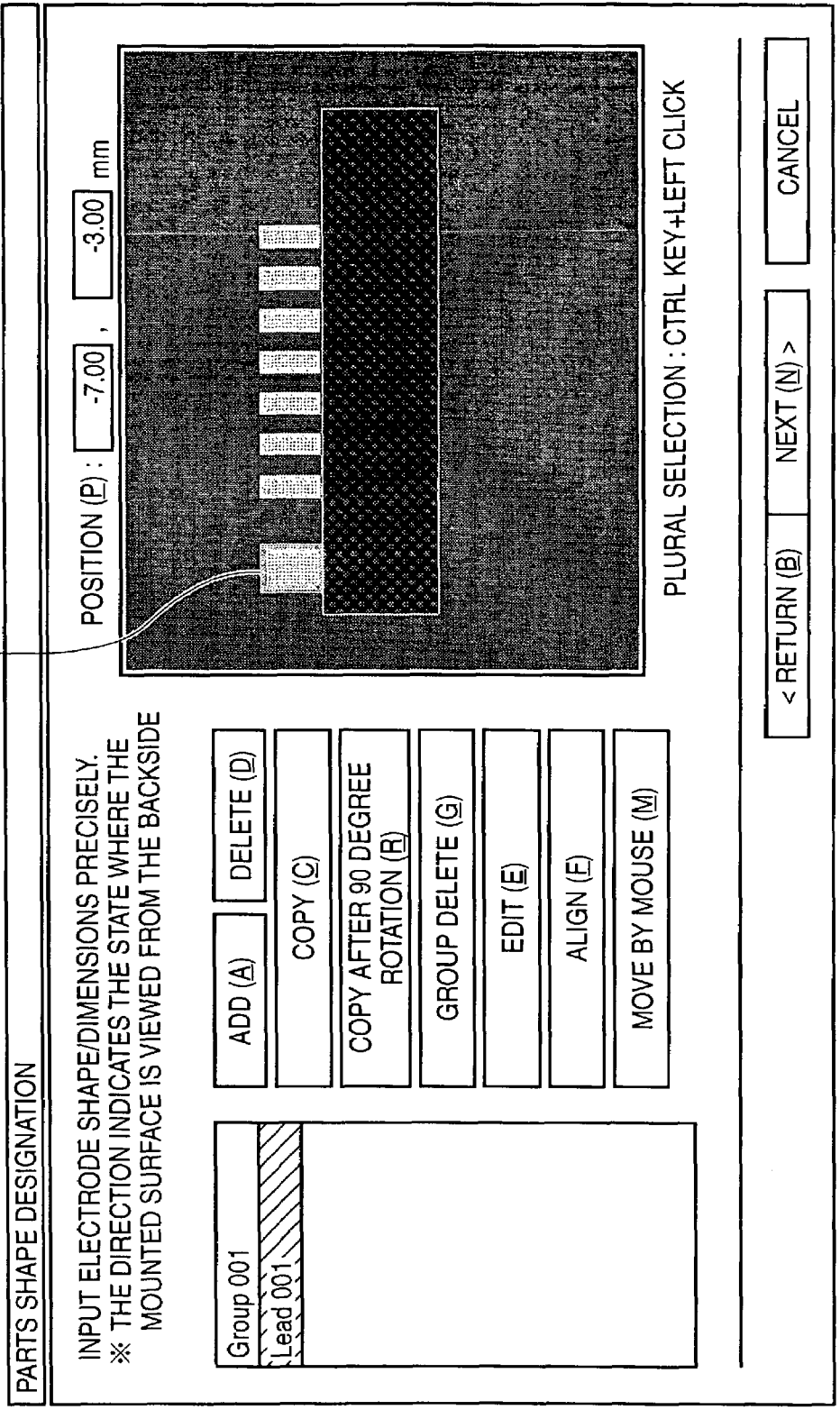
FIG. 41 is a view showing a behavior in which the electrode is added.
Figure 42:
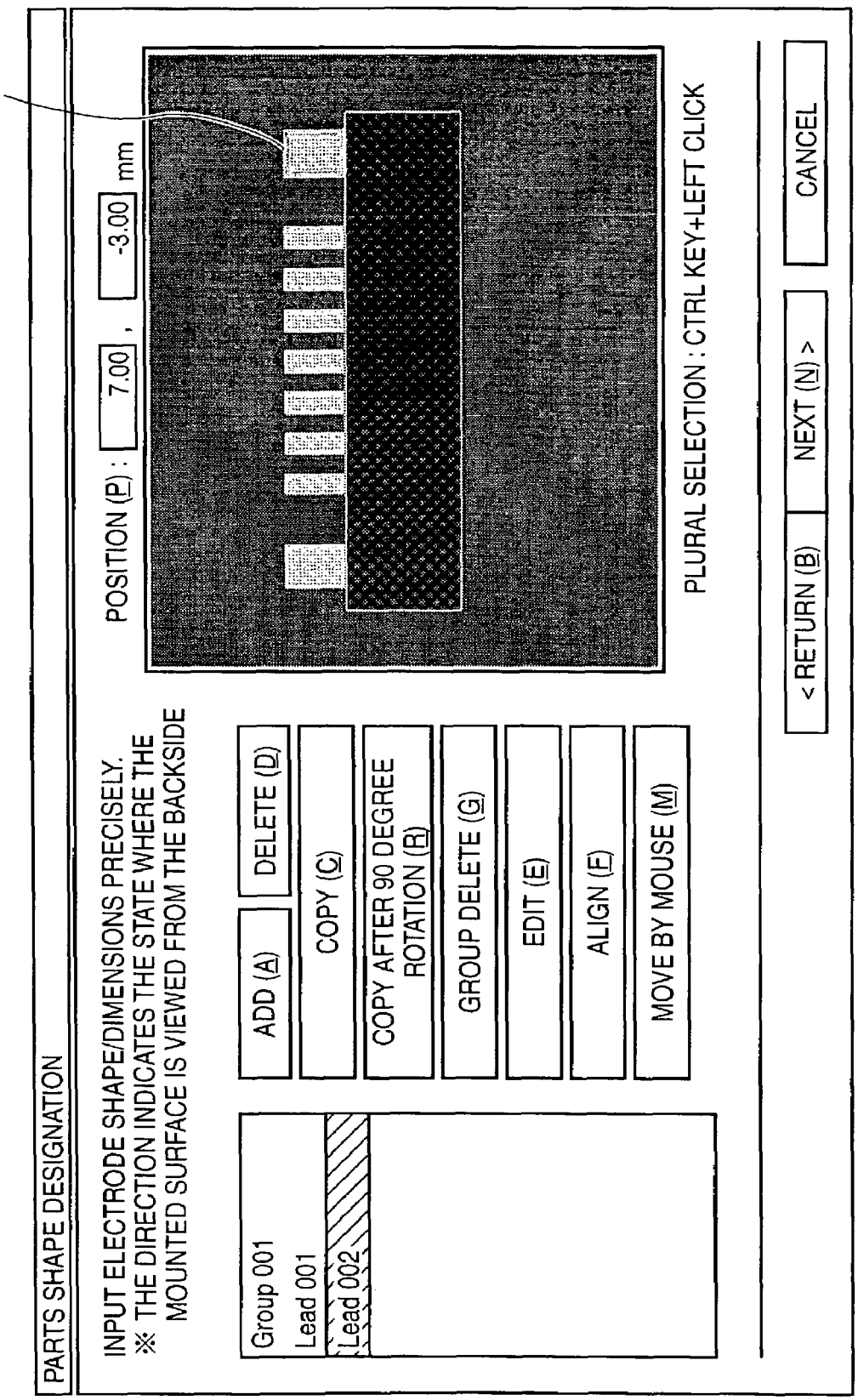
FIG. 42 is a view showing a behavior in which other electrode is added.

Then, the process goes to inputting steps of the electrode, and positions of the electrodes 73 to 79 are input together. The result is shown in FIG. 40. Then, as shown in FIG. 41, the electrode 71 is added. Then, as shown in FIG. 42, the electrode 80 is input in addition.

Figure 43:
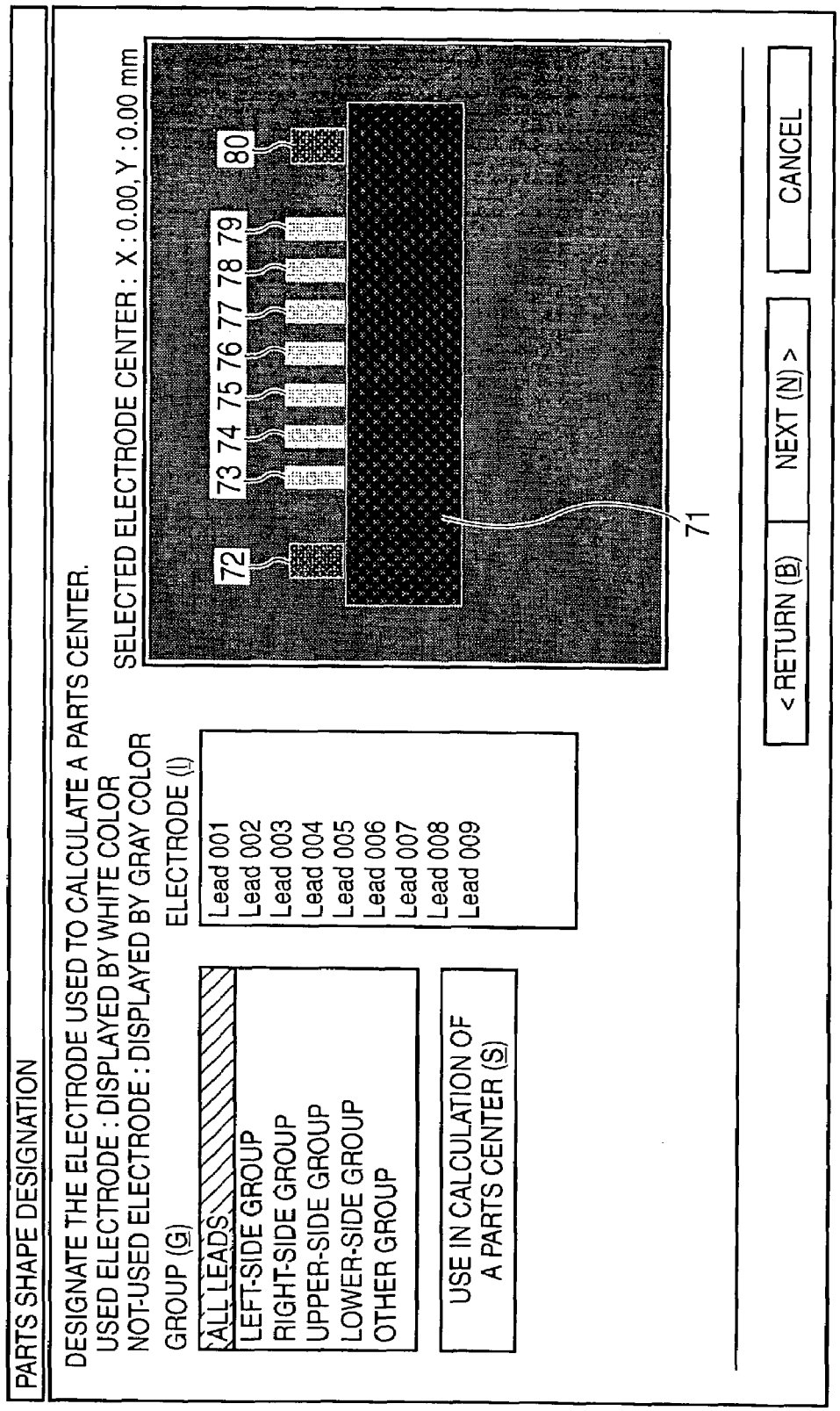
FIG. 43 is a view showing a behavior in which all leads are displayed.
Figure 44:
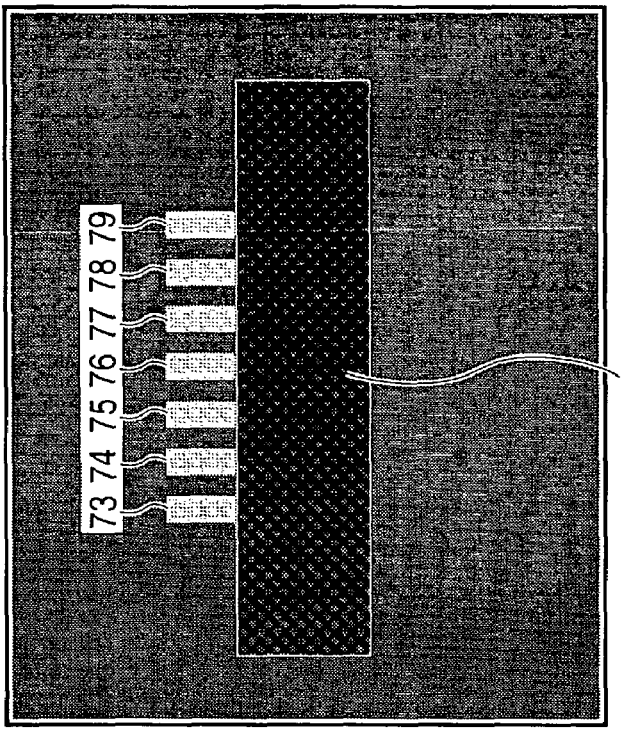
FIG. 44 is a view showing a behavior in which electrodes in the upper-side group are displayed.

After the above inputting steps are completed, the result shown in FIG. 43 is obtained if all leads are displayed. In other words, the electrodes 72, 73 to 79, 80 that are aligned on the upper side of the body 71 are displayed. Here the electrodes 72, 80 are set as the electrode not used in the parts recognition and are grouped. Then, as shown in FIG. 44, the electrodes 72, 80 are deleted and only the electrodes 73 to 79 still remain in the upper-side group.

When the inputting of the electrodes is completed, the parts shape data such as parts dimensions, outer diameter of the lead, number of leads, and electrode dimensions are set automatically, as shown in FIG. 45.

Figure 46:
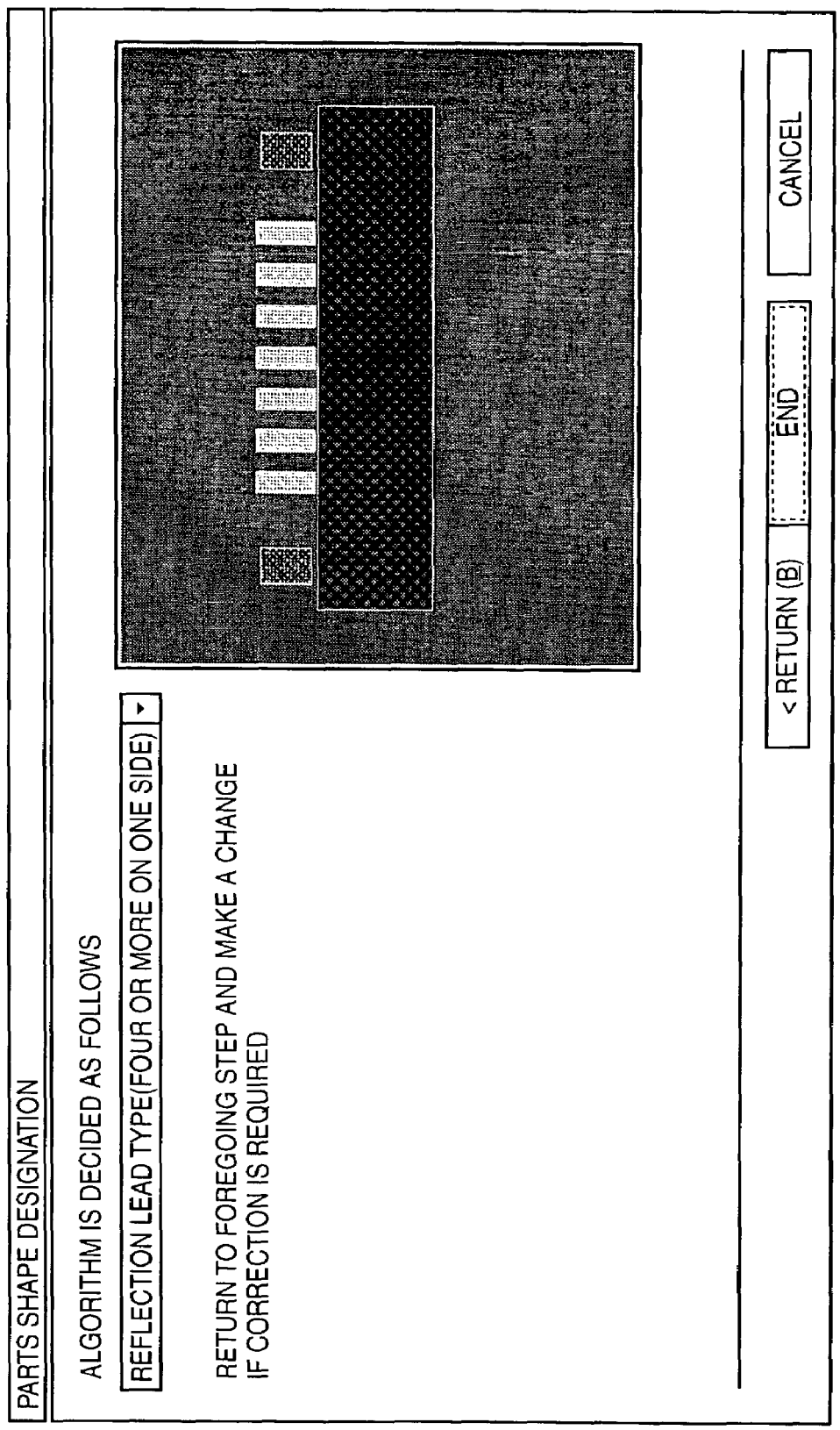
FIG. 46 is a view showing a behavior in which the name of the recognition algorithm is displayed when the recognition algorithm is automatically decided.

Then, as shown in FIG. 46, the recognition algorithm that is fitted to this electronic parts 70 is set as "Lead type" based on the input parts shape data.

Figure 47:
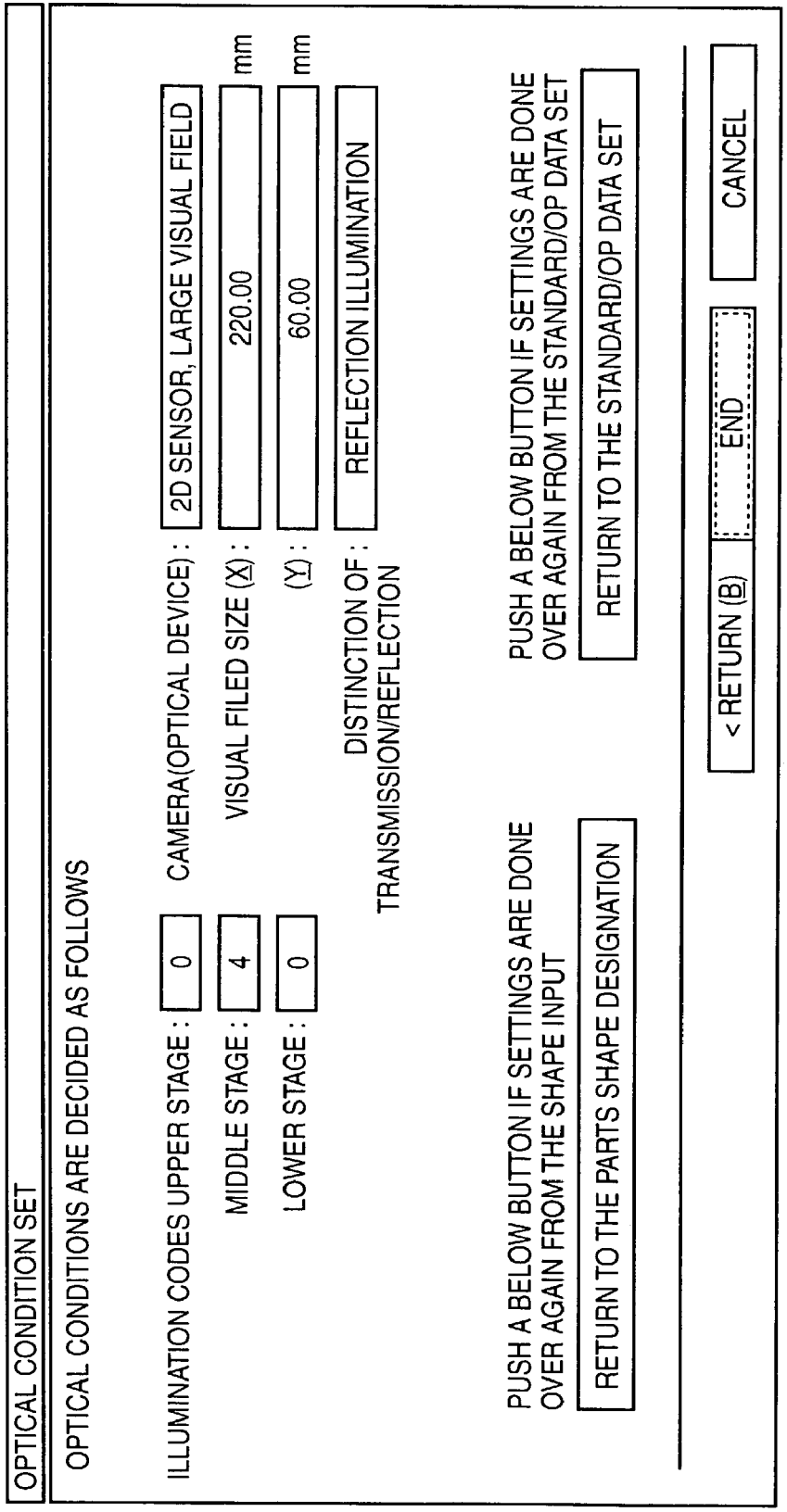
FIG. 47 is a view showing a display screen via which optical conditions are to be checked.
Figure 48:
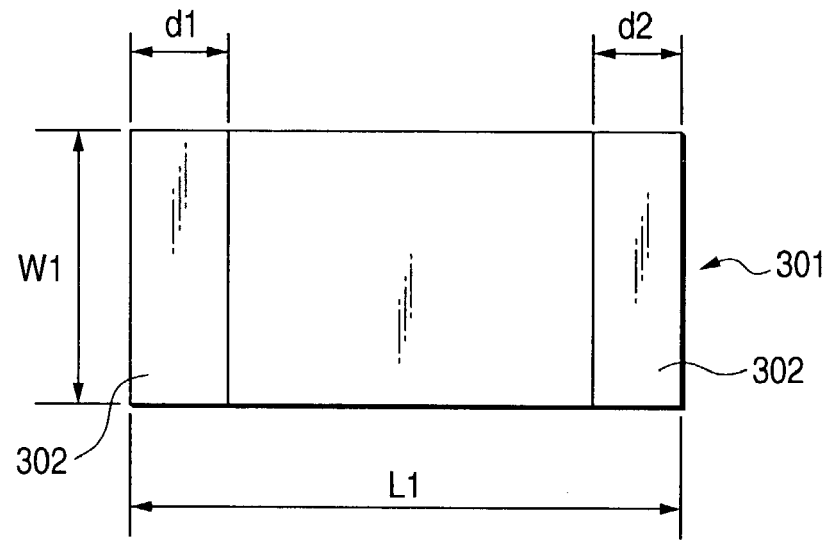
FIG. 48 is a view showing an external appearance of a square-shaped chip parts.
Figure 49:
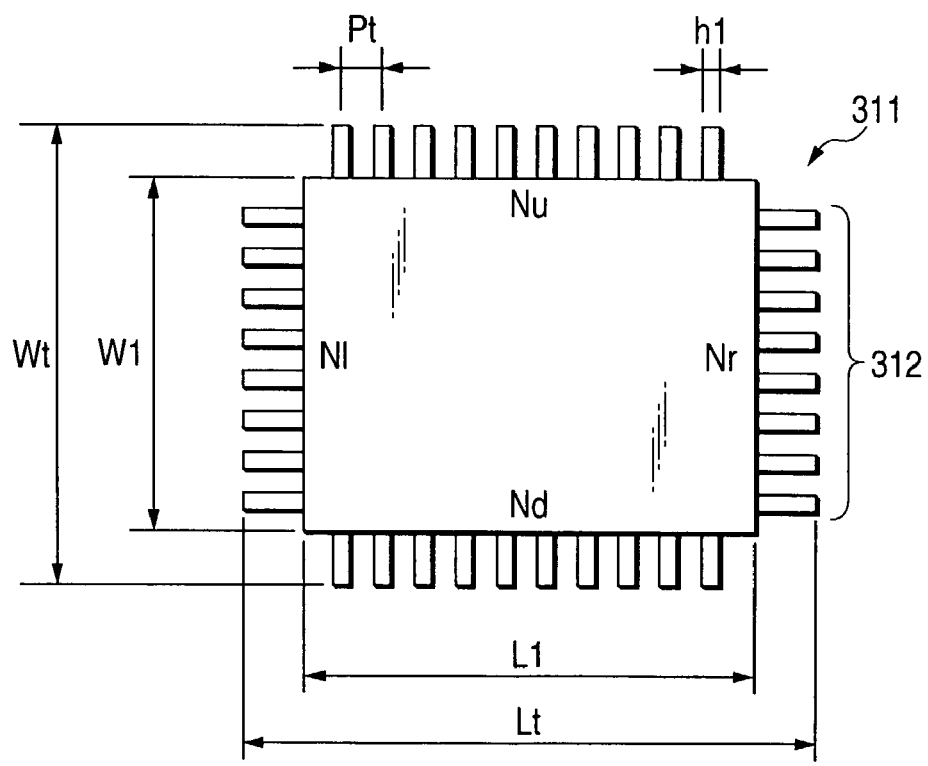
FIG. 49 is a view showing an external appearance of a QFP parts.
Figure 50:
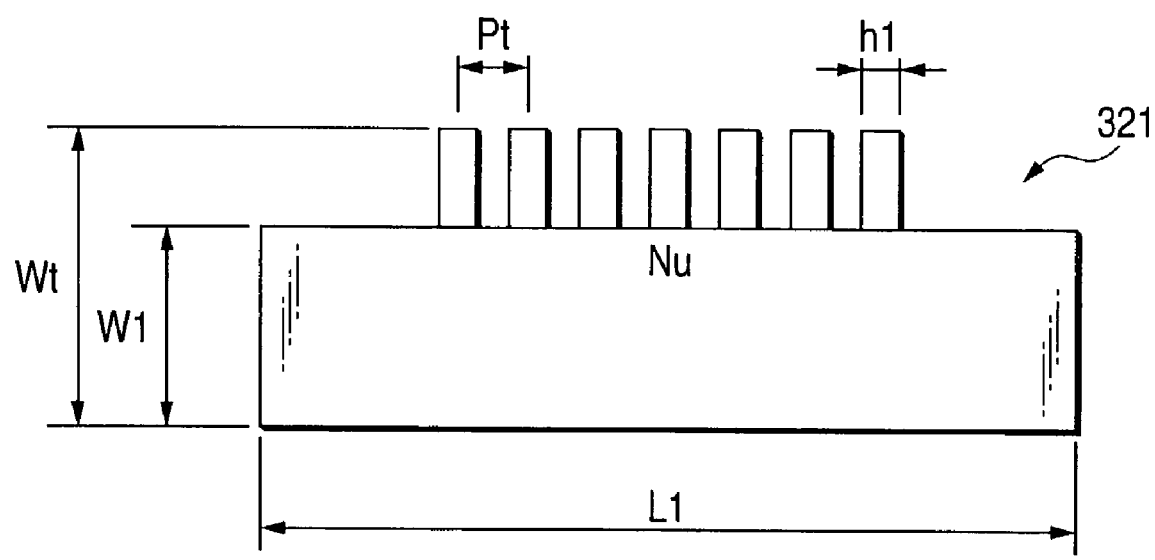
FIG. 50 is a view showing an external appearance of a connector parts.
Figure 51:
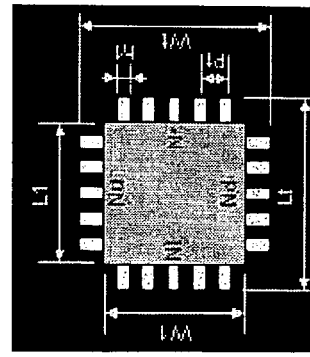
FIG. 51 is a view showing an input screen of the electronic parts in the related art.
Figure 52:
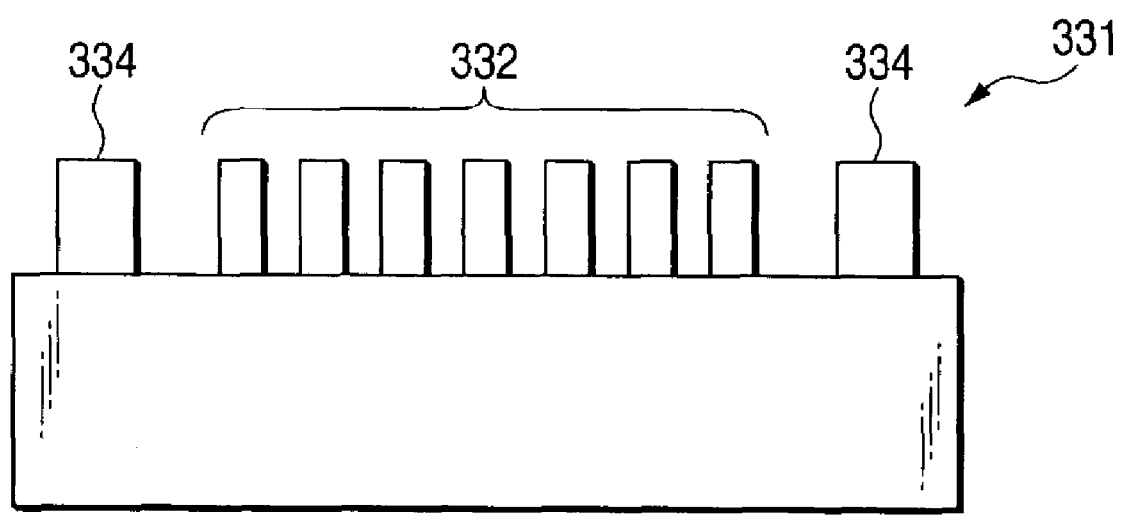
FIG. 52 is a view showing an external appearance of another connector parts.

In addition, if the setting of the optical conditions is executed, a display screen, as shown in FIG. 47, via which optical conditions are to be checked is displayed. If the displayed conditions are acceptable, the process is ended by clicking "End".

According to above setting operations, the preparation of the parts recognition data is completed. If the parts recognition data are prepared by this inputting method, a time required for the preparation can be reduced considerably and also a burden of the operator can be reduced, and in addition the data inputting can be executed smoothly not to hesitate the inputting.

INDUSTRIAL APPLICABILITY

According to the parts recognition data preparing method and preparing device of the present invention, since the information of the body and the electrodes of the electronic parts, which are required for the recognizing process executed by this recognition algorithm, are automatically input without sequential inputting, the electronic parts data can be prepared precisely and quickly unless the operator is conscious of the characteristic of the recognition algorithm. Also, since the data are input while checking visually, check can be executed at an instant and thus it can be checked simply and quickly whether or not the input information is correct or false. In addition, since information of the body and the electrodes can be extracted from the area, which corresponds to the body portion of the electronic parts, and the area, which corresponds to the electrode parts, of the image data obtained by picking up the image of the electronic parts, there is no need to input respective data one by one and also the preparation of the parts recognition data can be simplified much more.

Also, according to the electronic parts mounting device of the present invention, since the suction attitude of the electronic parts held by the suction nozzle can be recognized by the recognizing device based on the prepared parts recognition data and also the mounting position of the electronic parts onto the circuit board can be corrected precisely by the correcting means in response to the recognized suction attitude of the electronic parts, the electronic parts can be mounted onto the predetermined position of the circuit board stably with good precision.

Also, according to the recording medium of the present invention, since the recorded program is executed, the information of the body and the electrodes of the electronic parts, which is required for the recognizing process executed by the recognition algorithm, can be input automatically without sequential inputting, and also the parts recognition data can be prepared precisely and is quickly not to know particularly the characteristic of the recognition algorithm.

What is claimed is:

1. A parts recognition data preparing method applied to a device, which recognizes electronic parts based on image data obtained by picking up an image of the electronic parts, for preparing parts recognition data in which recognition conditions of the electronic parts are recorded, said method comprising the steps of:

inputting information of a body and electrodes of an electronic part;

identifying an electronic part type based on the inputted information of the body and the electrodes of the electronic part;

selecting, based on the identified electronic part type, a recognition algorithm that recognizes the electronic part, wherein the recognition algorithm is adaptive to the identified electronic part type;

automatically extracting electronic part shape data, which are required for a recognizing process executed by the recognition algorithm;

grouping the electrodes for every side of an outer periphery of the body to create a plurality of electrode groups;

excepting electrodes that are overlapped among respective electrode groups;

wherein the step of grouping includes the steps of:

excepting electrodes that are present on an opposite side to a selected side from the electrode group that corresponds to the selected side;

ranking the electrodes in the electrode group that corresponds to the selected side according to their respective positions on the electronic part; and extracting at least one of the electrodes in the electrode group that corresponds to the selected side based on a result of the step of ranking.

2. The parts recognition data preparing method according to claim 1, further comprising the step of:

inputting optimum optical conditions adaptive to the identified electronic part type for picking up an image of the electronic part.

3. The parts recognition data preparing method according to claim 1, further comprising the steps of:

plotting and displaying a body shape based on the inputted information of the body;

plotting and displaying electrode shapes based on the inputted information of the electrodes; and visually determining whether or not plotted and displayed positional relationships between the body and the electrodes are correct.

4. The parts recognition data preparing method according to claim 1, further comprising the steps of:

picking up an image of the electronic part;

designating an area, which corresponds to a body portion, to image data of the electronic part;

designating additional areas, which correspond to electrode portions, to the image data of the electronic part; and acquiring information of the body from the designated body area and acquiring information of the electrodes from the designated electrode area;

wherein parts recognition data are prepared by using information acquired by the acquiring information step.

5. A parts recognition data preparing device used to recognize electronic parts based on image data obtained by picking up an image of the electronic parts, for preparing parts recognition data in which recognition conditions of the electronic parts are recorded, said device comprising:

an inputting means for inputting information of a body and electrodes of an electronic part;

a recognition algorithm selecting means for identifying an electronic part type based on input information of the body and the electrodes and then selecting, based on the identified electronic part type, a recognition algorithm that recognizes the electronic part, wherein the recognition algorithm is adaptive to the identified electronic part type; and a parts shape data extracting means for extracting automatically parts shape data, which are required for a recognizing process executed by the selected recognition algorithm, from the input information of the body and the electrodes, wherein the electrodes are grouped for every side of an outer periphery of the body to create a plurality of electrode groups, such that:

electrodes that are present on an opposite side to a selected side are excepted from the electrode group that corresponds to the selected side, and the electrodes in the electrode group that corresponds to the selected side are ranked according to their respective positions on the electronic part and, based upon a result thereof, at least one of the electrodes in the electrode group that corresponds to the selected side is extracted, and further wherein electrodes that are overlapped among respective electrode groups are excepted.

6. The parts recognition data preparing device according to claim 5, further comprising:

an optical-condition setting means for setting optical conditions that permit the picking up of the image of the electronic parts under optimum conditions, which are adaptive to the identified electronic part type.

7. The parts recognition data preparing device according to claim 5, further comprising:

a displaying means for displaying the information of the body and the electrodes, which are input from the inputting means, on a screen.

8. The parts recognition data preparing device according to any one of claims 6 and 7, wherein the inputting means extracts from the image data obtained by picking up the image of the electronic parts the information of the body and the electrodes of the electronic parts to input.

9. A parts recognition data preparing method applied to a device, which recognizes electronic parts based on image data obtained by picking up an image of the electronic parts, for preparing parts recognition data in which recognition conditions of the electronic parts are recorded, said method comprising the steps of:

inputting information of a body and electrodes of an electronic part;

identifying an electronic part type based on the inputted information of the body and the electrodes of the electronic part;

selecting a recognition algorithm based on the identified electronic part type, wherein the recognition algorithm is adaptive to the identified electronic part type;

automatically extracting electronic part shape data, which are required for a recognizing process executed by the recognition algorithm;

inputting optimum optical conditions adaptive to the identified electronic part type for picking up an image of the electronic part;

grouping the electrodes for every side of an outer periphery of the body to create a plurality of electrode groups; and excepting electrodes that are overlapped among respective electrode groups and electrodes that are not used to recognize the electronic parts from the grouped electrodes, wherein the grouping step includes the steps of:

excepting electrodes that are present on an opposite side to a selected side from the electrode group that corresponds to the selected side;

ranking the electrodes in the electrode group that corresponds to the selected side in order of the electrodes whose centers are closer to the selected side; and extracting the closest electrode to the selected side.

10. A parts recognition data preparing method applied to a device, which recognizes electronic parts based on image data obtained by picking up an image of the electronic parts, for preparing parts recognition data in which recognition conditions of the electronic parts are recorded, said method comprising the steps of:

inputting information of a body and electrodes of an electronic part;

identifying an electronic part type based on the inputted information of the body and the electrodes of the electronic part;

selecting a recognition algorithm based on the identified electronic part type, wherein the recognition algorithm is adaptive to the identified electronic part type;

automatically extracting electronic part shape data, which are required for a recognizing process executed by the recognition algorithm;

inputting optimum optical conditions adaptive to the identified electronic part type for picking up an image of the electronic part;

grouping the electrodes for every side of an outer periphery of the body to create a plurality of electrode groups; and excepting electrodes that are overlapped among respective electrode groups and electrodes that are not used to recognize the electronic parts from the grouped electrodes, wherein the excepting step includes the steps of:

excepting the same electrodes from electrode groups that correspond to a selected side and an opposite side to the selected side if the same electrodes are present between the electrode groups that correspond to the selected side and the opposite side; and removing duplicate electrodes by excepting all electrodes from the electrode group that corresponds to the selected side when the number of electrodes in the electrode group that corresponds to a neighboring side to the selected side is larger than 2 and by excepting all electrodes from an electrode group in which a center of electrode alignment is not positioned at a center of the body when the number of electrodes in the electrode group that corresponds to the neighboring side is less than 2 if the number of electrodes in the electrode group that corresponds to the selected side is smaller than 3 and the electrodes are contained in the electrode group that corresponds to the neighboring side.

11. An electronic parts mounting device for mounting sequentially electronic parts onto predetermined positions of a circuit board by a parts holding means having a suction nozzle, which holds the electronic parts detachably, based on input NC information, said device comprising:

- an inputting means for inputting information of a body and electrodes of an electronic part;
- a recognition algorithm selecting means for identifying an electronic part type based on input information of the body and the electrodes and then selecting an electronic part recognition algorithm based on the identified electronic part type, wherein the electronic part recognition algorithm recognizes the electronic part and is adaptive to the identified electronic part type;
- a parts shape data extracting means for extracting automatically electronic part shape data, which are required for a recognizing process executed by the selected electronic part recognition algorithm, from the input information of the body and the electrodes;
- an optical-condition setting means for setting optical conditions that permit the picking up of an image of the electronic parts under conditions, which are adaptive to the identified electronic part type;
- a recognizing means for recognizing a suction attitude of the electronic parts held by the suction nozzle; and
- a correcting means for correcting a mounting position onto the circuit board in response to the suction attitude of the electronic parts recognized by the recognizing means, wherein the electrodes are grouped for every side of an outer periphery of the body to create a plurality of electrode groups, such that:
  - electrodes that are present on an opposite side to a selected side are excepted from the electrode group that corresponds to the selected side, and
  - the electrodes in the electrode group that corresponds to the selected side are ranked according to their respective positions on the electronic part and, based upon a result thereof, at least one of the electrodes in the electrode group that corresponds to the selected side is extracted, and further wherein
  - electrodes that are overlapped among respective electrode groups are excepted.

12. A recording medium for recording a parts recognition data preparing program for executing, by a programmed computer, to prepare parts recognition data, which is applied to a device for recognizing electronic parts based on image data obtained by picking up an image of the electronic parts and includes recognition conditions of the electronic parts, wherein said parts recognition data preparing program comprises the steps of:

- inputting information of a body and electrodes of an electronic part;
- grouping the electrodes for every side of an outer periphery of the body to create a plurality of electrode groups, wherein each electrode group corresponds to a unique side of the outer periphery of the body;
- excepting electrodes that are overlapped among respective electrode groups and electrodes that are not used to recognize the electronic parts from the grouped electrodes;
- identifying an electronic part type based on the inputted information of the body and the electrodes of the electronic part;
- deciding, based on the identified electronic part type, a recognition algorithm that recognizes the electronic part and that is adaptive to the electronic part type;
- extracting electronic part shape data, which are required for a recognizing process executed by the decided recognition algorithm, from information of the body and the electrodes;
- deciding optimum optical conditions for picking up the image of the electronic parts, wherein said step of grouping further includes the steps of:
- excepting electrodes that are present on an opposite side to a selected side from the electrode group that corresponds to the selected side;
- ranking the electrodes in the electrode group that corresponds to the selected side according to their respective positions on the electronic part; and
- extracting at least one of the electrodes in the electrode group that corresponds to the selected side based on a result of the step of ranking.

* * * * *